(12) United States Patent
Matsumoto et al.

(10) Patent No.: US 12,727,275 B2
(45) Date of Patent: Sep. 1, 2026

(54) IMAGING DEVICE AND ELECTRONIC DEVICE

(71) Applicant: SONY SEMICONDUCTOR SOLUTIONS CORPORATION, Kanagawa (JP)

(72) Inventors: Akira Matsumoto, Kanagawa (JP); Koichiro Zaitsu, Kanagawa (JP); Keiji Nishida, Kanagawa (JP); Mizuki Nishida, Kanagawa (JP); Kazutaka Izukashi, Kanagawa (JP); Daisuke Ito, Kanagawa (JP); Yasufumi Miyoshi, Kanagawa (JP); Junpei Yamamoto, Kanagawa (JP); Yusuke Tanaka, Kanagawa (JP); Yasushi Hamamoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 938 days.

(21) Appl. No.: 17/910,890

(22) PCT Filed: Mar. 26, 2021

(86) PCT No.: PCT/JP2021/012841
§ 371 (c)(1),
(2) Date: Sep. 12, 2022

(87) PCT Pub. No.: WO2021/193915
PCT Pub. Date: Sep. 30, 2021

(65) Prior Publication Data

US 2023/0143387 A1 May 11, 2023

(30) Foreign Application Priority Data

Mar. 27, 2020 (JP) ................................ 2020-058752
Dec. 25, 2020 (JP) ................................ 2020-217344

(51) Int. Cl.
*H10F 39/00* (2025.01)
*H04N 25/704* (2023.01)

(52) U.S. Cl.
CPC ....... *H10F 39/807* (2025.01); *H10F 39/8063* (2025.01); *H04N 25/704* (2023.01)

(58) Field of Classification Search
CPC .. H10F 39/807; H10F 39/8063; H10F 39/011; H10F 39/182; H10F 39/8053;
(Continued)

(56) References Cited

U.S. PATENT DOCUMENTS

2013/0087875 A1 4/2013 Kobayashi et al.
2017/0345853 A1* 11/2017 Kato ........................ G02B 7/34
(Continued)

FOREIGN PATENT DOCUMENTS

CN 106449674 A 2/2017
CN 107408568 A 11/2017
(Continued)

OTHER PUBLICATIONS

Merged Japanese and English translation of JP 2018201015 A. (Year: 2018).*
(Continued)

*Primary Examiner* — William B Partridge
*Assistant Examiner* — Linda J. Fleck
(74) *Attorney, Agent, or Firm* — SHERIDAN ROSS P.C.

(57) ABSTRACT

An imaging device includes a plurality of imaging elements, wherein each of the plurality of imaging elements includes: a plurality of pixels containing impurities of a first conductivity type; an element separation wall surrounding the plurality of pixels and provided so as to penetrate a semiconductor substrate; an on-chip lens provided above a light receiving surface of the semiconductor substrate so as to be shared by the plurality of pixels; and a first separation
(Continued)

portion provided in a region surrounded by the element separation wall and separating the plurality of pixels, the first separation portion is provided so as to extend in a thickness direction of the semiconductor substrate, and a first diffusion region containing impurities of a second conductivity type opposite to the first conductivity type is provided in a region positioned around the first separation portion and extending in the thickness direction of the semiconductor substrate.

20 Claims, 75 Drawing Sheets

(58) Field of Classification Search
CPC ...... H10F 39/806; H10F 39/18; H10F 39/803; H10F 30/20; H04N 25/704
See application file for complete search history.

(56) References Cited

U.S. PATENT DOCUMENTS

2018/0350856 A1* 12/2018 Masagaki ............ H10F 39/813
2019/0165009 A1* 5/2019 Wu ...................... H10F 39/182
2020/0027913 A1 1/2020 Nomura
2020/0235149 A1 7/2020 Shiraishi et al.
2020/0243578 A1* 7/2020 Pyo .................... H10F 39/8053
2024/0379691 A1* 11/2024 Satake ................... H10F 39/12

FOREIGN PATENT DOCUMENTS

JP 2000-292685 10/2000
JP 2009-158800 7/2009
JP 2013-084742 5/2013
JP 2017-212351 11/2017
JP 2018-201015 12/2018
JP 2018201015 A * 12/2018 ............ H04N 25/70
KR 20140015326 A 2/2014
KR 20180040308 A 4/2018
WO WO-2014097899 A1 6/2014

OTHER PUBLICATIONS

International Search Report and Written Opinion prepared by the Japan Patent Office on Jun. 2, 2021, for International Application No. PCT/JP2021/012841, 2 pgs.

* cited by examiner

Red
Green
Blue
10
10a
10b
304
310
308b
$Z_R$
$Z_G$
$Z_B$

FIG. 26

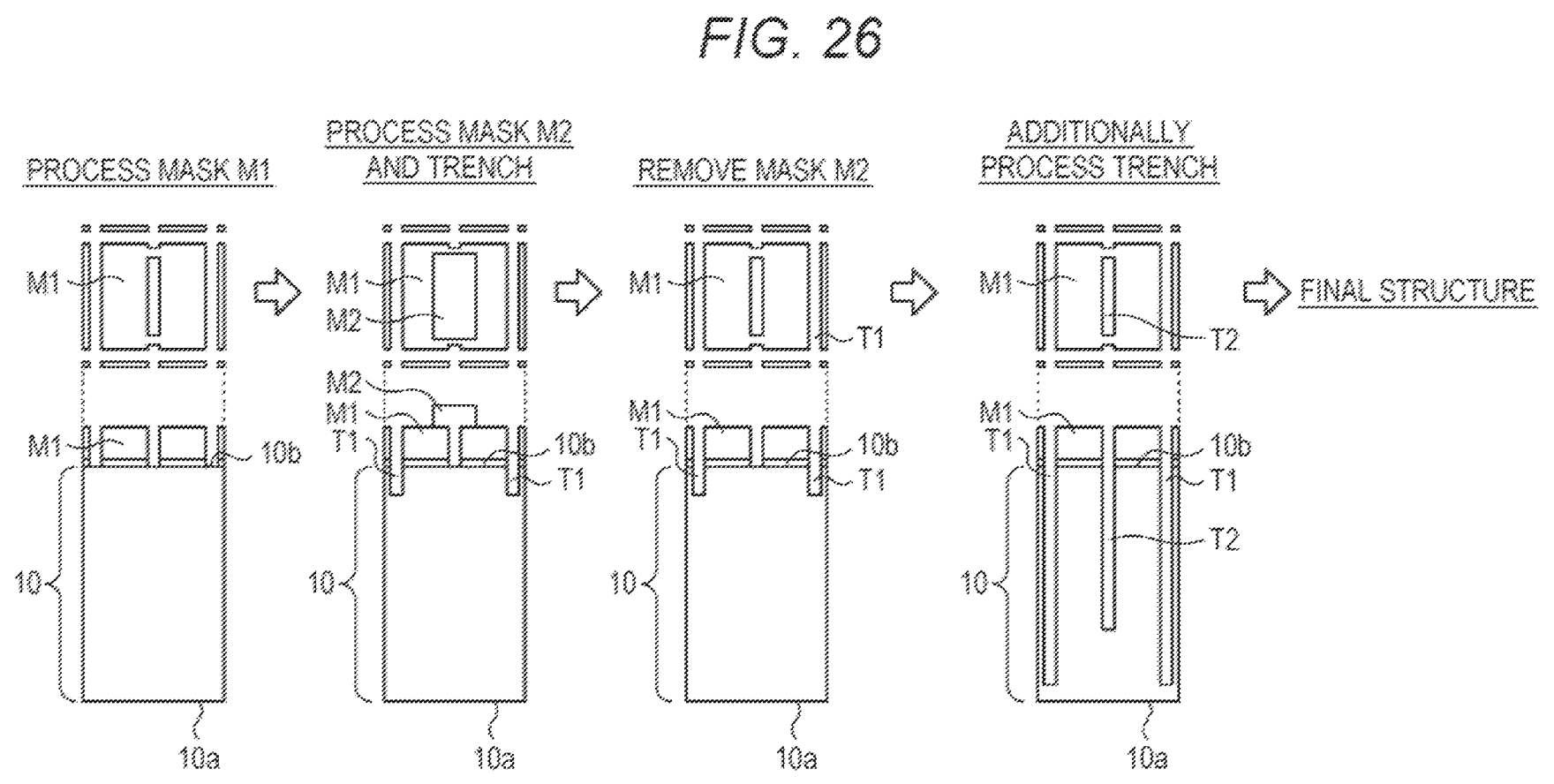

PROCESS MASK M1

PROCESS MASK M2 AND TRENCH

REMOVE MASK M2

ADDITIONALLY PROCESS TRENCH

FINAL STRUCTURE

FORM LITHOGRAPHY PATTERN

PERFORM ETCHING AND FORM SI TRENCH

FORM P-TYPE Doping LAYER

FILL INSIDE OF TRENCH 310
304
312
SLIT WIDTH
WIDE
CONDENSING CHARACTERISTICS
GOOD
POOR
PIXEL CHARACTERISTICS
POOR
GOOD

Si
10
FFTI PROCESSING
Si
10
EMBED MATERIAL
Si
10
(OMITTED)
10
BONDING
501
THINNING
10
BONDING
501
BACK-
FILLING
304
304
10
BONDING
501
200
202
304
304
10
BONDING
Custom
501

10 10a RDTI T3 334 10b 310
10a FDTI T3 334 10b 310
10a FFTI T3 334 10b 310
10a RFTI T3 334 10b 310
10a RDTI+FDTI T3 334 10b 310

900
901
CPU
902
ROM
903
RAM
904
STORAGE DEVICE
905
COMMUNICATION MODULE
906
907
SENSOR MODULE
909
IMAGING DEVICE
910
DISPLAY DEVICE
911
SPEAKER
912
MICROPHONE
913
INPUT DEVICE

FIG. 94

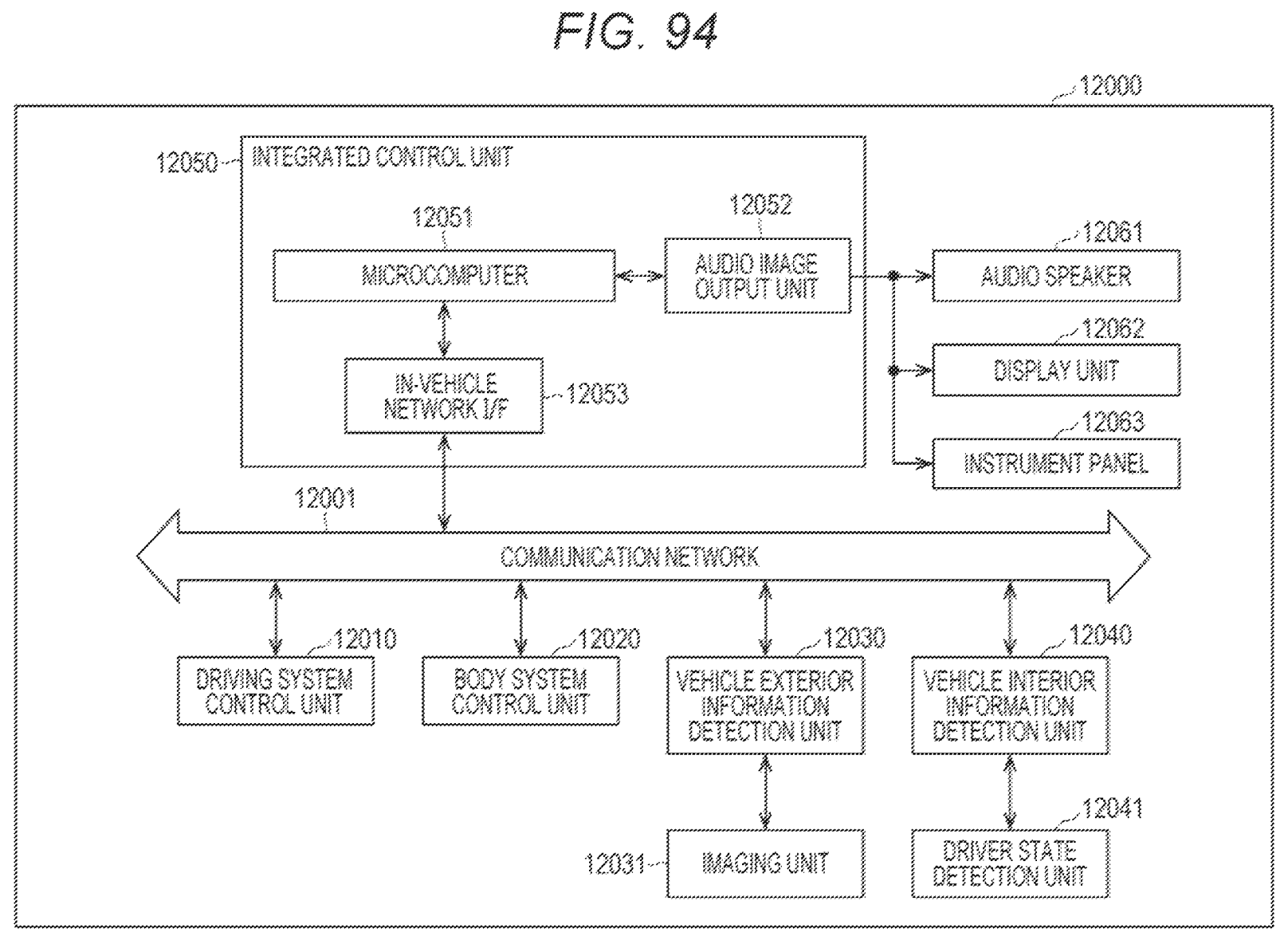

12000
12050 INTEGRATED CONTROL UNIT
12051 MICROCOMPUTER
12052 AUDIO IMAGE OUTPUT UNIT
12053 IN-VEHICLE NETWORK I/F
12061 AUDIO SPEAKER
12062 DISPLAY UNIT
12063 INSTRUMENT PANEL
12001 COMMUNICATION NETWORK
12010 DRIVING SYSTEM CONTROL UNIT
12020 BODY SYSTEM CONTROL UNIT
12030 VEHICLE EXTERIOR INFORMATION DETECTION UNIT
12031 IMAGING UNIT
12040 VEHICLE INTERIOR INFORMATION DETECTION UNIT
12041 DRIVER STATE DETECTION UNIT

IMAGING DEVICE AND ELECTRONIC DEVICE

CROSS REFERENCE TO RELATED APPLICATIONS

This application is a national stage application under 35 U.S.C. 371 and claims the benefit of PCT Application No. PCT/JP2021/012841, having an international filing date of 26 Mar. 2021, which designated the United States, which PCT application claimed the benefit of Japanese Patent Application Nos. 2020-058752 filed 27 Mar. 2020, and 2020-217344 filed 25 Dec. 2020, the entire disclosures of each of which are incorporated herein by reference.

TECHNICAL FIELD

The present disclosure relates to an imaging device and an electronic device.

BACKGROUND ART

In recent years, an imaging device has adopted a method of detecting a phase difference using a pair of phase difference detection pixels as an autofocus function. As such an example, an imaging element disclosed in Patent Document 1 below can be mentioned. In the technique disclosed in Patent Document 1, both an effective pixel that captures an image of a subject and a phase difference detection pixel that detects a phase difference as described above are separately provided on a light receiving surface.

CITATION LIST

Patent Document

Patent Document 1: JP 2000-292685 A

SUMMARY OF THE INVENTION

Problems to be Solved by the Invention

However, in the technology disclosed in Patent Document 1, when a captured image of a subject is acquired, it is difficult to use information obtained by the phase difference detection pixel as information similar to information from the imaging pixel. Therefore, interpolation is performed on an image of a pixel corresponding to the phase difference detection pixel using information from effective pixels around the phase difference detection pixel to generate a captured image. That is, in the technology disclosed in Patent Document 1, since the phase difference detection pixel is provided to perform the phase difference detection, it is difficult to avoid deterioration of the captured image due to a loss of information of the captured image corresponding to the phase difference detection pixel.

Therefore, the present disclosure proposes an imaging device and an electronic device capable of avoiding deterioration of a captured image while improving accuracy of phase difference detection.

Solutions to Problems

According to the present disclosure, there is provided an imaging device including: a semiconductor substrate; and a plurality of imaging elements arranged in a matrix on the semiconductor substrate along a row direction and a column direction, and configured to perform photoelectric conversion on incident light, in which each of the plurality of imaging elements includes: a plurality of pixels provided adjacent to each other in the semiconductor substrate and containing impurities of a first conductivity type; an element separation wall surrounding the plurality of pixels and provided so as to penetrate the semiconductor substrate; an on-chip lens provided above a light receiving surface of the semiconductor substrate so as to be shared by the plurality of pixels; and a first separation portion provided in a region surrounded by the element separation wall to separate the plurality of pixels, the first separation portion is provided so as to extend in a thickness direction of the semiconductor substrate, and a first diffusion region containing impurities of a second conductivity type opposite to the first conductivity type is provided in a region positioned around the first separation portion and extending in the thickness direction of the semiconductor substrate.

According to the present disclosure, there is provided an imaging device including: a semiconductor substrate; and a plurality of imaging elements arranged in a matrix on the semiconductor substrate along a row direction and a column direction, and configured to perform photoelectric conversion on incident light, in which each of the plurality of imaging elements includes: a plurality of pixels provided adjacent to each other in the semiconductor substrate and containing impurities of a first conductivity type; a pixel separation wall that separates the plurality of pixels; and an on-chip lens provided above a light receiving surface of the semiconductor substrate so as to be shared by the plurality of pixels, the pixel separation wall is provided so as to extend from the light receiving surface to a middle of the semiconductor substrate along a thickness direction of the semiconductor substrate, and a region positioned on a side opposite to the light receiving surface with respect to the pixel separation wall in the thickness direction of the semiconductor substrate contains impurities of a second conductivity type opposite to the first conductivity type.

According to the present disclosure, there is provided an electronic device including: an imaging device including: a semiconductor substrate; and a plurality of imaging elements arranged in a matrix on the semiconductor substrate along a row direction and a column direction, and configured to perform photoelectric conversion on incident light, in which each of the plurality of imaging elements includes: a plurality of pixels provided adjacent to each other in the semiconductor substrate and containing impurities of a first conductivity type; an element separation wall surrounding the plurality of pixels and provided so as to penetrate the semiconductor substrate; an on-chip lens provided above a light receiving surface of the semiconductor substrate so as to be shared by the plurality of pixels; and a first separation portion provided in a region surrounded by the element separation wall to separate the plurality of pixels, the first separation portion is provided so as to extend in a thickness direction of the semiconductor substrate, and a first diffusion region containing impurities of a second conductivity type opposite to the first conductivity type is provided in a region positioned around the first separation portion and extending in the thickness direction of the semiconductor substrate.

BRIEF DESCRIPTION OF DRAWINGS

FIG. 2 is an explanatory diagram (part 1) illustrating a part of a cross-section of an imaging element 100 according to the first embodiment of the present disclosure.

FIG. 3 is an explanatory diagram (part 2) illustrating a part of a cross-section of the imaging element 100 according to the first embodiment of the present disclosure.

FIG. 7 is an explanatory diagram illustrating a configuration example of a light shielding portion 204 according to a modified example of the first embodiment of the present disclosure.

FIG. 17 is an explanatory diagram (part 1) illustrating a part of a cross-section of an imaging element 100 according to an eighth embodiment of the present disclosure.

FIG. 26 is a process cross-sectional view for explaining a part of the manufacturing process of the imaging element 100 according to the eighth embodiment of the present disclosure.

FIG. 29 is an explanatory diagram illustrating a part of a cross-section of an imaging element 100 according to a comparative example of the ninth embodiment of the present disclosure.

FIG. 30 is an explanatory diagram (part 2) illustrating a part of a cross-section of the imaging element 100 according to the ninth embodiment of the present disclosure.

FIG. 31 is an explanatory diagram (part 3) illustrating a part of a cross-section of the imaging element 100 according to the ninth embodiment of the present disclosure.

FIG. 32 is an explanatory diagram (part 4) illustrating a part of a cross-section of the imaging element 100 according to the ninth embodiment of the present disclosure.

FIG. 33 is an explanatory diagram (part 5) illustrating a part of a cross-section of the imaging element 100 according to the ninth embodiment of the present disclosure.

FIG. 34 is an explanatory diagram (part 6) illustrating a part of a cross-section of the imaging element 100 according to the ninth embodiment of the present disclosure.

FIG. 37 is a process cross-sectional view (part 1) for explaining a part of the manufacturing process of the imaging device 1 according to the ninth embodiment of the present disclosure.

FIG. 43 is a process cross-sectional view (part 1) for explaining a part of the manufacturing process of the imaging element 100 according to the ninth embodiment of the present disclosure.

FIG. 65 is an explanatory diagram (part 6) illustrating both surfaces and a cross-section of the imaging element 100 according to the twelfth embodiment of the present disclosure.

Figure 70:
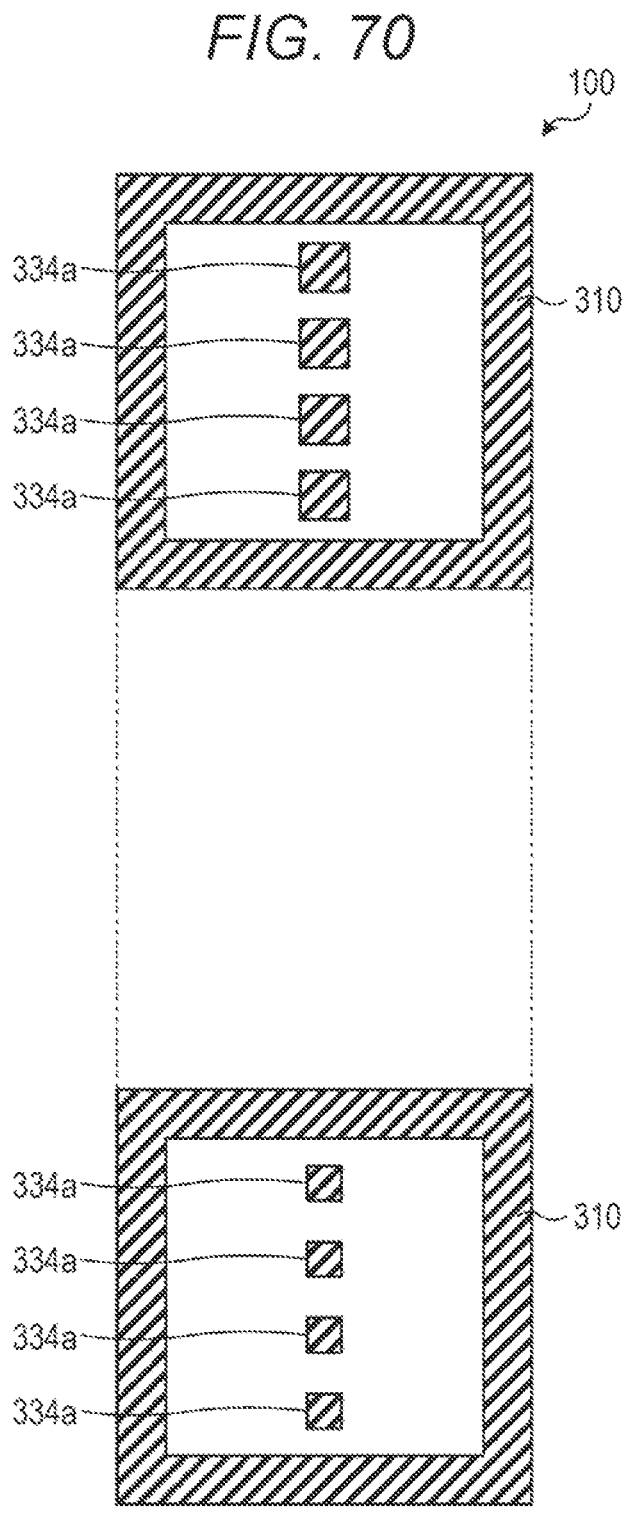

FIG. 70 is an explanatory diagram (part 11) illustrating both surfaces of the imaging element 100 according to the twelfth embodiment of the present disclosure.

FIG. 79 is an explanatory diagram (part 1) illustrating a plane of an imaging element 100 according to another embodiment of the present disclosure.

FIG. 80 is an explanatory diagram (part 1) illustrating a part of a cross-section of an imaging element 100 for each structure according to another embodiment of the present disclosure.

FIG. 81 is an explanatory diagram (part 2) illustrating a plane of an imaging element 100 according to another embodiment of the present disclosure.

FIG. 82 is an explanatory diagram (part 2) illustrating a part of a cross-section of an imaging element 100 for each structure according to another embodiment of the present disclosure.

FIG. 94 is a block diagram illustrating an example of a schematic configuration of a vehicle control system.

MODE FOR CARRYING OUT THE INVENTION

Figure 1:
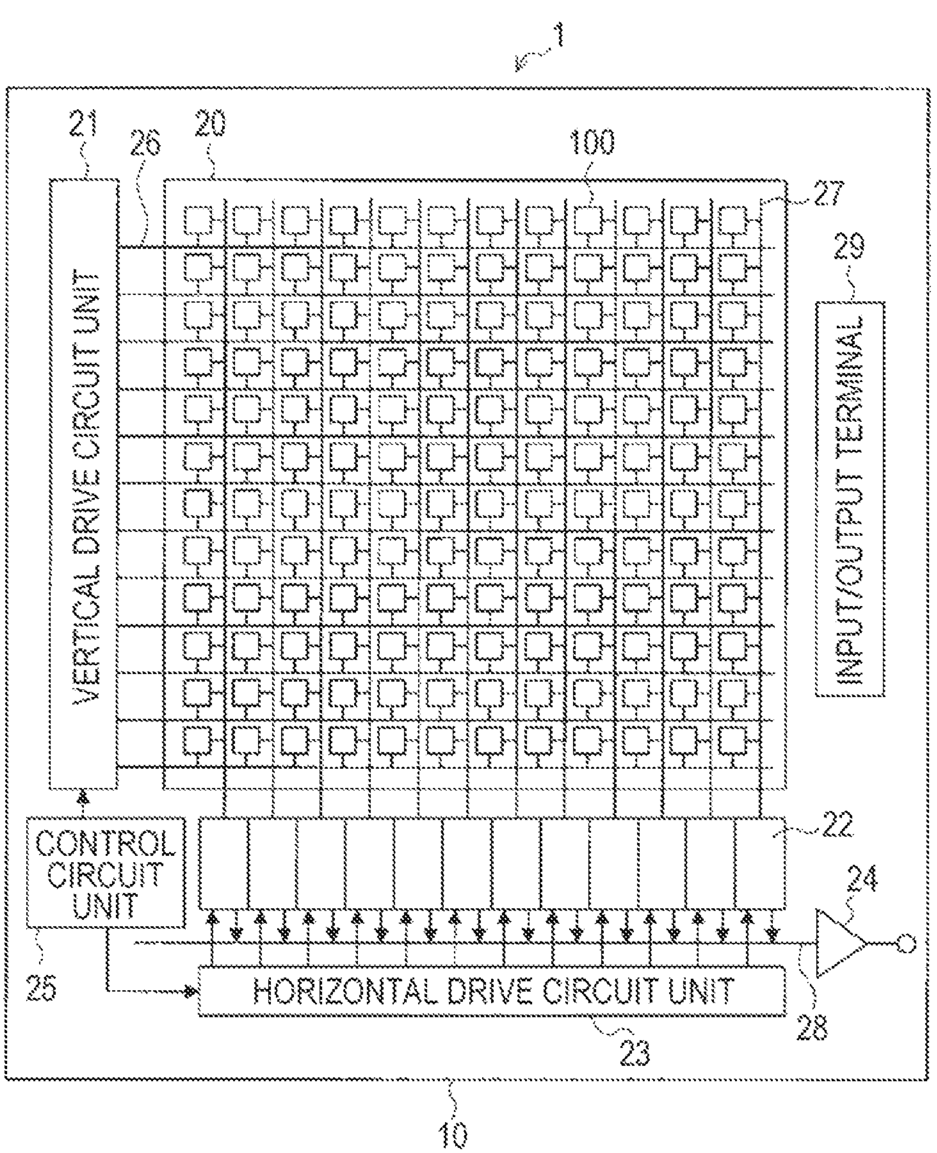
FIG. 1 is an explanatory diagram illustrating a planar configuration example of an imaging device 1 according to an embodiment of the present disclosure.

Hereinafter, embodiments of the present disclosure will be described in detail with reference to the drawings. In each of the following embodiments, the same parts are denoted by the same reference numerals, and redundant description will be omitted.

In addition, in the present specification and the drawings, a plurality of components having substantially the same or similar functional configurations may be distinguished by attaching different numbers after the same reference numerals. However, in a case where it is not particularly necessary to distinguish each of a plurality of components having substantially the same or similar functional configuration, only the same reference numeral is attached. In addition, similar components of different embodiments may be distinguished by adding different characters after the same reference numerals. However, in a case where it is not necessary to particularly distinguish each of similar components, only the same reference numeral is assigned.

In addition, the drawings referred to in the following description are drawings for facilitating the description and understanding of an embodiment of the present disclosure, and shapes, dimensions, ratios, and the like illustrated in the drawings may be different from actual ones for the sake of clarity. Furthermore, the imaging device illustrated in the drawings can be appropriately modified in design in consideration of the following description and known techniques. Furthermore, in the description using the cross-sectional view of the imaging device, the vertical direction of the stacked structure of the imaging device corresponds to a relative direction in a case where the light receiving surface into which the light incident on the imaging device enters is upward, and may be different from the vertical direction according to the actual gravitational acceleration.

The dimension expressed in the following description means not only a mathematically or geometrically defined dimension but also a dimension including an allowable difference (error/distortion) in the operation of the imaging device and the manufacturing process of the imaging device. Furthermore, "substantially the same" used for specific dimensions in the following description does not mean only a case of mathematically or geometrically completely matching, but also a case of having a difference (error/distortion) to an allowable extent in the operation of the imaging device and the manufacturing process of the imaging device.

Furthermore, in the following description, "electrically connecting" means connecting a plurality of elements directly or indirectly via other elements.

Furthermore, in the following description, "sharing" means that one other element (for example, an on-chip lens or the like) is used together between elements different from each other (for example, a pixel or the like).

Note that the description will be given in the following order.

1. Schematic configuration of imaging device
2. Background of creation of embodiments according to present disclosure by present inventors
3. First Embodiment
   3.1 Cross-sectional configuration
   3.2 Planar configuration
   3.3 Modified example
4. Second Embodiment
5. Third Embodiment
6. Fourth Embodiment
7. Fifth Embodiment
8. Sixth Embodiment
9. Seventh Embodiment
10. Eighth Embodiment
11. Ninth Embodiment
12. Tenth Embodiment
13. Eleventh Embodiment
14. Twelfth Embodiment
15. Thirteenth Embodiment
16. Summary
17. Application example to camera
18. Application example to smartphone
19. Application example to endoscopic surgery system
20. Application example to mobile body
21. Supplement

1. Schematic Configuration of Imaging Device

First, a schematic configuration of an imaging device 1 according to an embodiment of the present disclosure will be described with reference to FIG. 1. FIG. 1 is an explanatory diagram illustrating a planar configuration example of an imaging device 1 according to an embodiment of the present disclosure. As illustrated in FIG. 1, an imaging device 1 according to an embodiment of the present disclosure includes a semiconductor substrate 10 made of, for example, silicon, a pixel array unit 20 in which a plurality of imaging elements 100 is arranged in a matrix on the semiconductor substrate 10, and a peripheral circuit unit provided so as to surround the pixel array unit 20. Furthermore, the imaging device 1 includes, as the peripheral circuit unit, a vertical drive circuit unit 21, a column signal processing circuit unit 22, a horizontal drive circuit unit 23, an output circuit unit 24, a control circuit unit 25, and the like. Hereinafter, details of each block of the imaging device 1 will be described.

(Pixel Array Unit 20)

The pixel array unit 20 includes a plurality of imaging elements 100 two-dimensionally arranged in a matrix along the row direction and the column direction on the semiconductor substrate 10. Each imaging element 100 is an element that performs photoelectric conversion on incident light, and includes a photoelectric conversion unit (not illustrated) and a plurality of pixel transistors (for example, metal-oxide-semiconductor (MOS) transistors) (not illustrated). Then, the pixel transistor includes, for example, four MOS transistors of a transfer transistor, a selection transistor, a reset transistor, and an amplification transistor. Furthermore, in the pixel array unit 20, for example, the plurality of imaging elements 100 is two-dimensionally arranged according to the Bayer array. Here, the Bayer array is an array pattern in which the imaging elements 100 that generate charges by absorbing light having a green wavelength (for example, a wavelength of 495 nm to 570 nm) are arranged in a checkered pattern, and the imaging elements 100 that generate charges by absorbing light having a red wavelength (for example, a wavelength of 620 nm to 750 nm) and the imaging elements 100 that generate charges by absorbing light having a blue wavelength (for example, a wavelength of 450 nm to 495 nm) are alternately arranged in the remaining portion for each line. Note that a detailed structure of the imaging element 100 will be described later.

(Vertical Drive Circuit Unit 21)

The vertical drive circuit unit 21 is formed by, for example, a shift register, selects a pixel drive wiring 26, supplies a pulse for driving the imaging element 100 to the selected pixel drive wiring 26, and drives the imaging element 100 in units of rows. That is, the vertical drive circuit unit 21 selectively scans each imaging element 100 of the pixel array unit 20 sequentially in the vertical direction (vertical direction in FIG. 1) in units of rows, and supplies a pixel signal based on a signal charge generated according to the amount of light received by a photoelectric conversion unit (not illustrated) of each imaging element 100 to the column signal processing circuit unit 22 described later through a vertical signal line 27.

(Column Signal Processing Circuit Unit 22)

The column signal processing circuit unit 22 is arranged for each column of the imaging elements 100, and performs signal processing such as noise removal for each pixel column on the pixel signals output from the imaging elements 100 for one row. For example, the column signal processing circuit unit 22 performs signal processing such as correlated double sampling (CDS) and analog-digital (AD) conversion in order to remove fixed pattern noise unique to pixels.

(Horizontal Drive Circuit Unit 23)

The horizontal drive circuit unit 23 is formed by, for example, a shift register, sequentially selects each of the column signal processing circuit units 22 described above by sequentially outputting horizontal scanning pulses, and causes each of the column signal processing circuit units 22 to output a pixel signal to the horizontal signal line 28.

(Output Circuit Unit 24)

The output circuit unit 24 performs signal processing on the pixel signals sequentially supplied from each of the column signal processing circuit units 22 described above through the horizontal signal line 28, and outputs the pixel signals. The output circuit unit 24 may function as, for example, a functional unit that performs buffering, or may perform processing such as black level adjustment, column variation correction, and various digital signal processing. Note that buffering refers to temporarily storing pixel signals in order to compensate for differences in processing speed and transfer speed when pixel signals are exchanged. Furthermore, the input/output terminal 29 is a terminal for exchanging signals with an external device.

(Control Circuit Unit 25)

The control circuit unit 25 receives an input clock and data instructing an operation mode or the like, and outputs data such as internal information of the imaging device 1. That is, the control circuit unit 25 generates a clock signal or a control signal serving as a reference of operations of the vertical drive circuit unit 21, the column signal processing circuit unit 22, the horizontal drive circuit unit 23, and the like on the basis of the vertical synchronization signal, the horizontal synchronization signal, and the master clock. Then, the control circuit unit 25 outputs the generated clock signal and control signal to the vertical drive circuit unit 21, the column signal processing circuit unit 22, the horizontal drive circuit unit 23, and the like.

2. Background of Creation of Embodiments According to Present Disclosure by Present Inventors Next, before describing the details of the embodiment according to the present disclosure, the background in which the present inventors have created the embodiment according to the present disclosure will be described.

Meanwhile, the present inventors have intensively studied providing phase difference detection pixels on the entire surface of the pixel array unit 20 of the imaging device 1 (all-pixel phase difference detection) in order to further improve an autofocus function while avoiding deterioration of a captured image, that is, to improve accuracy of phase difference detection. Under such circumstances, it has been studied to provide an imaging element that functions as one imaging element at the time of imaging and functions as a pair of phase difference detection pixels at the time of phase difference detection on the entire surface of the pixel array unit 20 (dual photodiode structure). In such all-pixel phase difference detection, since the phase difference detection pixels are provided on the entire surface, the accuracy of phase difference detection can be improved, and further, since imaging can be performed by all the imaging elements, deterioration of the captured image can be avoided.

Furthermore, in order to improve the accuracy of the phase difference detection in the all-pixel phase difference detection, the present inventors have conceived that an element for physically and electrically separating the phase difference detection pixels is provided in order to prevent the outputs of the pair of phase difference detection pixels from being mixed at the time of phase difference detection. In addition, the present inventors have conceived that an overflow path is provided between a pair of phase difference detection pixels in order to avoid deterioration of a captured image in all-pixel phase difference detection. Specifically, at the time of normal imaging, when the charge of any one pixel of the phase difference detection pixels is about to be saturated, the charge is transferred to the other pixel via the overflow path, whereby saturation of one pixel can be avoided. Then, by providing such an overflow path, the linearity of the pixel signal output from the imaging element can be secured, and deterioration of the captured image can be prevented.

That is, on the basis of the viewpoint as described above, the present inventors have created an embodiment according to the present disclosure that makes it possible to avoid deterioration of a captured image while improving the accuracy of phase difference detection. Hereinafter, details of embodiments according to the present disclosure created by the present inventors will be sequentially described.

3. First Embodiment

3.1 Cross-Sectional Configuration

Figure 2:
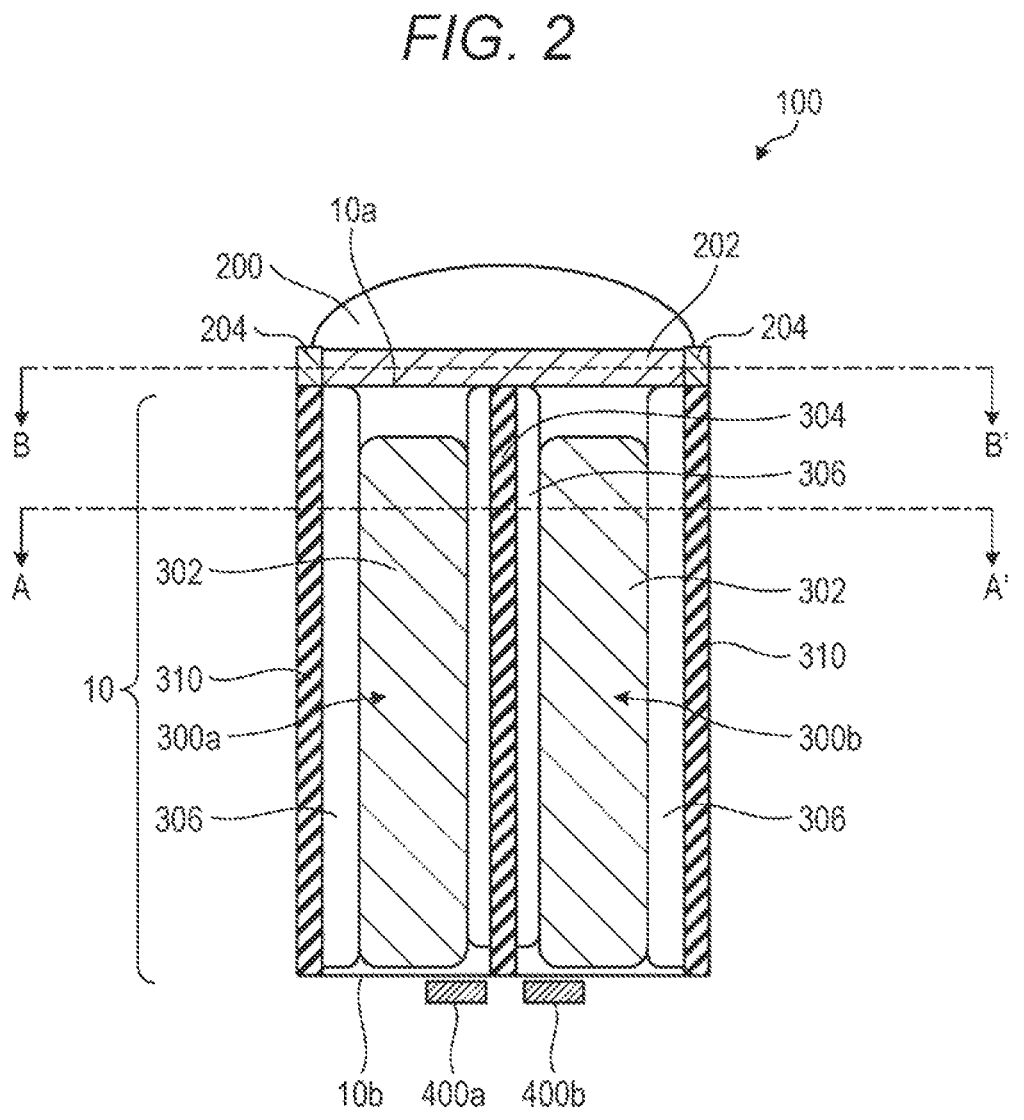
Figure 3:
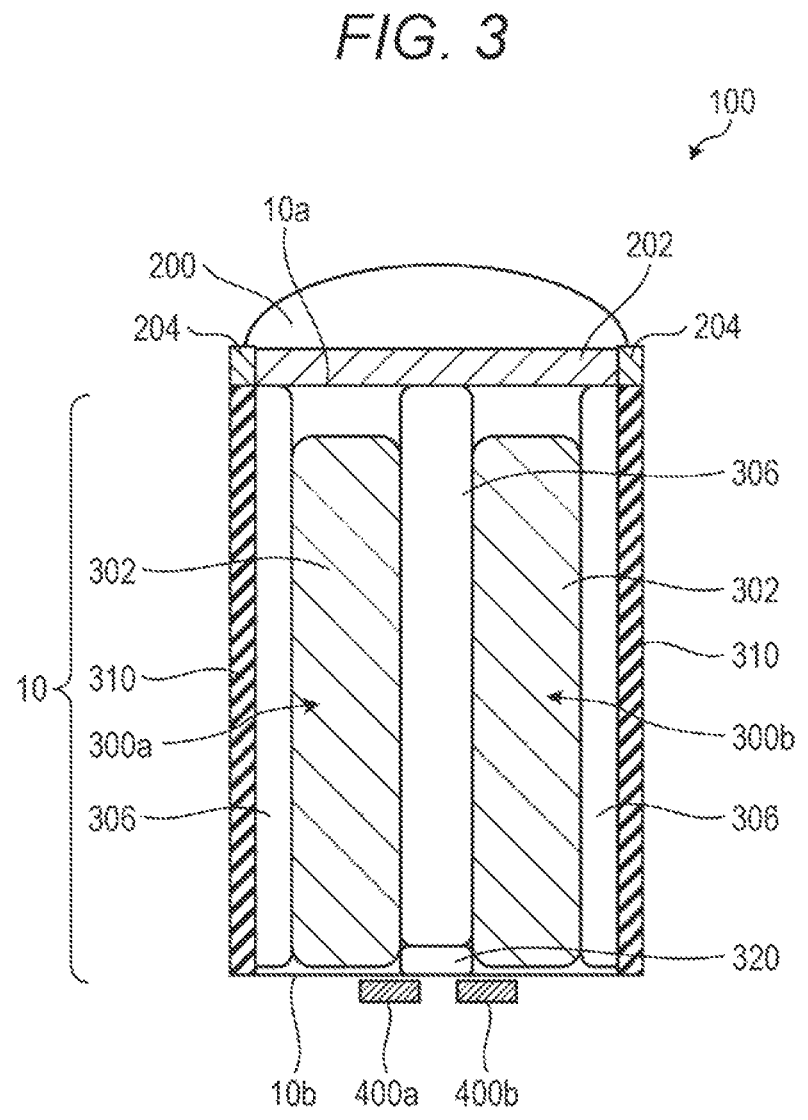

First, a cross-sectional configuration of an imaging element 100 according to a first embodiment of the present disclosure will be described with reference to FIGS. 2 and 3. FIGS. 2 and 3 are explanatory diagrams illustrating a part of a cross-section of the imaging element 100 according to the present embodiment, and specifically, correspond to cross-sections obtained by cutting the imaging element 100 at different positions along the thickness direction of the semiconductor substrate 10.

As illustrated in FIGS. 2 and 3, the imaging element 100 according to the present embodiment includes an on-chip lens 200, a color filter 202, a light shielding portion (light shielding film) 204, a semiconductor substrate 10, and transfer gates 400*a* and 400*b*, similarly to the comparative example. Furthermore, in the present embodiment, the semiconductor substrate 10 includes a pair of pixels 300*a* and 300*b* each including a photoelectric conversion unit 302. In addition, the semiconductor substrate 10 has a protruding portion (an example of a first separation portion) 304 separating the pair of pixels 300*a* and 300*b*, and includes an element separation wall 310 surrounding the pixels 300*a* and 300*b* and a diffusion region 306 provided around the protruding portion 304 and the element separation wall 310. Hereinafter, a stacked structure of the imaging element 100 according to the present embodiment will be described, but in the following description, description will be made in order from the upper side (light receiving surface 10*a* side) to the lower side in FIGS. 2 and 3. Note that FIG. 2 corresponds to a cross-section obtained by cutting the imaging element 100 at a position where the above-described protruding portion 304 is cut, and FIG. 3 corresponds to a cross-section obtained by cutting the imaging element 100 at a position where a region (slit 312, see FIG. 4) between the protruding portions 304 facing each other is cut.

As illustrated in FIGS. 2 and 3, the imaging element 100 includes one on-chip lens 200 that is provided above the light receiving surface 10*a* of the semiconductor substrate 10 and condenses incident light on the photoelectric conversion unit 302. The imaging element 100 has a structure in which a pair of pixels 300*a* and 300*b* is provided for one on-chip lens 200. That is, the on-chip lens 200 is shared by the two pixels 300*a* and 300*b*. Note that the on-chip lens 200 can be formed of, for example, a silicon nitride film (SiN), or a resin material such as a styrene resin, an acrylic resin, a styrene-acrylic copolymer resin, or a siloxane resin.

Then, the incident light condensed by the on-chip lens 200 is emitted to each of the photoelectric conversion units 302 of the pair of pixels 300*a* and 300*b* via the color filter 202 provided below the on-chip lens 200. The color filter 202 is any of a color filter that transmits a red wavelength component, a color filter that transmits a green wavelength component, and a color filter that transmits a blue wavelength component. For example, the color filter 202 can be formed of, for example, a material in which a pigment or a dye is dispersed in a transparent binder such as silicone.

Furthermore, a light shielding portion 204 is provided on the light receiving surface 10*a* of the semiconductor substrate 10 so as to surround the color filter 202. Since the light shielding portion 204 is provided between the adjacent imaging elements 100, it is possible to perform light shielding between the imaging elements 100 in order to suppress crosstalk between the adjacent imaging elements 100 and further improve accuracy in phase difference detection. The light shielding portion 204 can be formed of, for example, a metal material or the like containing tungsten (W), aluminum (Al), copper (Cu), titanium (Ti), molybdenum (Mo), nickel (Ni), or the like.

Moreover, for example, in the semiconductor substrate 10 of the second conductivity type (for example, P type), the photoelectric conversion unit 302 having the impurity of the first conductivity type (for example, N type) is provided for each of the pixels 300*a* and 300*b* adjacent to each other. As described above, the photoelectric conversion unit 302 absorbs the light L having the red wavelength component, the green wavelength component, or the blue wavelength component incident through the color filter 202, and generates a charge. Then, in the present embodiment, the photoelectric conversion unit 302 of the pixel 300*a* and the photoelectric conversion unit 302 of the pixel 300*b* can function as a pair of phase difference detection pixels at the time of phase difference detection. That is, in the present embodiment, the phase difference can be detected by detecting a difference between pixel signals based on charges generated by the photoelectric conversion unit 302 of the pixel 300*a* and the photoelectric conversion unit 302 of the pixel 300*b*.

Specifically, the photoelectric conversion unit 302 changes the amount of charge to be generated, that is, the sensitivity, depending on the incident angle of light with respect to its own optical axis (axis perpendicular to the light receiving surface). For example, the photoelectric conversion unit 302 has the highest sensitivity when the incident angle is 0 degrees, and the sensitivity of the photoelectric conversion unit 302 has a line-symmetric relationship with respect to the incident angle with the incident angle having 0 degrees as the object axis. Therefore, in the photoelectric conversion unit 302 of the pixel 300*a* and the photoelectric conversion unit 302 of the pixel 300*b*, light from the same point is incident at different incident angles, and charges of amounts corresponding to the incident angles are generated, so that a shift (phase difference) occurs in the detected image. That is, the phase difference can be detected by detecting a difference between the pixel signals based on the charge amount generated by the photoelectric conversion unit 302 of the pixel 300*a* and the photoelectric conversion unit 302 of the pixel 300*b*. Therefore, such a difference (phase difference) between the pixel signals is detected as a difference signal in a detection unit (not illustrated) of the output circuit unit 24, for example, a defocus amount is calculated on the basis of the detected phase difference, and an image forming lens (not illustrated) is adjusted (moved), whereby autofocus can be realized. Note that, in the above description, it has been described that the phase difference is detected as a difference between the pixel signals of the photoelectric conversion unit 302 of the pixel 300*a* and the photoelectric conversion unit 302 of the pixel 300*b*. However, in the present embodiment. However, the present invention is not limited thereto, and for example, the phase difference may be detected as a ratio between the pixel signals of the photoelectric conversion unit 302 of the pixel 300*a* and the photoelectric conversion unit 302 of the pixel 300*b*.

Furthermore, in the present embodiment, the two photoelectric conversion units 302 are physically separated by the protruding portion 304. The protruding portion 304 includes a trench (not illustrated) provided as a penetrating deep trench isolation (DTI) so as to penetrate the semiconductor substrate 10 along the thickness direction of the semiconductor substrate 10, and a material embedded in the trench and made of an oxide film such as a silicon oxide film (SiO), a silicon nitride film, amorphous silicon, polycrystalline silicon, a titanium oxide film (TiO), aluminum, or tungsten or a metal film. In the imaging element 100, at the time of phase difference detection, in a case where the pixel signals output from the pair of pixels 300*a* and 300*b* are mixed with each other and color mixing occurs, accuracy of phase difference detection deteriorates. In the present embodiment, since the protruding portion 304 penetrates the semiconductor substrate 10, the pair of pixels 300*a* and 300*b* can be physically separated effectively. As a result, the occurrence of color mixing can be suppressed, and the accuracy of phase difference detection can be further improved.

Furthermore, in a case where the imaging element 100 is viewed from the light receiving surface 10*a* side, a slit 312 (see FIG. 4) corresponding to a space between the two protruding portions 304 is provided in the vicinity of the center of the imaging element 100. Furthermore, in the region of the slit 312 (an example of a region positioned around the protruding portion 304 and extending in the thickness direction of the semiconductor substrate 10) in the semiconductor substrate 10, the impurity of the second conductivity type (for example, the P type) is diffused via the protruding portion 304 by conformal doping, and the diffusion region 306 (an example of the first diffusion region) is formed (specifically, as will be described later, the diffusion region 306 is also formed around the element separation wall 310). In order to further improve the accuracy of phase difference detection, the diffusion region 306 can electrically separate the pair of pixels 300*a* and 300*b* so as not to cause color mixing. Furthermore, in the present embodiment, since the protruding portion 304 penetrates the semiconductor substrate 10, the diffusion region 306 can be formed deep (here, the depth is a distance to the back surface 10*a* and the front surface 10*b* of the semiconductor substrate 10 along the thickness direction of the semiconductor substrate 10) in the semiconductor substrate 10 by conformal doping via the protruding portion 304. Therefore, in the present embodiment, since the desired diffusion region 306 can be formed with high accuracy, the pair of pixels 300*a* and 300*b* can be effectively electrically separated. As a result, the occurrence of color mixing can be suppressed, and the accuracy of phase difference detection can be further improved. Details of the region of the slit 312 will be described later.

Furthermore, in the present embodiment, as illustrated in FIG. 3, an impurity of the first conductivity type (for example, N type) is introduced by ion implantation below the diffusion region 306 (on the front surface 10*b* side) provided in the slit 312, whereby the diffusion region 320 is formed. Specifically, the impurity of the first conductivity type is ion-implanted into the lower region in the diffusion region 306 described above, and a hole is formed in the diffusion region 306, thereby forming the diffusion region 320. Then, the diffusion region 320 functions as an overflow path capable of exchanging charges generated between the pixels 300*a* and 300*b*. Specifically, at the time of normal imaging, when the charge of one pixel of the pixels 300*a* and 300*b* is about to be saturated, the charge is transferred to the other pixel via the overflow path, whereby the saturation of one pixel can be avoided. Then, by providing such an overflow path, the linearity of the pixel signal output from the imaging element 100 can be secured, and deterioration of the captured image can be prevented. Further, in the present embodiment, instead of forming the diffusion region 320 by ion implantation, a gate (not illustrated) may be provided between the transfer gates 400*a* and 400*b* on the front surface 10*b* of the semiconductor substrate 10. In this case, by adjusting the voltage applied to the gate, the pair of pixels 300*a* and 300*b* may be electrically separated at the time of phase difference detection, and a channel serving as an overflow path may be formed in a region on the front surface 10*b* side of the slit 312 at the time of normal imaging.

Furthermore, in the present embodiment, an element separation wall 310 surrounding the pixels 300*a* and 300*b* and physically separating the adjacent imaging elements 100 is provided in the semiconductor substrate 10. The element separation wall 310 includes a trench (not illustrated) provided so as to penetrate the semiconductor substrate 10 along the thickness direction of the semiconductor substrate 10, and a material embedded in the trench and made of an oxide film such as a silicon oxide film, a silicon nitride film, amorphous silicon, polycrystalline silicon, a titanium oxide film, aluminum, or tungsten, or a metal film. That is, the protruding portion 304 and the element separation wall 310 may be formed of the same material. Note that, in the present embodiment, since the element separation wall 310 and the protruding portion 304 have the same configuration, they can have a form in which they are integrated with each other, and thus can be formed simultaneously. As a result, according to the present embodiment, since the protruding portion 304 can be formed simultaneously with the element separation wall 310, an increase in the process steps of the imaging element 100 can be suppressed.

Furthermore, in the present embodiment, the charges generated in the photoelectric conversion unit 302 of the pixel 300*a* and the photoelectric conversion unit 302 of the pixel 300*b* are transferred via the transfer gates 400*a* and 400*b* of the transfer transistors (one type of the pixel transistors described above) provided on the front surface 10*b* positioned on the opposite side of the light receiving surface 10*a* of the semiconductor substrate 10. The transfer gates 400*a* and 400*b* can be formed of, for example, a metal film. Then, the charge may be accumulated in, for example, a floating diffusion portion (charge accumulation portion) (not illustrated) provided in a semiconductor region having the first conductivity type (for example, N type) provided in the semiconductor substrate 10. Note that, in the present embodiment, the floating diffusion portion is not limited to being provided in the semiconductor substrate 10, and may be provided, for example, on another substrate (not illustrated) stacked on the semiconductor substrate 10.

Furthermore, on the front surface 10*b* of the semiconductor substrate 10, a plurality of pixel transistors (not illustrated) other than the above-described transfer transistors, which are used for reading out charges as pixel signals, and the like, may be provided. Furthermore, in the present embodiment, the pixel transistor may be provided on the semiconductor substrate 10, or may be provided on another substrate (not illustrated) stacked on the semiconductor substrate 10.

3.2 Planar Configuration

Figure 4:
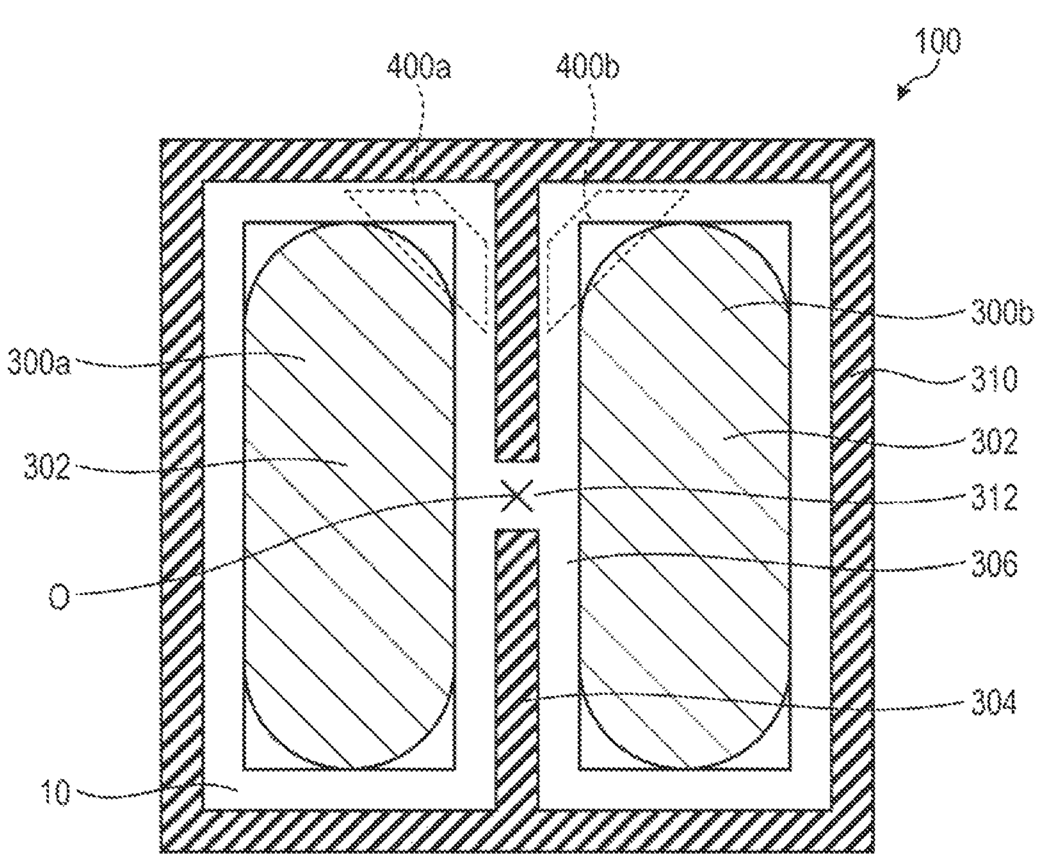
FIG. 4 is an explanatory diagram illustrating a plane of the imaging element 100 according to the first embodiment of the present disclosure.

Next, a planar configuration of the imaging element 100 according to the first embodiment of the present disclosure will be described with reference to FIG. 4. FIG. 4 is an explanatory diagram illustrating a plane of the imaging element 100 according to the present embodiment, and specifically corresponds to a cross-section of the imaging element 100 taken along line A-A' illustrated in FIG. 3.

As illustrated in FIG. 4, in the present embodiment, the pixels 300*a* and 300*b* adjacent to each other are separated by a protruding portion 304 formed integrally with the element separation wall 310. Specifically, when the imaging element 100 is viewed from above the light receiving surface 10*a*, the element separation wall 310 has two protruding portions (an example of a first separation portion) 304 protruding along the column direction toward the center O of the imaging element 100 and facing each other. Here, in a case where the imaging element 100 is viewed from the light receiving surface 10*a* side, a region between the two protruding portions 304 positioned in the vicinity of the center of the imaging element 100 is referred to as a slit 312. In the region of the slit 312, as described above, impurities of the second conductivity type (for example, P type) are diffused via the protruding portion 304 by conformal doping, and the diffusion region 306 is formed so as to surround the protruding portion 304. As described above, in order to further improve the accuracy of phase difference detection, the diffusion region 306 can electrically separate the pair of pixels 300*a* and 300*b* so as not to cause color mixing. Furthermore, in the present embodiment, the impurity of the second conductivity type is diffused via the element separation wall 310 by conformal doping, and the diffusion region 306 is formed along the element separation wall 310.

Furthermore, the two protruding portions 304 are provided at the center of the imaging element 100 in the row direction when the imaging element 100 is viewed from above the light receiving surface 10*a*, and protruding lengths (lengths in the column direction) are substantially the same. As described above, the two protruding portions 304 are provided so as to penetrate the semiconductor substrate 10. Note that, in the present embodiment, the width of the protruding portion 304 is not particularly limited as long as the pair of pixels 300*a* and 300*b* can be separated.

Figure 5:
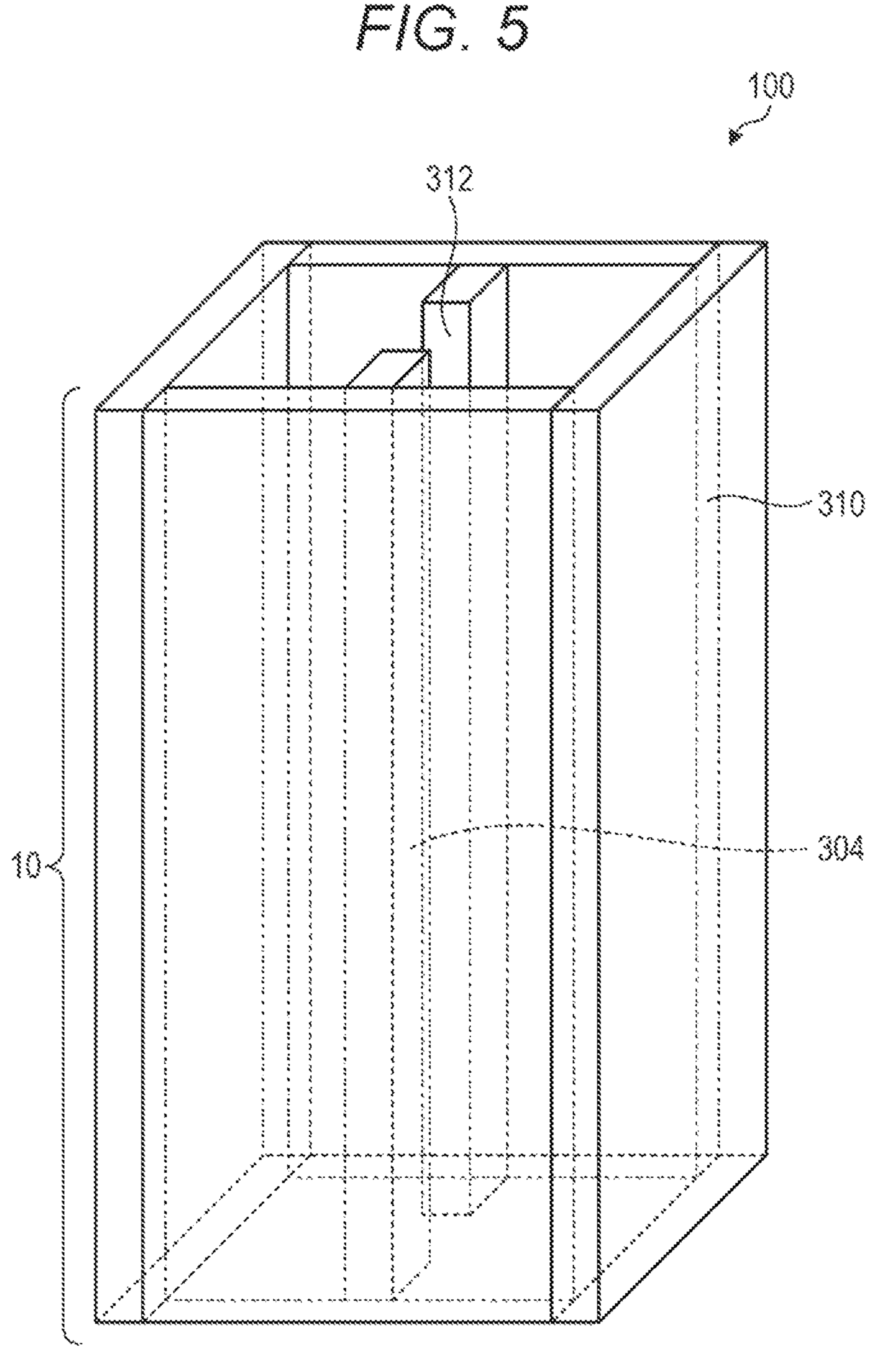
FIG. 5 is a transparent perspective view of the imaging element 100 according to the first embodiment of the present disclosure.

Furthermore, the protruding portion 304 and the element separation wall 310 according to the present embodiment described above have a form as illustrated in FIG. 5 which is a transparent perspective view of the imaging element 100 according to the present embodiment. That is, the protruding portion 304 and the element separation wall 310 according to the present embodiment are provided so as to penetrate the semiconductor substrate 10. Furthermore, the slit 312 is provided in the vicinity of the center of the imaging element 100 between the two protruding portions 304.

As described above, in the present embodiment, since the slit 312 is provided in the vicinity of the center O of the imaging element 100, scattering of light by the protruding portion 304 is suppressed. Therefore, according to the present embodiment, light incident on the center O of the imaging element 100 can be incident on the photoelectric conversion unit 302 without being scattered. As a result, according to the present embodiment, since the imaging element 100 can more reliably capture light incident on the center O of the imaging element 100, deterioration of imaging pixels can be avoided.

Furthermore, in the present embodiment, as described above, for example, the impurity of the first conductivity type is introduced into the region on the front surface 10*b* side of the slit 312 by ion implantation, and a channel serving as an overflow path can be formed. Therefore, according to the present embodiment, since the overflow path can be formed at the time of normal imaging while separating the pair of pixels 300*a* and 300*b* at the time of phase difference detection, deterioration of the captured image can be avoided while improving the accuracy of phase difference detection.

Furthermore, in the present embodiment, since the diffusion region 306 can be formed by introducing impurities into the region of the slit 312 via the protruding portion 304 by conformal doping, use of ion implantation can be avoided. Therefore, according to the present embodiment, since the ion implantation is not used, it is possible to avoid introduction of impurities into the photoelectric conversion unit 302, and it is possible to avoid reduction and damage of the photoelectric conversion unit 302. Further, using conformal doping, it is possible to repair crystal defects while uniformly diffusing impurities by applying a high temperature. As a result, according to the present embodiment, it is possible to suppress a decrease in sensitivity and a decrease in dynamic range of the imaging element 100.

Note that, in the present embodiment, when the imaging element 100 is viewed from above the light receiving surface 10*a*, the element separation wall 310 may have two protruding portions (an example of the first separation portion) 304 protruding along the row direction toward the center O of the imaging element 100 and facing each other. Furthermore, in this case, the two protruding portions 304 may be provided at the center of the imaging element 100 in the column direction when the imaging element 100 is viewed from above the light receiving surface 10*a*.

As described above, according to the present embodiment, at the time of phase difference detection, since the diffusion region 306 that electrically separates the pair of pixels 300*a* and 300*b* from the protruding portion 304 that physically separates the pair of pixels 300*a* and 300*b*, the diffusion region 320 that electrically separates the pair of pixels 300*a* and 300*b*, and the like are provided. Thus, it is possible to avoid deterioration of the captured image while improving the accuracy of phase difference detection. Specifically, in the present embodiment, the pair of pixels 300*a* and 300*b* can be effectively separated by the protruding portion 304 and the diffusion region 306. As a result, the occurrence of color mixing can be suppressed, and the accuracy of phase difference detection can be further improved. Furthermore, in the present embodiment, since the overflow path is provided, when the charge of any one pixel of the pixels 300*a* and 300*b* is about to be saturated at the time of normal imaging, saturation of one pixel can be avoided by transferring the charge to the other pixel via the overflow path. Therefore, according to the present embodiment, by providing such an overflow path, the linearity of the pixel signal output from the imaging element 100 can be secured, and deterioration of the captured image can be prevented.

Furthermore, in the present embodiment, since the diffusion region 306 can be formed by diffusing impurities into the region of the slit 312 via the protruding portion 304 by conformal doping, use of ion implantation can be avoided. Therefore, according to the present embodiment, since the ion implantation is not used, it is possible to avoid introduction of impurities into the photoelectric conversion unit 302, and it is possible to avoid reduction and damage of the photoelectric conversion unit 302. Further, using conformal doping, it is possible to repair crystal defects while uniformly diffusing impurities by applying a high temperature. As a result, according to the present embodiment, it is possible to suppress a decrease in sensitivity and a decrease in dynamic range of the imaging element 100.

Furthermore, in the present embodiment, since the protruding portion 304 penetrates the semiconductor substrate 10, the diffusion region 306 can be formed in a deep region in the semiconductor substrate 10 by conformal doping via the protruding portion 304. Therefore, in the present embodiment, since the desired diffusion region 306 can be formed with high accuracy, the pair of pixels 300*a* and 300*b* can be effectively electrically separated. As a result, the occurrence of color mixing can be suppressed, and the accuracy of phase difference detection can be further improved. Furthermore, according to the present embodiment, since the element separation wall 310 and the protruding portion 304 have the same form, the protruding portion 304 can be formed simultaneously with the element separation wall 310, and an increase in process steps of the imaging element 100 can be suppressed.

In addition, in the present embodiment, since the slit 312 is provided at the center O of the imaging element 100, scattering of light by the protruding portion 304 is suppressed, and light incident on the center O of the imaging element 100 can be incident on the photoelectric conversion unit 302 without being scattered. As a result, according to the present embodiment, since the imaging element 100 can more reliably capture light incident on the center O of the imaging element 100, deterioration of imaging pixels can be avoided.

3.3 Modified Example

Figure 6:
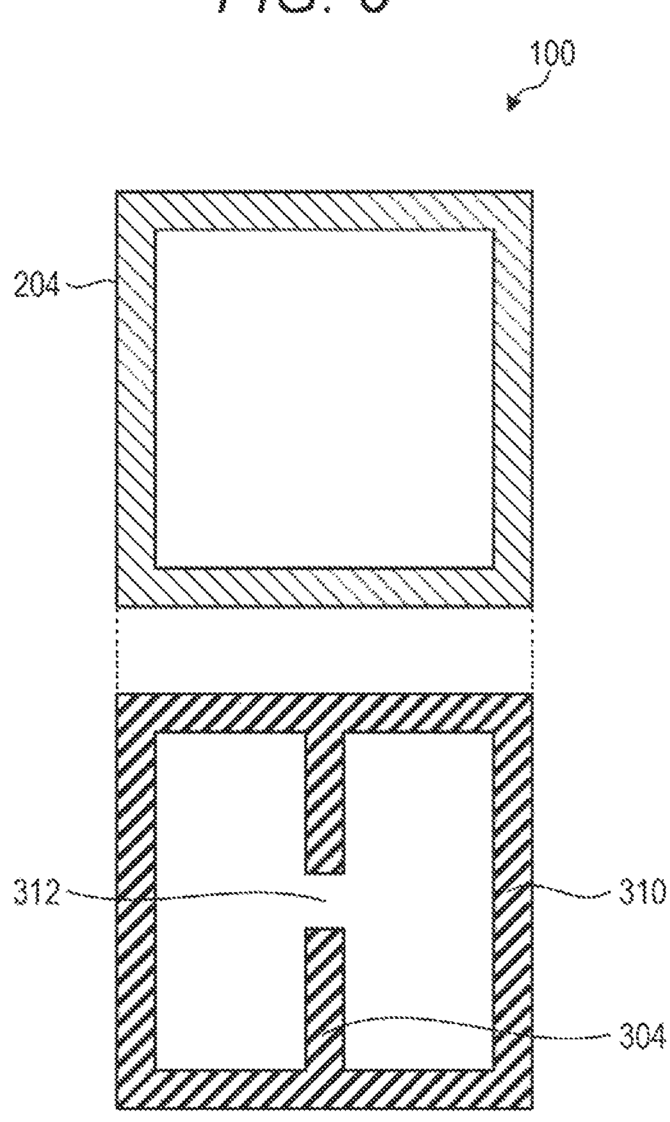
FIG. 6 is an explanatory diagram illustrating a configuration example of a light shielding portion 204 according to the first embodiment of the present disclosure.
Figure 7:
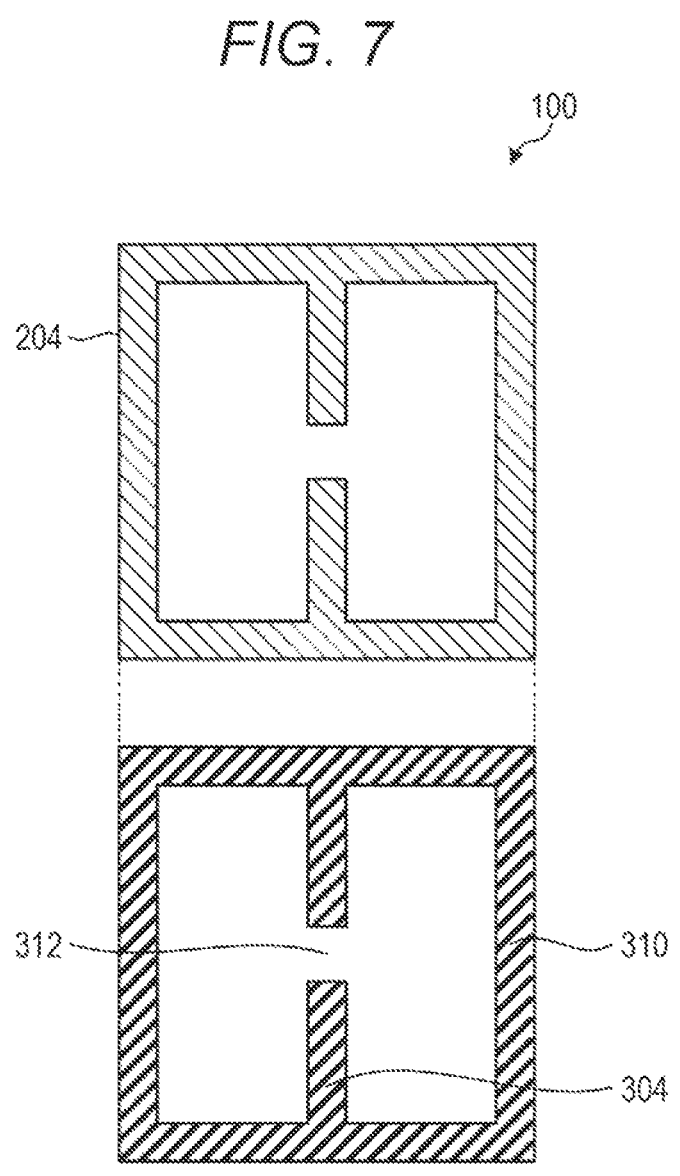

In the present embodiment, the light shielding portion (light shielding film) 204 can be modified as follows. Therefore, a detailed configuration of the light shielding portion 204 will be described with reference to FIGS. 6 and 7. FIG. 6 is an explanatory diagram illustrating a configuration example of the light shielding portion 204 according to the present embodiment, and FIG. 7 is an explanatory diagram illustrating a configuration example of the light shielding portion 204 according to a modified example of the present embodiment. Note that, in FIGS. 6 and 7, the view illustrated in the lower part corresponds to a cross-section obtained by cutting the imaging element 100 along line A-A' illustrated in FIG. 3, and the view illustrated in the upper part corresponds to a cross-section obtained by cutting the imaging element 100 along line B-B' illustrated in FIG. 3.

In the present embodiment, for example, as illustrated in FIG. 6, in a case where the imaging element 100 is viewed from above the light receiving surface 10*a*, the light shielding portion (light shielding film) 204 may be provided on the element separation wall 310 along the element separation wall 310.

Furthermore, in the modified example of the present embodiment, for example, as illustrated in FIG. 7, when the imaging element 100 is viewed from above the light receiving surface 10*a*, the light shielding portion (light shielding film) 204 may be not only provided on the element separation wall 310 along the element separation wall 310, but also provided on the protruding portion 304 (an example of the first separation portion) along the protruding portion 304.

4. Second Embodiment

Figure 8:
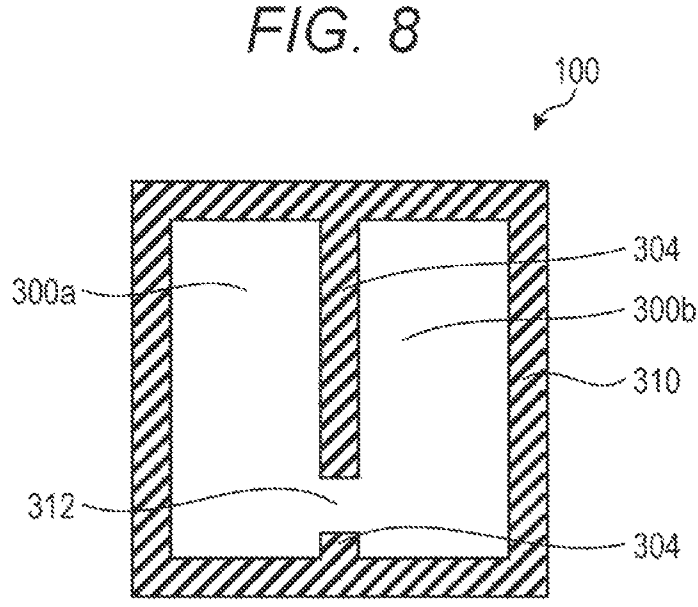
FIG. 8 is an explanatory diagram illustrating a plane of an imaging element 100 according to a second embodiment of the present disclosure.

In the embodiment of the present disclosure, in a case where the imaging element 100 is viewed from above the light receiving surface 10*a*, the protruding lengths (lengths in the column direction) of the two protruding portions 304 are not limited to being substantially the same, and may be different from each other. Therefore, a second embodiment of the present disclosure in which protruding lengths are different from each other will be described with reference to FIG. 8. FIG. 8 is an explanatory diagram illustrating a plane of the imaging element 100 according to the present embodiment, and specifically corresponds to a cross-section of the imaging element 100 taken along line A-A' illustrated in FIG. 3.

As illustrated in FIG. 8, in the present embodiment, when the imaging element 100 is viewed from above the light receiving surface 10*a*, the element separation wall 310 has two protruding portions (an example of a first separation portion) 304 protruding along the column direction toward the center O (not illustrated) of the imaging element 100 and facing each other. Further, the protruding lengths of the two protruding portions 304 are different from each other.

Note that, in the present embodiment, the two protruding portions 304 may protrude along the row direction toward the center O (not illustrated) of the imaging element 100. Furthermore, in the present embodiment, the two protruding portions 304 are not limited to be provided so as to face each other, and for example, one protruding portion may be provided. In this case, in the region between the protruding portion 304 and the portion of the element separation wall 310 facing the protruding portion 304, the impurity of the second conductivity type (for example, P-type) is diffused via the protruding portion 304 and the element separation wall 310 by conformal doping, and the diffusion region (an example of the first diffusion region) 306 is formed.

5. Third Embodiment

Figure 9:
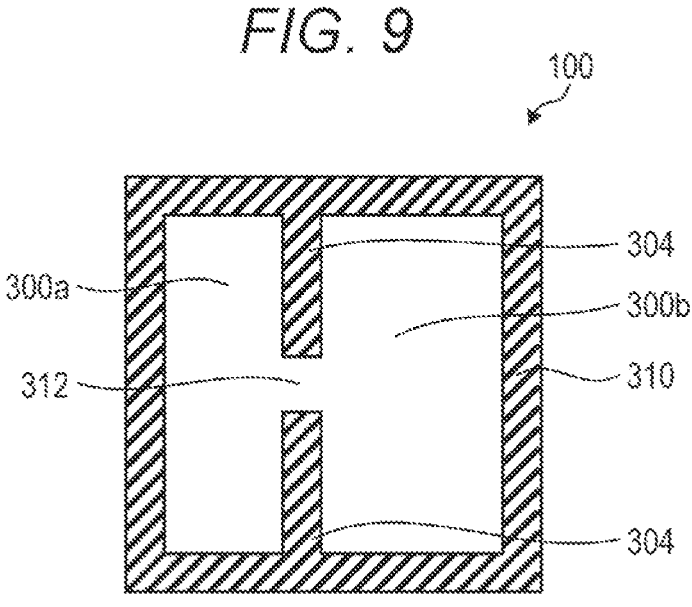
FIG. 9 is an explanatory diagram illustrating a plane of an imaging element 100 according to a third embodiment of the present disclosure.

In the embodiment of the present disclosure, the two protruding portions 304 are not limited to being provided at the center of the imaging element 100 in the row direction when the imaging element 100 is viewed from above the light receiving surface 10*a*, and may be provided at a position shifted by a predetermined distance from the center of the imaging element 100 in the row direction. Therefore, a third embodiment of the present disclosure in which the two protruding portions 304 are provided at positions shifted by a predetermined distance from the center of the imaging element 100 in the row direction will be described with reference to FIG. 9. FIG. 9 is an explanatory diagram illustrating a plane of the imaging element 100 according to the present embodiment, and specifically corresponds to a cross-section of the imaging element 100 taken along line A-A' illustrated in FIG. 3.

As illustrated in FIG. 9, in the present embodiment, similarly to the first embodiment, the element separation wall 310 has two protruding portions (an example of a first separation portion) 304 facing each other and protruding along the column direction when the imaging element 100 is viewed from above the light receiving surface 10*a*. Furthermore, in the present embodiment, the protruding portions 304 are provided at positions shifted by a predetermined distance from the center of the imaging element 100 in the row direction. In the present embodiment, the predetermined distance is not particularly limited.

Furthermore, in the present embodiment, the two protruding portions 304 are not limited to the form illustrated in FIG. 9. For example, in the case of the two protruding portions (an example of the first separation portion) 304 protruding along the row direction, the two protruding portions may be provided at positions shifted by a predetermined distance from the center of the imaging element 100 in the column direction. In addition, the present embodiment may be combined with the second embodiment described above, and thus the protruding lengths of the two protruding portions 304 may be different from each other.

6. Fourth Embodiment

Figure 10:
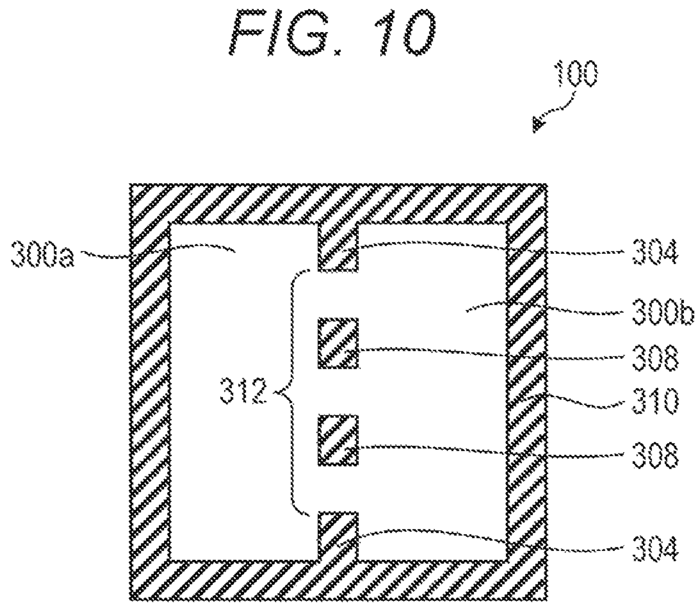
FIG. 10 is an explanatory diagram (part 1) illustrating a plane of an imaging element 100 according to a fourth embodiment of the present disclosure.
Figure 11:
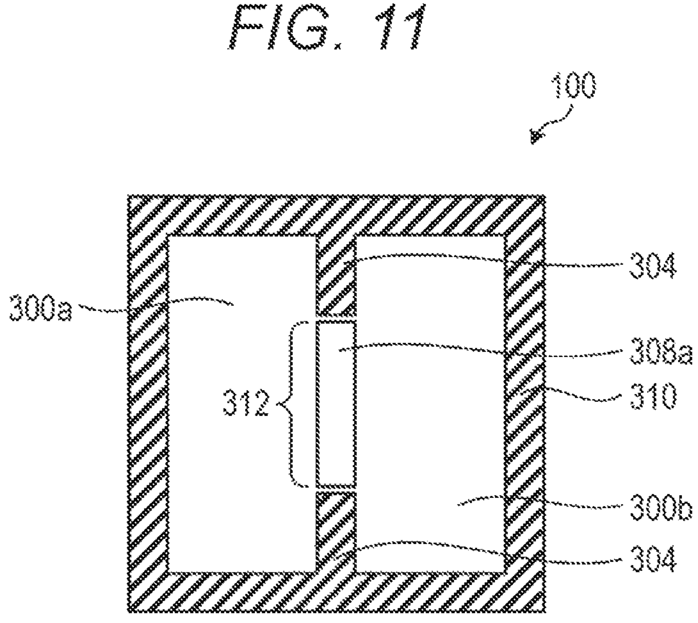
FIG. 11 is an explanatory diagram (part 2) illustrating a plane of the imaging element 100 according to the fourth embodiment of the present disclosure.
Figure 12:
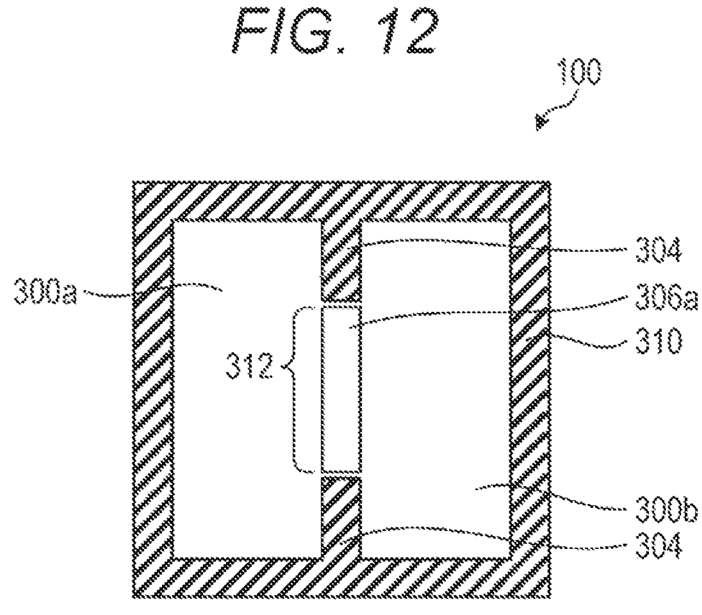
FIG. 12 is an explanatory diagram (part 3) illustrating a plane of the imaging element 100 according to the fourth embodiment of the present disclosure.

Meanwhile, in a case where the plane size of the imaging element 100 is large, there is a possibility that the pair of pixels 300*a* and 300*b* cannot be sufficiently separated in the protruding portion 304 and the diffusion region 306. Therefore, in such a case, it is conceivable to further provide the additional wall 308 and the like between the two protruding portions 304 in order to ensure sufficient separation of the pair of pixels 300*a* and 300*b*. Hereinafter, such an embodiment will be described as a fourth embodiment of the present disclosure with reference to FIGS. 10 to 12. FIGS. 10 to 12 are explanatory diagrams illustrating a plane of the imaging element 100 according to the present embodiment, and specifically correspond to a cross-section of the imaging element 100 taken along line A-A' illustrated in FIG. 3.

First, as illustrated in FIG. 10, in the present embodiment, as in the first embodiment, the element separation wall 310 has two protruding portions (an example of a first separation portion) 304 facing each other and protruding along the column direction when the imaging element 100 is viewed from above the light receiving surface 10*a*. Furthermore, in the present embodiment, a plurality of rectangular additional walls 308 is arranged in a dot shape between these protruding portions 304 (slits 312). Similarly to the protruding portion 304, the additional wall 308 is provided so as to penetrate the semiconductor substrate 10. In addition, although not illustrated in FIG. 10, a diffusion region 306 formed by introducing an impurity of the second conductivity type (for example, P type) by conformal doping via the additional wall 308 is also provided around the additional wall 308.

In the present embodiment, by providing the plurality of additional walls 308 between the two protruding portions 304 (slits 312) and providing the diffusion region 306 also around the additional walls 308, it is possible to further ensure sufficient separation of the pair of pixels 300*a* and 300*b*. Furthermore, in the present embodiment, by providing the additional wall 308 in a dot shape, scattering of light by the additional wall 308 is suppressed, and light incident on the center O (not illustrated) of the imaging element 100 can be incident on the photoelectric conversion unit 302 without being scattered. As a result, according to the present embodiment, since the imaging element 100 can more reliably capture light incident on the center O of the imaging element 100, deterioration of imaging pixels can be avoided.

In the present embodiment, the cross-section of the additional wall 308 is not limited to the rectangular shape as illustrated in FIG. 10, and the number of additional walls 308 is not limited to two as illustrated in FIG. 10, and may be one or three or more.

As illustrated in FIG. 11, in the present embodiment, one additional wall 308*a* may be disposed between the two protruding portions 304 (slits 312), and the additional wall 308*a* may be used as the back surface DTI. The back surface DTI is formed by forming a trench penetrating from the light receiving surface 10*a* (back surface) side of the semiconductor substrate 10 to the middle of the semiconductor substrate 10 along the thickness direction of the semiconductor substrate 10 and embedding an oxide film or the like in the trench. In this case, a channel serving as the overflow path is formed by introducing impurities into a region on the front surface 10*b* side of the additional wall 308*a* through which the additional wall 308*a* does not penetrate.

In the present embodiment, the cross-section of the additional wall 308*a* is not limited to the rectangular shape as illustrated in FIG. 11, and the number of additional walls 308*a* is not limited to two as illustrated in FIG. 11, and may be one or three or more.

Furthermore, in a case where the plane size of the imaging element 100 is large, there is a possibility that the pair of pixels 300*a* and 300*b* cannot be sufficiently separated in the diffusion region 306. Therefore, in such a case, in order to ensure sufficient separation of the pair of pixels 300*a* and 300*b*, as illustrated in FIG. 12, a diffusion region 306*a* (an example of a first diffusion region) formed by introducing an impurity of the second conductivity type (for example, P-type) by ion implantation may be provided between the two protruding portions 304 (slits 312).

7. Fifth Embodiment

Figure 13:
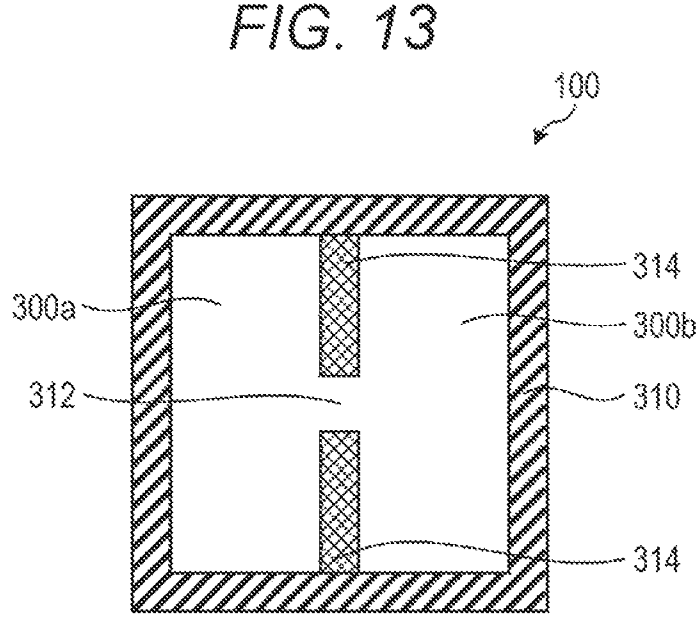
FIG. 13 is an explanatory diagram illustrating a plane of an imaging element 100 according to a fifth embodiment of the present disclosure.

Further, in the embodiment of the present disclosure, the protruding portion 304 may be formed of a material different from the element separation wall 310. Hereinafter, such an embodiment will be described as a fifth embodiment of the present disclosure with reference to FIG. 13. FIG. 13 is an explanatory diagram illustrating a plane of the imaging element 100 according to the present embodiment, and specifically corresponds to a cross-section of the imaging element 100 taken along line A-A' illustrated in FIG. 3.

As described above, the protruding portion 304 and the element separation wall 310 are made of a material including an oxide film such as a silicon oxide film, a silicon nitride film, amorphous silicon, polycrystalline silicon, a titanium oxide film, aluminum, or tungsten, or a metal film. Therefore, in the present embodiment, as illustrated in FIG. 13, the protruding portion 304 and the element separation wall 310 may be formed of materials selected from the above-described materials and different from each other.

More specifically, for example, the element separation wall 310 is formed of a silicon oxide film, and the protruding portion 304 is formed of a titanium oxide film having a high refractive index with a small difference in refractive index from silicon forming the semiconductor substrate 10. In this way, scattering of light by the protruding portion 304 can be suppressed, and light incident on the center O (not illustrated) of the imaging element 100 can be incident on the photoelectric conversion unit 302 without being scattered. As a result, according to the present embodiment, since the imaging element 100 can more reliably capture light incident on the center O of the imaging element 100, deterioration of imaging pixels can be avoided. Note that, in the present embodiment, the protruding portion 304 is not limited to being formed of a titanium oxide film, and for example, other materials may be used as long as the material has a small difference in refractive index from the material forming the semiconductor substrate 10.

8. Sixth Embodiment

Figure 14:
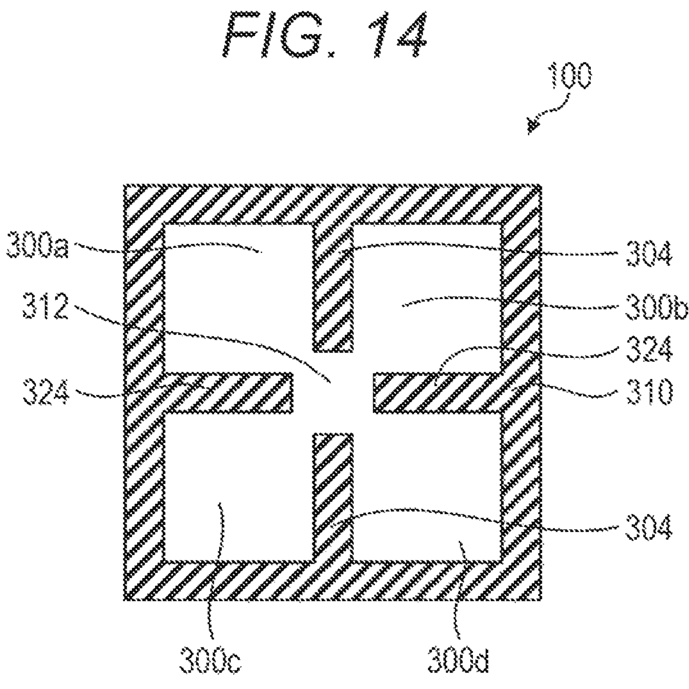
FIG. 14 is an explanatory diagram illustrating a plane of an imaging element 100 according to a sixth embodiment of the present disclosure.

Furthermore, the embodiment of the present disclosure is not limited to providing the two protruding portions 304, and two or more protruding portions 304 may be provided. Hereinafter, such an embodiment will be described as a sixth embodiment of the present disclosure with reference to FIG. 14. FIG. 14 is an explanatory diagram illustrating a plane of the imaging element 100 according to the present embodiment, and specifically corresponds to a cross-section of the imaging element 100 taken along line A-A' illustrated in FIG. 3.

As illustrated in FIG. 14, in the present embodiment, when the imaging element 100 is viewed from above the light receiving surface 10*a*, the element separation wall 310 includes two protruding portions (an example of a first separation portion) 304 protruding along the column direction toward the center of the imaging element 100 and facing each other, and two protruding portions (an example of a second separation portion) 324 protruding along the row direction toward the center of the imaging element 100 and facing each other. The four protruding portions 304 and 324 are provided so as to penetrate the semiconductor substrate 10.

Furthermore, in the present embodiment, although not illustrated in FIG. 14, impurities of the second conductivity type (for example, P-type) are introduced into a space (slit 312) between the two protruding portions 304 facing each other and a space (slit 312) between the two protruding portions 324 facing each other by conformal doping via the protruding portions 304 and 324, and the diffusion region 306 (an example of a first diffusion region and an example of a second diffusion region) can be formed. Furthermore, also in the present embodiment, the diffusion region 320 that is formed by introducing impurities of the first conductivity type (for example, N type) by ion implantation and functions as an overflow path is formed below the diffusion region 306 provided in the slit 312 (on the front surface 10*b* side).

In the case of FIG. 14, the inside of the imaging element 100 is separated into four pixels 300*a*, 300*b*, 300*c*, and 300*d* by such four protruding portions 304. In this case, a phase difference in both the row direction and the column direction can be detected by one imaging element 100. Note that the present embodiment is not limited to the four protruding portions 304 and 324, and four or more (for example, eight or the like) protruding portions may be provided.

9. Seventh Embodiment

Figure 15:
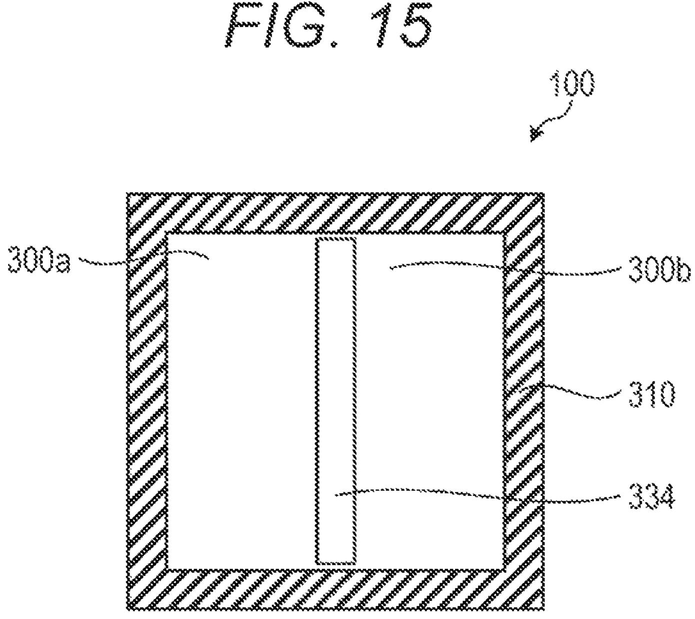
FIG. 15 is an explanatory diagram illustrating a plane of an imaging element 100 according to a seventh embodiment of the present disclosure.

Furthermore, in the embodiment of the present disclosure, a pixel separation wall 334 including a back surface DTI that separates the pair of pixels 300*a* and 300*b* may be provided. Hereinafter, such an embodiment will be described as a seventh embodiment of the present disclosure with reference to FIG. 15. FIG. 15 is an explanatory diagram illustrating a plane of the imaging element 100 according to the present embodiment, and specifically corresponds to a cross-section of the imaging element 100 taken along line A-A' illustrated in FIG. 3.

As illustrated in FIG. 15, in the present embodiment, a pixel separation wall (an example of a separation portion) 334 including a back surface DTI is provided between the pair of pixels 300*a* and 300*b*. As described above, the back surface DTI is formed by forming a trench penetrating from the light receiving surface 10*a* (back surface) side of the semiconductor substrate 10 to the middle of the semiconductor substrate 10 along the thickness direction of the semiconductor substrate 10 and embedding an oxide film or the like in the trench. In this case, in the thickness direction of the semiconductor substrate 10, a region on the front surface 10*b* side of the pixel separation wall 334 through which the pixel separation wall 334 does not penetrate becomes an overflow path. Alternatively, in the present embodiment, an overflow path may be formed by introducing an impurity of the first conductivity type into the region by ion implantation. Note that, in the present embodiment, the pixel separation wall 334 may or may not be in contact with the element separation wall 310, and is not particularly limited. Furthermore, in the case of not being in contact with each other, a diffusion region (not illustrated) is provided which is formed by introducing an impurity of the second conductivity type (for example, P type) by conformal doping via the element separation wall 310 or ion implantation between the pixel separation wall 334 and the element separation wall 310, and electrically separates the pair of pixels 300*a* and 300*b* from each other.

As described above, according to the present embodiment, by providing the pixel separation wall 334 including the back surface DTI that physically separates the pair of pixels 300*a* and 300*b* at the time of phase difference detection, it is possible to effectively physically separate the pair of pixels 300*a* and 300*b*. As a result, it is possible to suppress the occurrence of color mixing and further improve the accuracy of phase difference detection. Furthermore, in the present embodiment, when the charge of any one of the pixels 300*a* and 300*b* is about to be saturated at the time of normal imaging due to the overflow path positioned in the region on the front surface 10*b* side of the pixel separation wall 334, the charge is transferred to the other pixel via the overflow path, so that the saturation of the one pixel can be avoided. Then, according to the present embodiment, by providing such an overflow path, the linearity of the pixel signal output from the imaging element 100 can be secured, and deterioration of the captured image can be prevented.

Furthermore, in the present embodiment, a pixel separation wall 334 formed by introducing an impurity of the second conductivity type (for example, P-type) by ion implantation may be provided between the pair of pixels 300*a* and 300*b*. Also in such a modified example, the pixel separation wall 334 formed by ion implantation is formed in such a form as to penetrate from the light receiving surface 10*a* (back surface) side of the semiconductor substrate 10 to the middle of the semiconductor substrate 10 along the thickness direction of the semiconductor substrate 10. In the modified example, in the thickness direction of the semiconductor substrate 10, a region on the front surface 10*b* side of the pixel separation wall 334 through which the pixel separation wall 334 does not penetrate is an overflow path. Then, the overflow path may be formed by preventing impurities from being implanted into the region on the front surface 10*b* side of the pixel separation wall 334 at the time of ion implantation for forming the pixel separation wall 334, or may be formed by introducing impurities of the first conductivity type into the region by ion implantation. Note that, also in this modified example, the pixel separation wall 334 may or may not be in contact with the element separation wall 310, and is not particularly limited.

As described above, according to this modified example, by providing the pixel separation wall 334 formed by ion implantation, it is possible to effectively electrically separate the pair of pixels 300*a* and 300*b*. As a result, it is possible to suppress the occurrence of color mixing and further improve the accuracy of phase difference detection. Furthermore, in the present embodiment, when the charge of any one of the pixels 300*a* and 300*b* is about to be saturated at the time of normal imaging due to the overflow path positioned in the region on the front surface 10*b* side of the pixel separation wall 334, the charge is transferred to the other pixel via the overflow path, so that the saturation of the one pixel can be avoided. Then, by providing such an overflow path, the linearity of the pixel signal output from the imaging element 100 can be secured, and deterioration of the captured image can be prevented.

Figure 16:
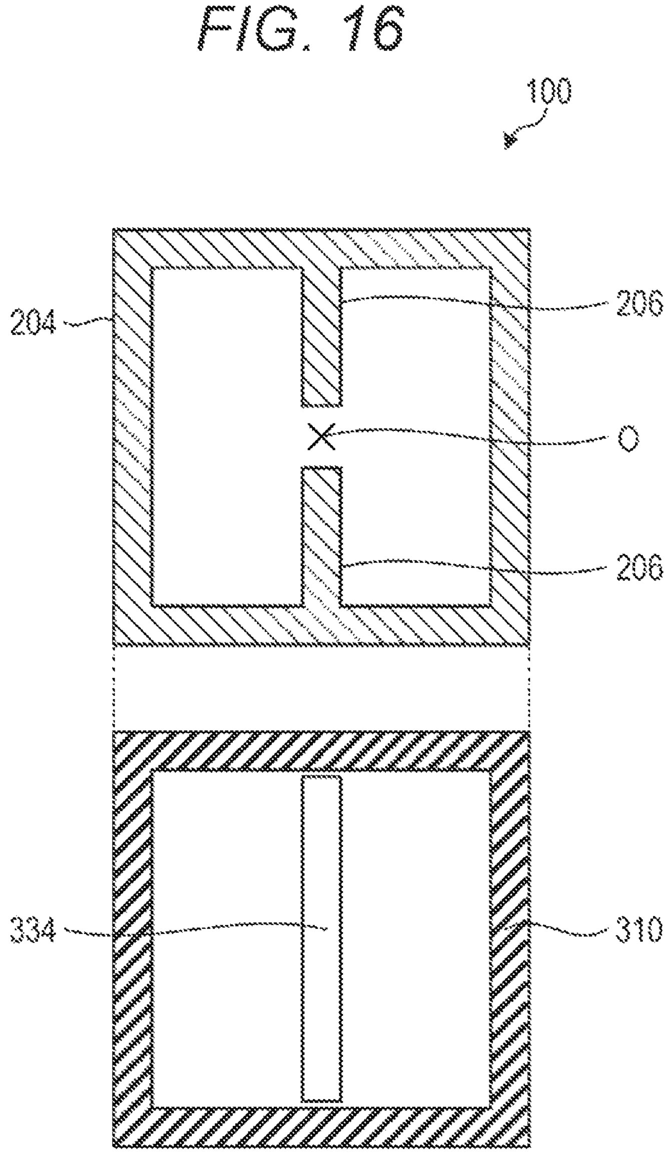
FIG. 16 is an explanatory diagram illustrating a configuration example of a light shielding portion 204 according to the seventh embodiment of the present disclosure.

Furthermore, in the present embodiment, the light shielding portion (light shielding film) 204 can be modified as follows. Therefore, a detailed configuration of the light shielding portion 204 will be described with reference to FIG. 16. FIG. 16 is an explanatory diagram illustrating a configuration example of the light shielding portion 204 according to the present embodiment. Note that, in FIG. 16, the view illustrated in the lower part corresponds to a cross-section obtained by cutting the imaging element 100 along line A-A' illustrated in FIG. 3, and the view illustrated in the upper part corresponds to a cross-section obtained by cutting the imaging element 100 along line B-B' illustrated in FIG. 3.

In the present embodiment and the modified example, for example, as illustrated in the upper part of FIG. 16, when the imaging element 100 is viewed from above the light receiving surface 10*a*, the light shielding portion (light shielding film) 204 may be provided on the element separation wall 310 along the element separation wall 310, and may have two protruding portions 206 protruding along the column direction toward the center O of the imaging element 100 and facing each other. Alternatively, in the present embodiment and the modified example, the light shielding portion 204 may be provided along the element separation wall 310 and may not have the protruding portion 206.

10. Eighth Embodiment

Figure 17:
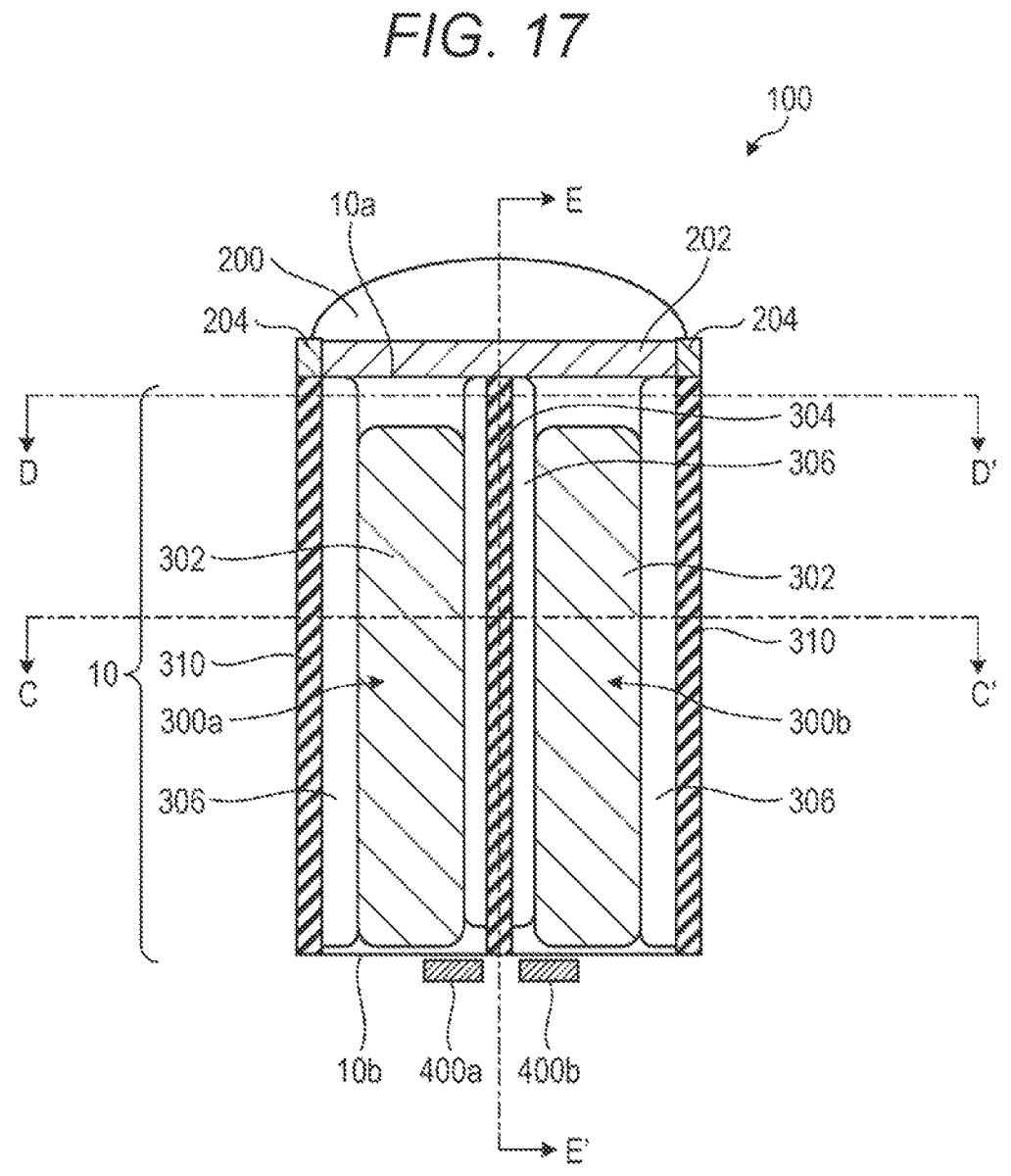
Figure 18:
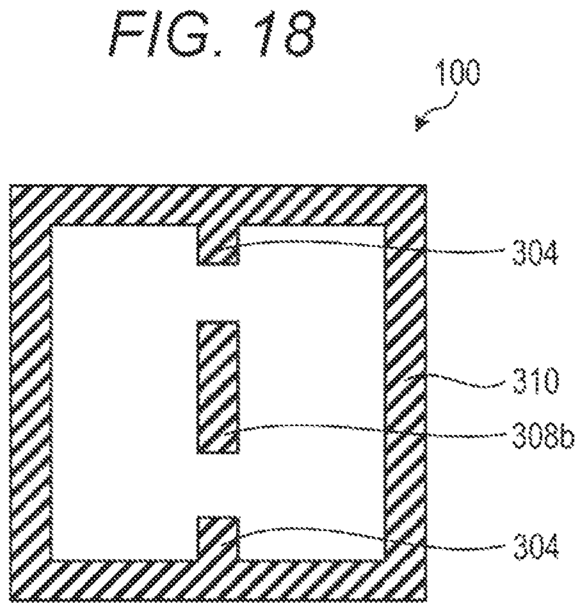
FIG. 18 is an explanatory diagram (part 1) illustrating a plane of the imaging element 100 according to the eighth embodiment of the present disclosure.
Figure 19:
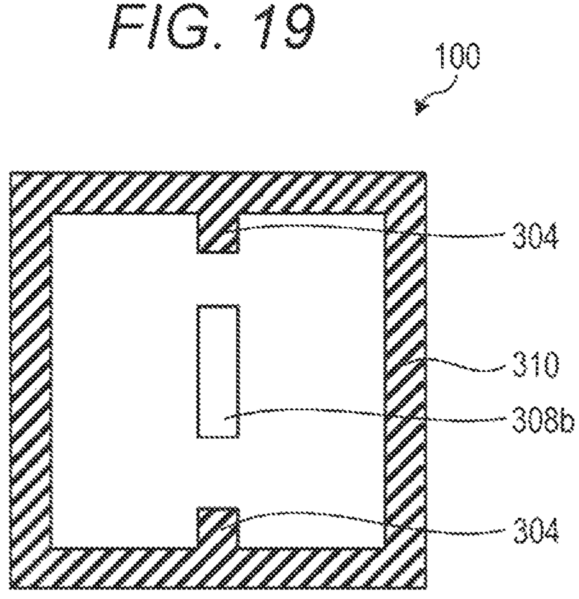
FIG. 19 is an explanatory diagram (part 2) illustrating a plane of the imaging element 100 according to the eighth embodiment of the present disclosure.
Figure 20:
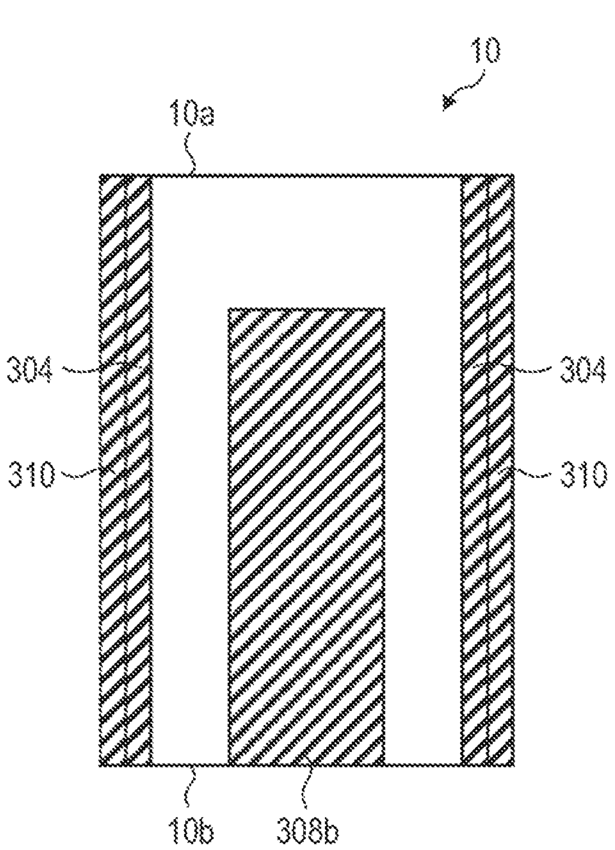
FIG. 20 is an explanatory diagram (part 2) illustrating a part of a cross-section of the imaging element 100 according to the eighth embodiment of the present disclosure.
Figure 21:
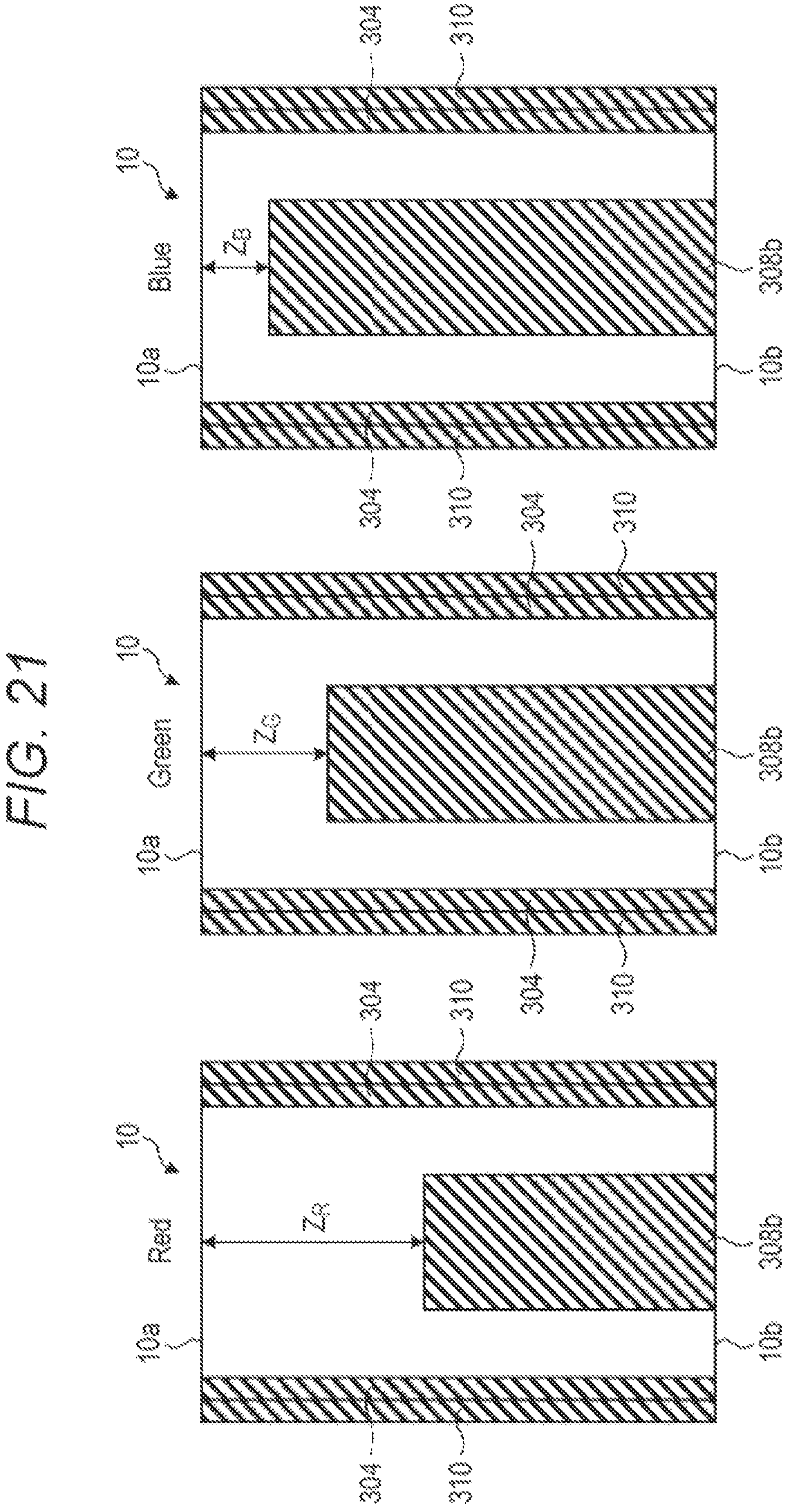
FIG. 21 is an explanatory diagram (part 3) illustrating a part of a cross-section of the imaging element 100 for each color according to the eighth embodiment of the present disclosure.

In the embodiment of the present disclosure, one additional wall 308*b* may be used as the front surface DTI. Hereinafter, such an embodiment will be described as an eighth embodiment of the present disclosure with reference to FIGS. 17 to 21. FIG. 17 is an explanatory diagram illustrating a part of a cross-section of the imaging element 100 according to the present embodiment, and specifically corresponds to a cross-section obtained by cutting the imaging element 100 along the thickness direction of the semiconductor substrate 10. FIG. 18 is an explanatory diagram illustrating a plane of the imaging element 100 according to the present embodiment, and specifically corresponds to a cross-section of the imaging element 100 taken along line C-C' illustrated in FIG. 17. FIG. 19 is an explanatory diagram illustrating a plane of the imaging element 100 according to the present embodiment, and specifically corresponds to a cross-section of the imaging element 100 taken along line D-D' illustrated in FIG. 17. FIG. 20 is an explanatory diagram illustrating a part of a cross-section of the imaging element 100 according to the present embodiment, and specifically corresponds to a cross-section obtained by cutting the semiconductor substrate 10 along line E-E' illustrated in FIG. 17. FIG. 21 is an explanatory diagram illustrating a part of a cross-section of the imaging element 100 for each color according to the present embodiment, and specifically corresponds to a cross-section obtained by cutting the semiconductor substrate 10 along the thickness direction of the semiconductor substrate 10.

As illustrated in FIGS. 17 to 20, in the present embodiment, one additional wall 308*b* is disposed between the two protruding portions 304 (slits 312), and the additional wall 308*b* is used as the front surface DTI. As illustrated in FIG. 20, the front surface DTI is formed by forming a trench extending from the front surface 10*b* side, which is the opposite surface of the light receiving surface 10*a* of the semiconductor substrate 10, to the middle of the semiconductor substrate 10 along the thickness direction of the semiconductor substrate 10 and embedding an oxide film or the like in the trench. The length of the additional wall 308*b* in the thickness direction of the semiconductor substrate 10 can be adjusted by adjusting the depth of the trench. In the case of the front surface DTI, a channel serving as the overflow path may be formed by introducing impurities into a region on the back surface 10*a* side of the additional wall 308*b* through which the additional wall 308*b* does not penetrate.

That is, the additional wall 308*b* is provided so as to extend from the front surface 10*b*, which is a surface of the semiconductor substrate 10 opposite to the light receiving surface 10*a*, to the middle of the semiconductor substrate 10 along the thickness direction (substrate thickness direction) of the semiconductor substrate 10. As a result, the length of the additional wall 308*b* in the substrate thickness direction becomes shorter than the lengths of the two protruding portions 304 in the substrate thickness direction. Therefore, since the end surface (surface on the light receiving surface 10*a* side) of the additional wall 308*b* is separated from the light receiving surface 10*a*, scattering of incident light near the light receiving surface 10*a* by the additional wall 308*b* can be suppressed. In addition, it is possible to reduce the volume of the additional wall 308*b* on the light receiving surface 10*a* side as compared with the case where the additional wall 308*b* is formed by the full trench, and it is possible to reliably suppress scattering of incident light near the light receiving surface 10*a* by the additional wall 308*b*.

Here, for example, in the examples of FIGS. 2 to 5, the incident light is scattered by the two protruding portions 304 arranged in the vicinity of the center of the imaging element 100 of the light receiving surface 10*a*, and this may cause color mixing deterioration, and sensitivity decrease suppression may be insufficient. In this case, although it is possible to suppress incident light scattering by lengthening the slits 312 of the two protruding portions 304, the effect of conformal doping using the two protruding portions 304 is reduced, and the saturation charge amount Qs is reduced. Therefore, as described above, by forming the additional wall 308*b* as the front surface DTI, the additional wall 308*b* is eliminated in the vicinity of the center of the imaging element 100 on the light receiving surface 10*a* side, and incident light scattering is suppressed. As a result, color mixing, a decrease in sensitivity, a decrease in saturation charge amount, and the like can be suppressed.

Furthermore, as illustrated in FIG. 21, in the present embodiment, the depth (trench depth) of the trench for forming the additional wall 308*b* may be adjusted according to the wavelength of incident light in each of the imaging elements 100 of RGB (Red, Green, Blue), that is, the photoelectric conversion depth. In the R pixel, since photoelectric conversion occurs in the deep part, the trench depth is set shallow. For example, the trench depth is a trench depth $Z_R$=3200 nm (50% of light having the wavelength of 700 nm is absorbed). In the B pixel, since photoelectric conversion occurs in the shallow part, the trench depth is set to be deep. For example, the trench depth is a trench depth $Z_R$=350 nm (50% of light having the wavelength of 450 nm is absorbed). In the G pixel, since photoelectric conversion occurs in the deep part with the Blue ratio and the shallow part with the Red ratio, the trench depth is set between the trench depth of the R pixel and the trench depth of the B pixel. For example, the trench depth is the trench depth $Z_G$=1000 nm (50% of light having the wavelength of 550 nm is absorbed).

As described above, the trench depth, that is, the length of the additional wall 308*a* in the substrate thickness direction may be determined according to the wavelength of the incident light incident on the light receiving surface 10*a*.

This can minimize scattering of incident light for each color. As a result, it is possible to suppress the incident light scattering according to the wavelength of the incident light. Thus, it is possible to reliably suppress color mixing, sensitivity reduction, saturation charge amount reduction, and the like.

Figure 22:
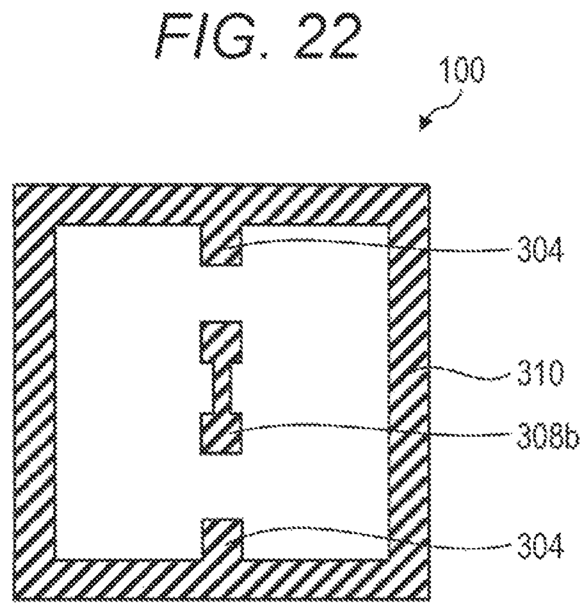
FIG. 22 is an explanatory diagram (part 3) illustrating a plane of the imaging element 100 according to the eighth embodiment of the present disclosure.
Figure 23:
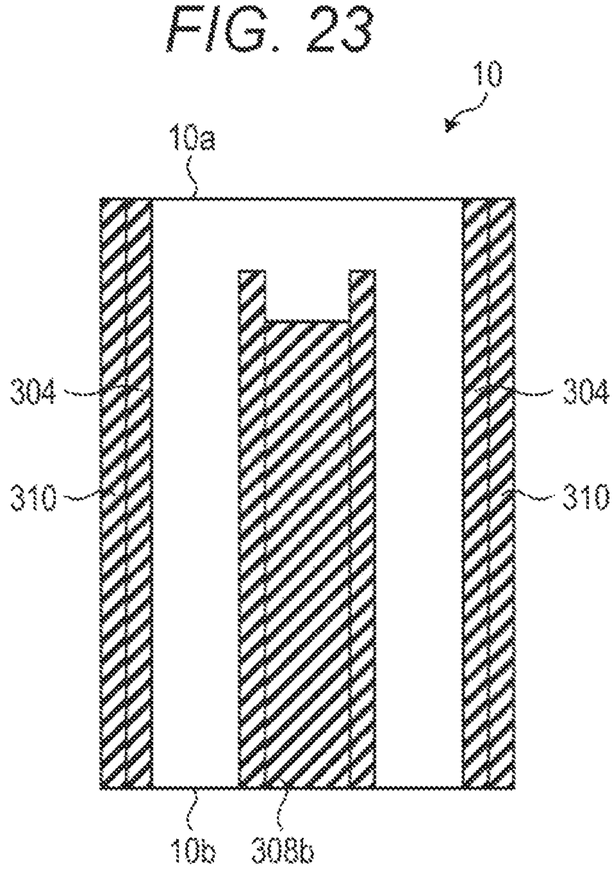
FIG. 23 is an explanatory diagram (part 4) illustrating a part of a cross-section of the imaging element 100 according to the eighth embodiment of the present disclosure.
Figure 24:
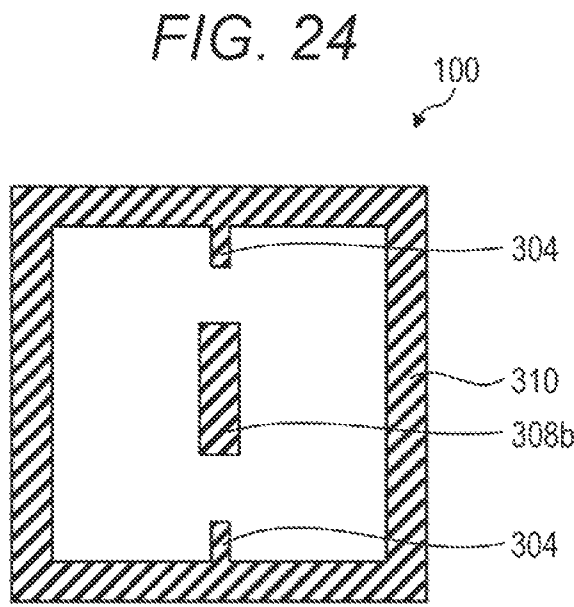
FIG. 24 is an explanatory diagram (part 4) illustrating a plane of the imaging element 100 according to the eighth embodiment of the present disclosure.
Figure 25:
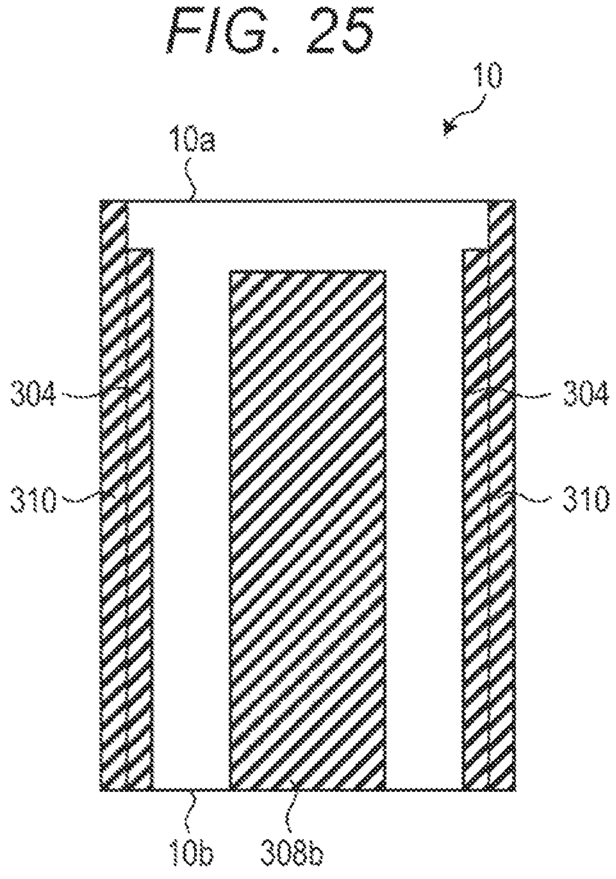
FIG. 25 is an explanatory diagram (part 5) illustrating a part of a cross-section of the imaging element 100 according to the eighth embodiment of the present disclosure.

Further, in the present embodiment, the additional wall 308*b* can be modified as follows. Therefore, a detailed configuration of the additional wall 308*b* will be described with reference to FIGS. 22 to 25. FIG. 22 is an explanatory diagram illustrating a plane of the imaging element 100 according to the present embodiment, and specifically corresponds to a cross-section of the imaging element 100 cut along a plane direction (direction orthogonal to the thickness direction of the semiconductor substrate 10). FIG. 23 is an explanatory diagram illustrating a part of a cross-section of the imaging element 100 for each color according to the present embodiment, and specifically corresponds to a cross-section obtained by cutting the semiconductor substrate 10 along the thickness direction of the semiconductor substrate 10. FIG. 24 is an explanatory diagram illustrating a plane of the imaging element 100 according to the present embodiment, and specifically corresponds to a cross-section of the imaging element 100 cut along a plane direction. FIG. 25 is an explanatory diagram illustrating a part of a cross-section of the imaging element 100 for each color according to the present embodiment, and specifically corresponds to a cross-section obtained by cutting the semiconductor substrate 10 along the thickness direction of the semiconductor substrate 10.

As illustrated in FIG. 22, in the present embodiment, when viewed from above the light receiving surface 10*a*, the width (for example, the length in the row direction) of the central portion of the additional wall 308*b* may be narrower than the width (for example, the length in the row direction) of both ends of the additional wall 308*b*. As illustrated in FIG. 23, the length in the substrate thickness direction of the central portion of the additional wall 308*b* may be shorter than the lengths in the substrate thickness direction of both ends of the additional wall 308*b*.

As described above, by reducing the line width of the central portion of the additional wall 308*b* with respect to both ends and reducing the depth of the trench for forming the central portion of the additional wall 308*b* to shorten the length of the central portion of the additional wall 308*b* in the substrate thickness direction, it is possible to separate the central portion of the additional wall 308*b* from the light receiving surface 10*a* while narrowing the end surface of the central portion of the additional wall 308*b*, and it is possible to reduce the volume of the additional wall 308*b* on the light receiving surface 10*a* side. Thus, scattering of the incident light near the light receiving surface 10*a* by the additional wall 308*b* can be reliably suppressed.

In the examples of FIGS. 22 and 23, the width of the central portion of the additional wall 308*b* is narrower than the both ends of the additional wall 308*b*, and the length in the thickness direction of the central portion of the semiconductor substrate 10 is shorter than the both ends of the additional wall 308*b*. However, the present invention is not limited thereto, and either one of the width and the length may be reduced. Further, the width of the additional wall 308*b* may be shorter than the width of the two protruding portions 304.

As illustrated in FIG. 24, in the present embodiment, when viewed from above the light receiving surface 10*a*, the width (for example, the length in the row direction) of each of the two protruding portions 304 may be narrower than the width (for example, the length in the row direction) of the additional wall 308*b*. In addition, as illustrated in FIG. 25, the two protruding portions 304 may be provided so as to extend from the front surface 10*b* of the semiconductor substrate 10 to the middle of the semiconductor substrate 10 along the thickness direction of the semiconductor substrate 10. At this time, the length of the additional wall 308*b* in the substrate thickness direction may be shorter than the length of each of the two protruding portions 304 in the substrate thickness direction.

As described above, in addition to shortening the length of the additional wall 308*b* in the substrate thickness direction, the line width of the two protruding portions 304 is narrowed, and further, the depth of the trench for forming the two protruding portions 304 is shallowed to shorten the length of each protruding portion 304 in the substrate thickness direction. Thus, the end surface of the additional wall 308*b* and the end surfaces of the two protruding portions 304 can be separated from the light receiving surface 10*a*, and the volume of the two protruding portions 304 can be reduced in addition to the volume of the additional wall 308*b* on the light receiving surface 10*a* side. Therefore, scattering of incident light near the light receiving surface 10*a* by the additional wall 308*b* and the two protruding portions 304 can be reliably suppressed.

In the examples of FIGS. 24 and 25, the width of each of the two protruding portions 304 is narrower than the width of the additional wall 308*b*, but the present invention is not limited thereto. For example, the width of one of the two protruding portions 304 may be narrower than the width of the additional wall 308*b*.

Here, a part of the manufacturing process (manufacturing method) of the imaging element 100 will be described with reference to FIG. 26. FIG. 26 is a process cross-sectional view for explaining a part of the manufacturing process of the imaging element 100 according to the present embodiment, and specifically corresponds to a cross-section obtained by cutting the semiconductor substrate 10 along the thickness direction of the semiconductor substrate 10.

As illustrated in FIG. 26, in the present embodiment, a mask M1 such as a photomask is formed on the front surface 10*b* of the semiconductor substrate 10 (see the first diagram from the left in FIG. 26). The mask M1 is formed, for example, by stacking a photoresist layer on the front surface 10*b* of the semiconductor substrate 10 by a spin coating method or the like and patterning the photoresist layer in accordance with a trench formation pattern. Next, a mask M2 functioning as a protective layer is formed on the mask M1, and a part of the trench T1 for forming the element separation wall 310 is formed by etching such as dry etching (see the second diagram from the left in FIG. 26). Thereafter, the mask M2 is removed (see the third diagram from the left in FIG. 26), and etching is further executed to form the trench T1 for forming the element separation wall 310 and the trench T2 for forming the additional wall 308*b* (see the fourth diagram from the left in FIG. 26). In a subsequent process, conformal doping or the like is performed, and a material such as an oxide film is embedded in the trench T1 and the trench T2, and the element separation wall 310 and the additional wall 308*b* are formed. Thereafter, the mask M1 is also removed, and the imaging element 100 having the final structure is formed through a post-process.

As described above, according to the present embodiment (including modified examples), it is possible to obtain effects according to other embodiments (including modified examples). That is, deterioration of the captured image can be avoided while improving the accuracy of the phase difference detection. In addition, since the end surface (surface on the light receiving surface 10*a* side) of the additional wall 308*b* is separated from the light receiving surface 10*a*, and the volume of the additional wall 308*b* can be further reduced on the light receiving surface 10*a* side, scattering of incident light near the light receiving surface 10*a* by the additional wall 308*b* or the protruding portion 304 can be suppressed.

11. Ninth Embodiment

Figure 27:
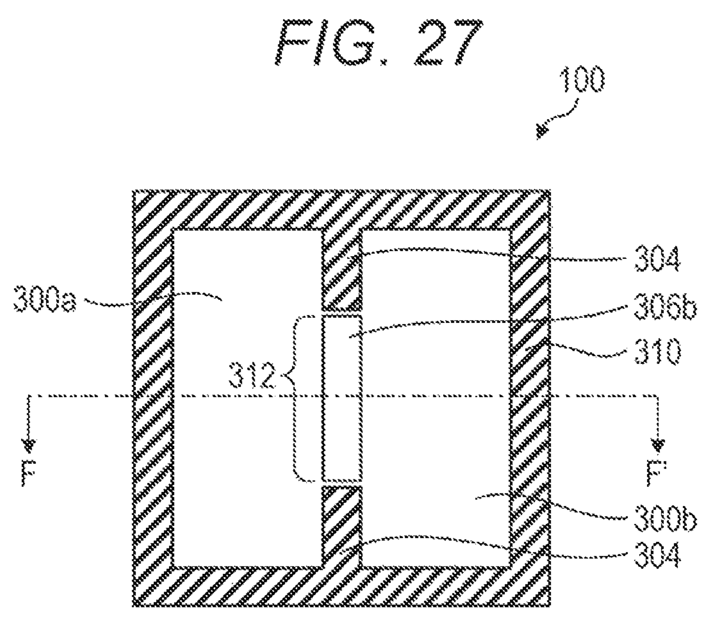
FIG. 27 is an explanatory diagram illustrating a plane of an imaging element 100 according to a ninth embodiment of the present disclosure.
Figure 28:
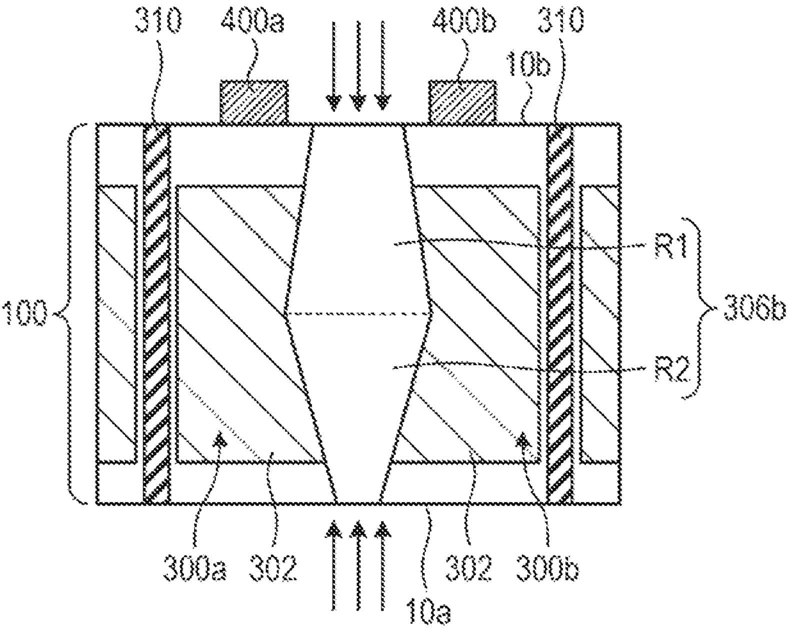
FIG. 28 is an explanatory diagram (part 1) illustrating a part of a cross-section of the imaging element 100 according to the ninth embodiment of the present disclosure.
Figures 29, 30:
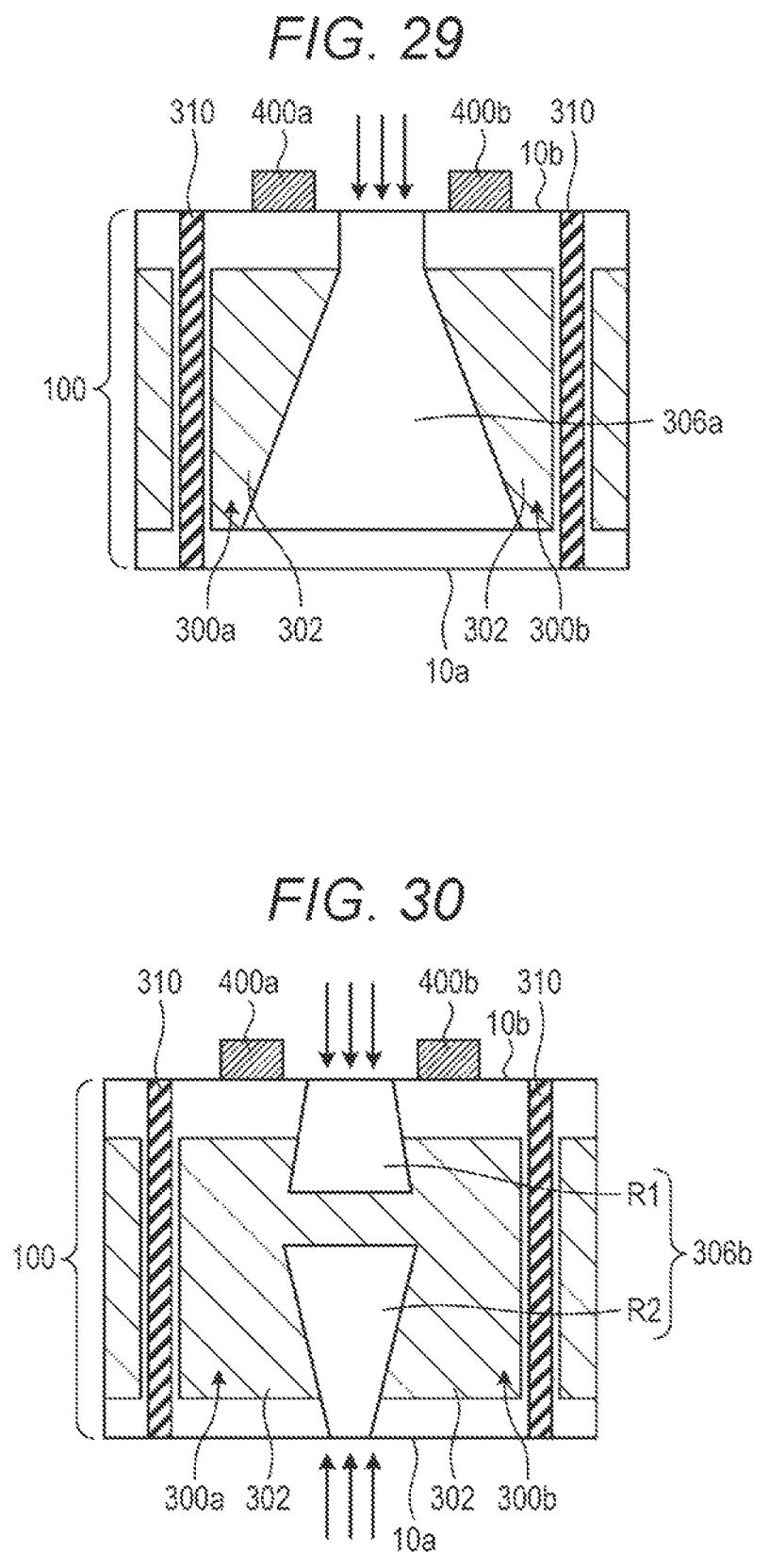

In the embodiment of the present disclosure, a diffusion region 306*b* (an example of a first diffusion region) formed by introducing impurities by ion implantation may be provided between the two protruding portions 304 (slits 312). Hereinafter, such an embodiment will be described as a ninth embodiment of the present disclosure with reference to FIGS. 27 to 29. FIG. 27 is an explanatory diagram illustrating a plane of the imaging element 100 according to the present embodiment, and specifically corresponds to a cross-section of the imaging element 100 cut along a plane direction. FIG. 28 is an explanatory diagram illustrating a part of a cross-section of the imaging element 100 according to the present embodiment, and specifically corresponds to a cross-section obtained by cutting the semiconductor substrate 10 along the thickness direction of the semiconductor substrate 10. FIG. 29 is an explanatory diagram illustrating a part of a cross-section of the imaging element 100 of the comparative example according to the present embodiment, and specifically corresponds to a cross-section obtained by cutting the semiconductor substrate 10 along the thickness direction of the semiconductor substrate 10.

As illustrated in FIG. 28, in the present embodiment, ion implantation is performed from both the front surface 10*b* and the back surface 10*a* of the semiconductor substrate 10. As a result, the diffusion region 306*b* is formed in a shape that expands from the front surface 10*b* of the semiconductor substrate 10 toward the inside of the semiconductor substrate 10 and narrows from the inside of the semiconductor substrate 10 toward the back surface 10*a* of the semiconductor substrate 10. That is, the diffusion region 306*b* has a first region R1 that extends from the front surface 10*b* of the semiconductor substrate 10 toward the inside of the semiconductor substrate 10, and a second region R2 that narrows from the inside of the semiconductor substrate 10 toward the back surface 10*a* of the semiconductor substrate 10. The first region R1 and the second region R2 are connected.

In the example of FIG. 28, the central axis of the first region R1 and the central axis of the second region R2 are positioned so as to coincide with each other without being shifted, but the present invention is not limited thereto. For example, the central axis of the first region R1 and the central axis of the second region R2 may be positioned so as to be shifted in the left-right direction (as an example, a row direction). The same applies to the following configurations illustrated in FIGS. 30 to 35.

Here, as illustrated in FIG. 29, when ion implantation is performed only from the front surface 10*b* of the semiconductor substrate 10, diffusion greatly spreads in the thickness direction of the semiconductor substrate 10, and a diffusion region 306*a* that continues to spread from the front surface 10*b* to the back surface 10*a* of the semiconductor substrate 10 is formed. Therefore, the photoelectric conversion region becomes narrow. Therefore, as illustrated in FIG. 28, ion implantation is performed from both the front surface 10*b* and the back surface 10*a* of the semiconductor substrate 10. As a result, the diffusion region 306*b* is formed in a shape that expands from the front surface 10*b* of the semiconductor substrate 10 toward the inside of the semiconductor substrate 10 and narrows from the inside of the semiconductor substrate 10 toward the back surface 10*a* of the semiconductor substrate 10. As a result, since the diffusion region 306*b* (see FIG. 28) is narrower than the diffusion region 306*a* (see FIG. 29), the photoelectric conversion region can be widened.

Furthermore, in the present embodiment, the diffusion region 306*b* can be modified as follows. Therefore, a detailed configuration of the diffusion region 306*b* will be described with reference to FIGS. 30 to 35. FIGS. 30 to 35 are explanatory diagrams illustrating a part of a cross-section of the imaging element 100 according to the present embodiment, and specifically correspond to a cross-section obtained by cutting the semiconductor substrate 10 along the thickness direction of the semiconductor substrate 10.

As illustrated in FIG. 30, in the present embodiment, the diffusion region 306*b* may be formed such that the first region R1 and the second region R2 are separated without being connected. Even in the diffusion region 306*b* having such a shape, the spread of the diffusion region 306*b* can be suppressed, and the photoelectric conversion region can be widened.

Figures 31, 32:
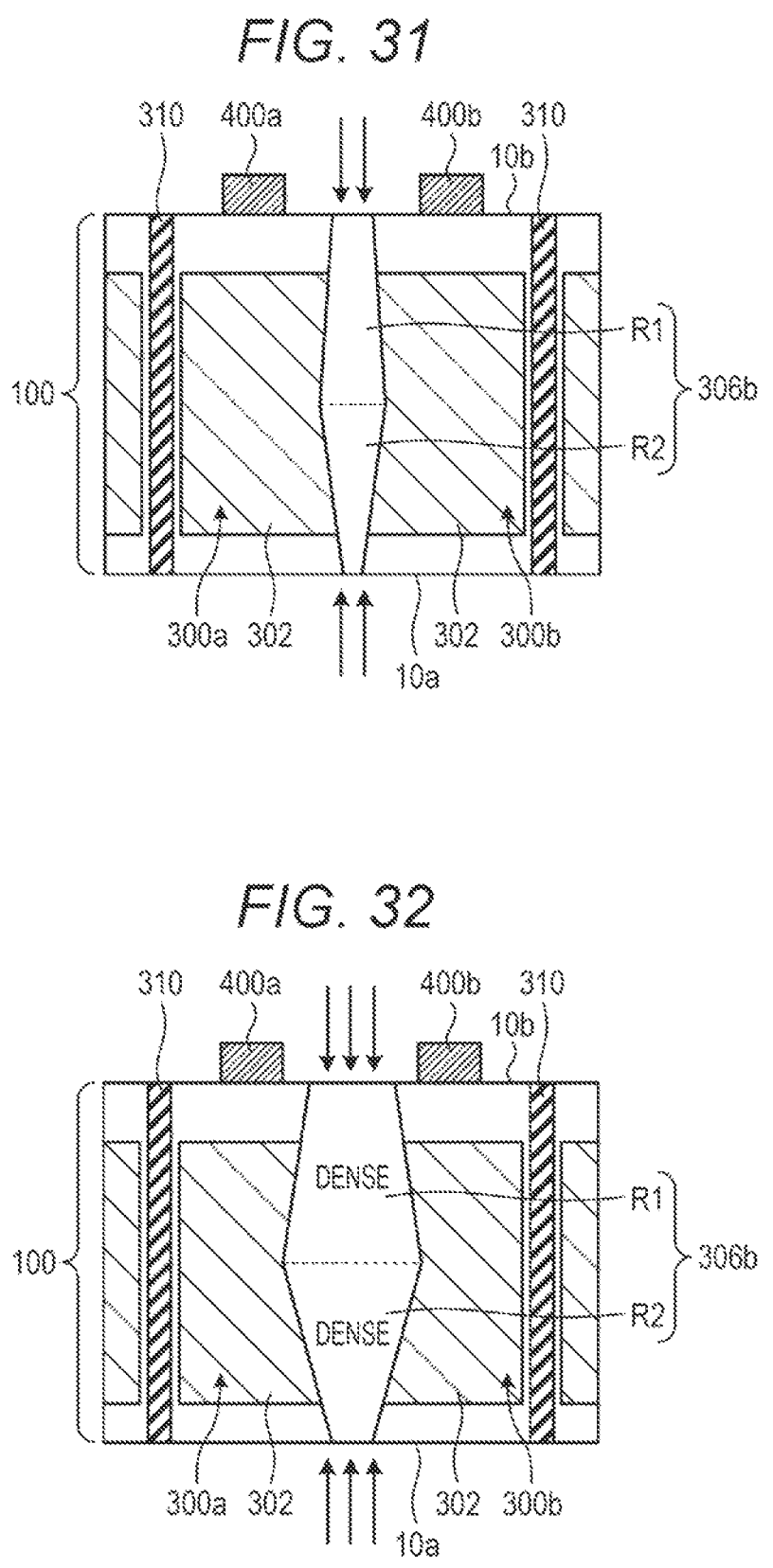

As illustrated in FIG. 31, in the present embodiment, the diffusion region 306*b* may be formed such that the first region R1 and the second region R2 are thinner than the first region R1 and the second region R2 illustrated in FIG. 28. The first region R1 and the second region R2 are connected. In the diffusion region 306*b* having such a shape, the spread of the diffusion region 306*b* can be further suppressed as compared with the first region R1 and the second region R2 illustrated in FIG. 28, and the photoelectric conversion region can be reliably widened.

As illustrated in FIG. 32, in the present embodiment, the diffusion region 306*b* may be formed such that the impurity concentration in the first region R1 and the second region R2 is higher than that in the first region R1 and the second region R2 illustrated in FIG. 28. The first region R1 and the second region R2 are connected. According to such a diffusion region 306*b*, potential adjustment (potential design) can be easily performed by changing the impurity concentrations of the first region R1 and the second region R2.

Figures 33, 34:
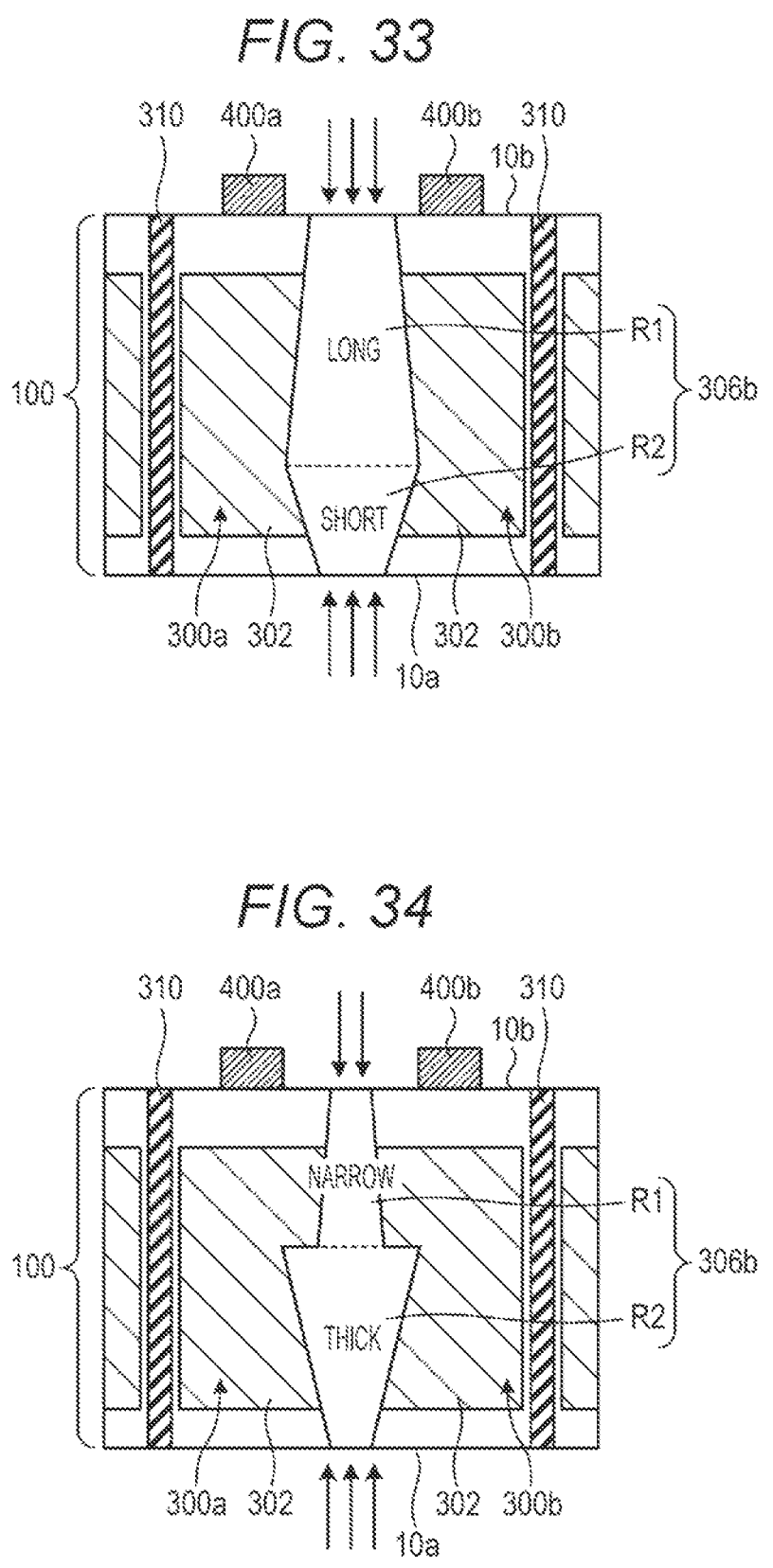

As illustrated in FIG. 33, in the present embodiment, the diffusion region 306*b* may be formed so that the length (depth) of the first region R1 in the substrate thickness direction is longer than the length (depth) of the second region R2 in the substrate thickness direction. The first region R1 and the second region R2 are connected. According to such a diffusion region 306*b*, potential adjustment (potential design) can be easily performed by changing the length in the substrate thickness direction of each of the first region R1 and the second region R2. Note that the diffusion region 306*b* may be formed such that the lengths in the substrate thickness direction of the first region R1 and the second region R2 are different from each other. Moreover, for example, the diffusion region 306*b* may be formed such that the length in the substrate thickness direction of the second region R2 is longer than the length in the substrate thickness direction of the first region R1 contrary to the above description.

Furthermore, as illustrated in FIG. 34, in the present embodiment, the diffusion region 306*b* may be formed such that the first region R1 is thinner than the second region R2. That is, the length of the first region R1 in the direction orthogonal to the substrate thickness direction is shorter than the length of the first region R1 in the direction orthogonal to the substrate thickness direction. The first region R1 and the second region R2 are connected. According to such a diffusion region 306*b*, potential adjustment (potential design) can be easily performed by changing the thickness of each of the first region R1 and the second region R2. Note that the diffusion region 306*b* may be formed such that the thicknesses of the first region R1 and the second region R2 are different from each other. Moreover, for example, the second region R2 may be formed to be thinner than the first region R1 contrary to the above.

Figure 35:
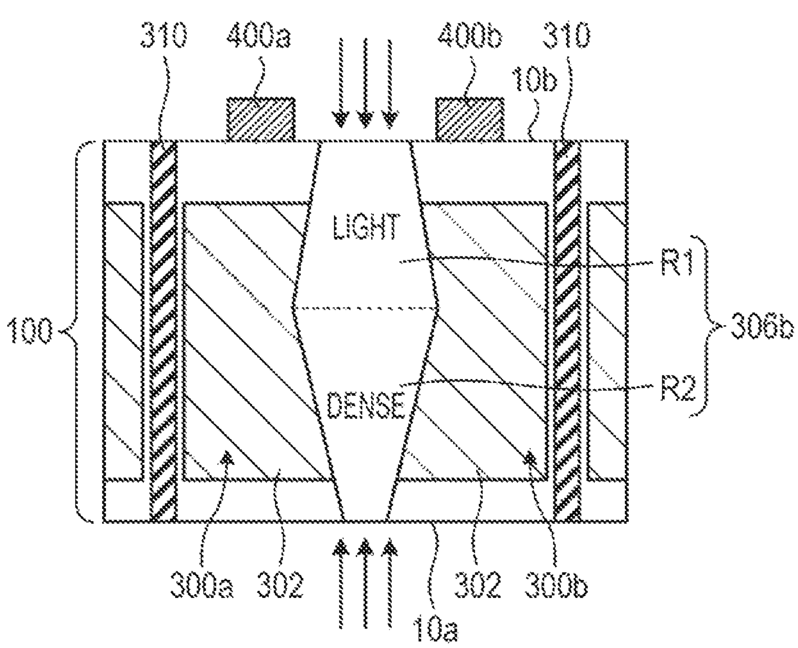
FIG. 35 is an explanatory diagram (part 7) illustrating a part of a cross-section of the imaging element 100 according to the ninth embodiment of the present disclosure.

As illustrated in FIG. 35, in the present embodiment, the diffusion region 306*b* may be formed such that the impurity concentration of the first region R1 is lower than the impurity concentration of the second region R2. The first region R1 and the second region R2 are connected. According to such a diffusion region 306*b*, potential adjustment (potential design) can be easily performed by changing the impurity concentration of each of the first region R1 and the second region R2. Note that the diffusion region 306*b* may be formed such that the impurity concentration of each of the first region R1 and the second region R2 is different. Moreover, for example, the diffusion region 306*b* may be formed such that the impurity concentration of the second region R2 is lower than the impurity concentration of the first region R1 contrary to the above description.

Ion implantation is performed to form the diffusion regions 306*b* having various shapes as illustrated in FIGS. 28 and 30 to 35. At the time of ion implantation, various conditions such as power, implantation time, processing temperature, and electric field are adjusted. By appropriately adjusting these various conditions, it is possible to obtain the diffusion regions 306*b* having various shapes as illustrated in FIGS. 28 and 30 to 35.

Figure 36:
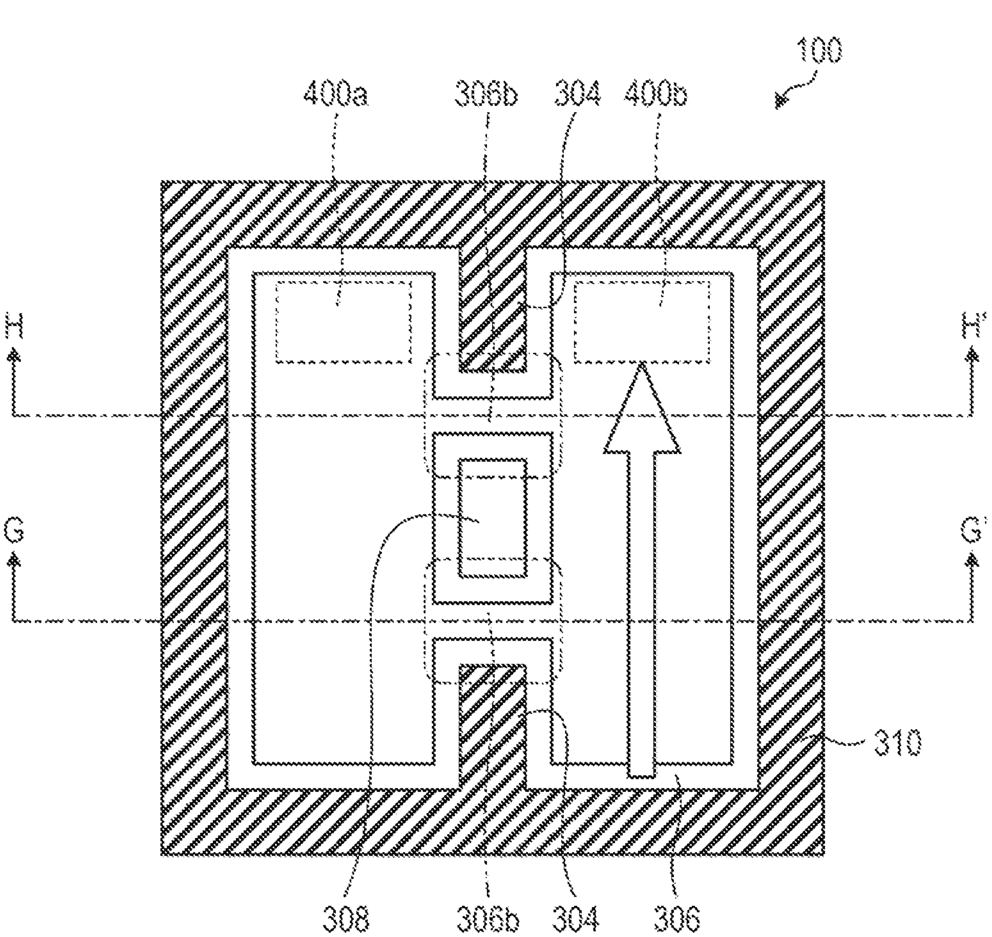
FIG. 36 is an explanatory diagram (part 2) illustrating a plane of the imaging element 100 according to the ninth embodiment of the present disclosure.

As illustrated in FIG. 36, in the present embodiment, one additional wall 308 may be provided between the two protruding portions 304 (slits 312). In this case, the diffusion region 306*b* is provided between each of the two protruding portions 304 and one additional wall 308 (two regions). Furthermore, a cross-section of the imaging element 100 taken along line G-G' illustrated in FIG. 36 is the same as the cross-section illustrated in FIG. 28, and a cross-section of the imaging element 100 taken along line H-H' illustrated in FIG. 36 is the same as the cross-section illustrated in FIG. 34. In such a configuration, for example, a potential gradient (see a white arrow in FIG. 36) can be formed. As a result, the electric charge can easily roll (move) toward the transfer gates 400*a* and 400*b*. That is, potential adjustment (potential design) such as forming a potential gradient can be easily performed by a combination of various shapes of the first region R1 and the second region R2 constituting the diffusion region 306*b*, a combination of impurity concentrations, or the like.

Figure 37:
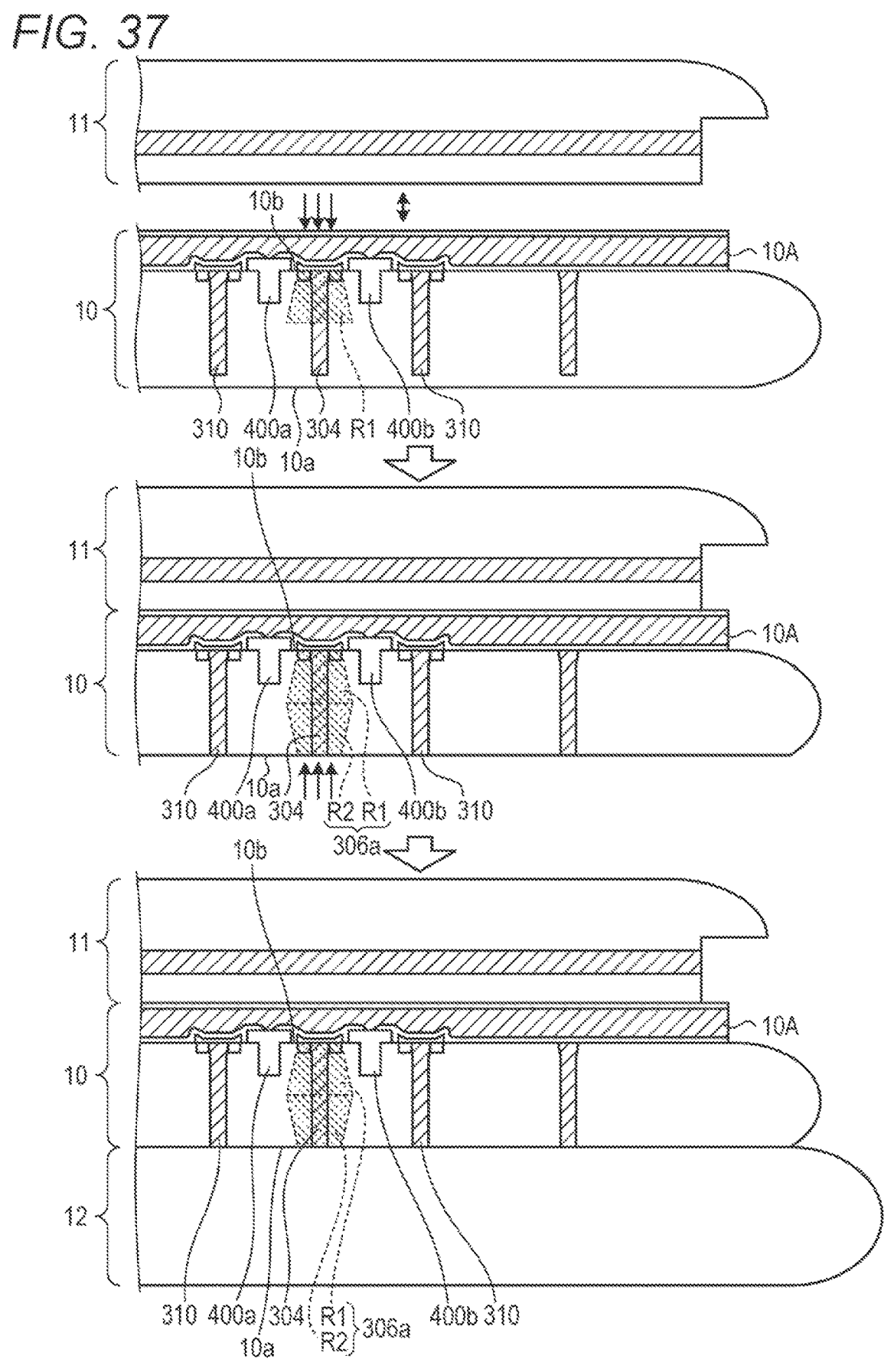
Figure 38:
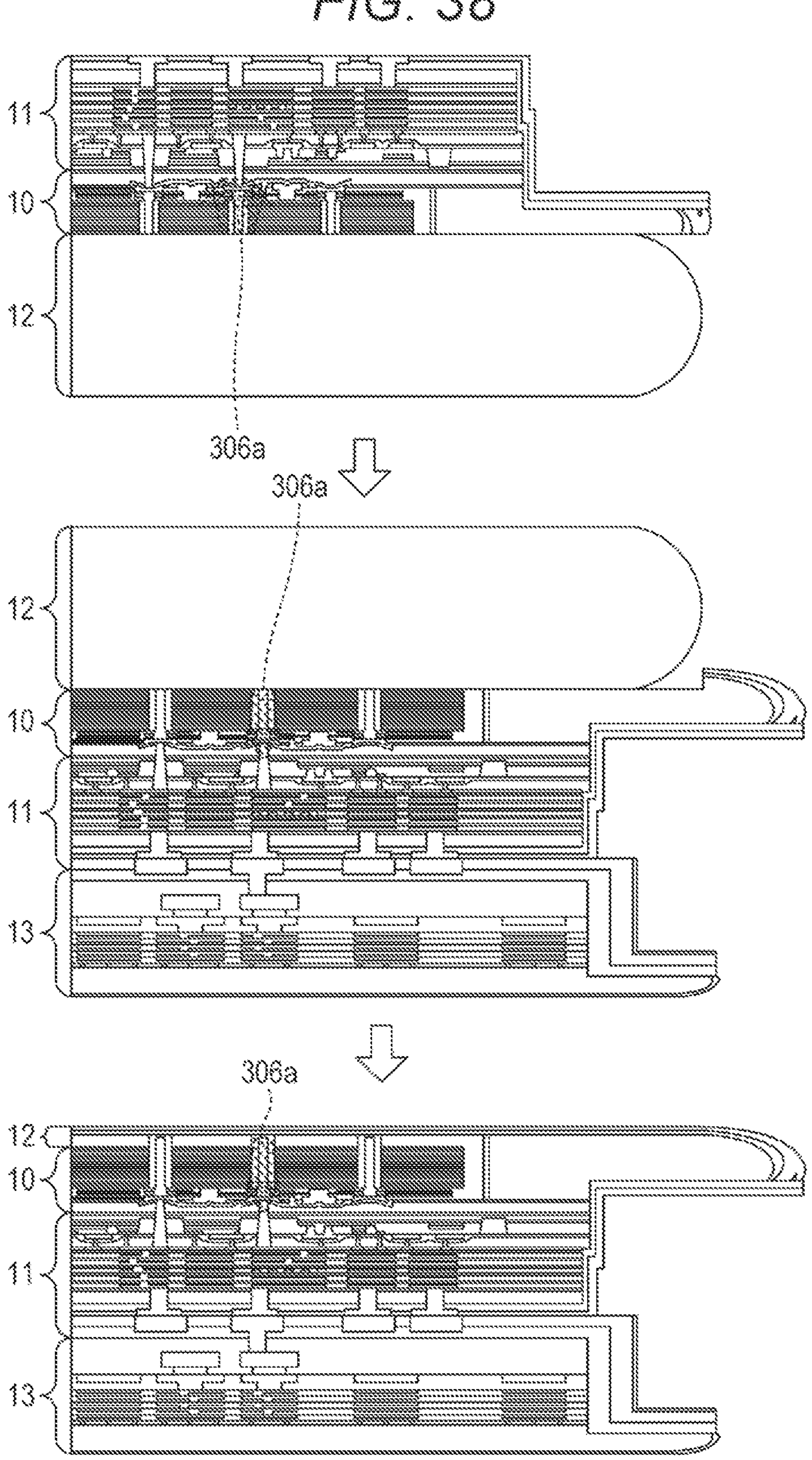
FIG. 38 is a process cross-sectional view (part 2) for explaining a part of the manufacturing process of the imaging device 1 according to the ninth embodiment of the present disclosure.

Here, a part of the manufacturing process (manufacturing method) of the imaging device 1 will be described with reference to FIGS. 37 and 38. FIGS. 37 and 38 are process cross-sectional views for explaining a part of the manufacturing process of the imaging device 1 according to the present embodiment. Note that, in FIGS. 37 and 38, for the sake of clarity, only a main part of the imaging device 1 related to the present embodiment is illustrated, and illustration of other parts is omitted.

As illustrated in the upper part of FIG. 37, in the present embodiment, for example, ion implantation is performed on the first semiconductor substrate 10 on which a photodiode, a floating diffusion (both are not illustrated), transfer gates 400*a* and 400*b*, an element separation wall 310, a protruding portion 304, and the like are formed. At this time, in the example of FIG. 37, ion implantation is performed from the front surface 10*b* of the first semiconductor substrate 10. Thereafter, the first semiconductor substrate 10 and the second semiconductor substrate 11 are bonded via an interlayer insulating film 10A. Thereafter, chemical mechanical polishing (CMP), a grinder, or the like is used for the first semiconductor substrate 10, and thinning is performed from the back surface 10*a* of the first semiconductor substrate 10 as illustrated in the middle part of FIG. 37. Thereafter, for example, activation annealing or the like is executed, and then ion implantation is executed again on the first semiconductor substrate 10. At this time, in the example of FIG. 37, ion implantation is performed from the back surface 10*a* of the first semiconductor substrate 10. Thereafter, as illustrated in the lower part of FIG. 37, the support substrate 12 is bonded to the first semiconductor substrate 10, and for example, activation annealing is executed.

Next, as illustrated in the upper part of FIG. 38, for example, various transistors, signal lines (for example, the pixel drive wiring 26, the horizontal signal line 28, and the like), and the like are formed on the second semiconductor substrate 11. Then, as illustrated in the middle part of FIG. 38, a logic substrate 13 is bonded to the second semiconductor substrate 11. The logic substrate 13 includes, for example, a plurality of circuits such as various circuit units 21 to 25. Thereafter, CMP, a grinder, or the like is used for the support substrate 12, and thinning is performed as illustrated in the lower part of FIG. 38.

As described above, according to the present embodiment (including modified examples), it is possible to obtain effects according to other embodiments (including modified examples). That is, deterioration of the captured image can be avoided while improving the accuracy of the phase difference detection. Furthermore, the diffusion region 306*b* is formed in a shape that expands from the front surface 10*b* of the semiconductor substrate 10 toward the inside of the semiconductor substrate 10 and narrows from the inside of the semiconductor substrate 10 toward the back surface 10*a* of the semiconductor substrate 10. As a result, since the diffusion region 306*b* (see FIG. 28) is narrower than the diffusion region 306*a* (see FIG. 29), the photoelectric conversion region can be widened.

12. Tenth Embodiment

Figure 39:
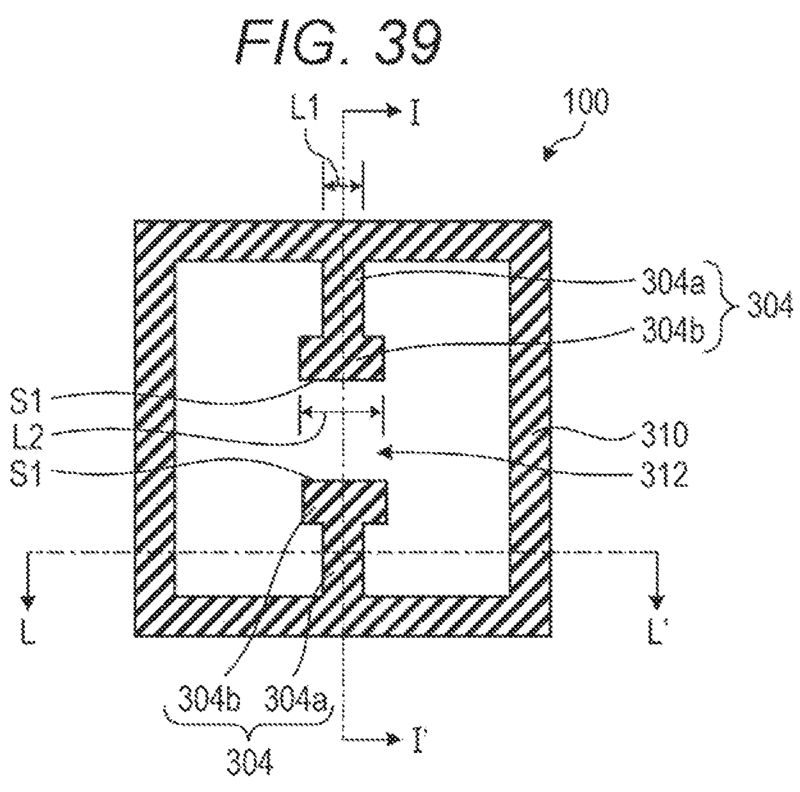
FIG. 39 is an explanatory diagram (part 1) illustrating a plane of an imaging element 100 according to a tenth embodiment of the present disclosure.
Figure 40:
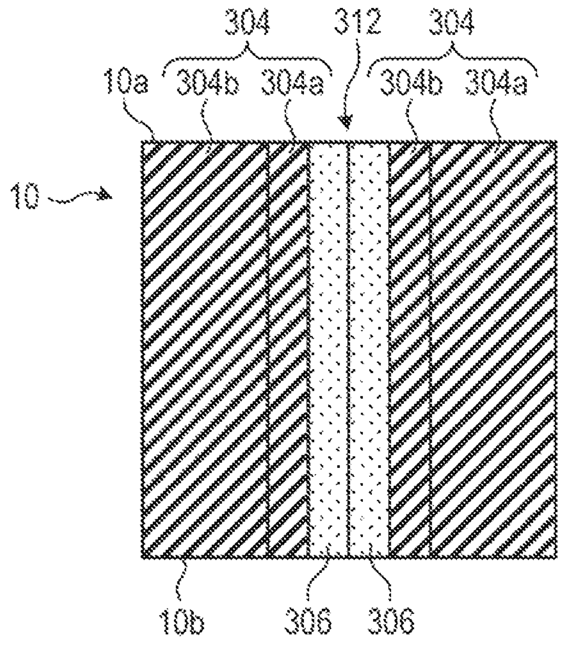
FIG. 40 is an explanatory diagram illustrating a part of a cross-section of the imaging element 100 according to the tenth embodiment of the present disclosure.
Figure 41:
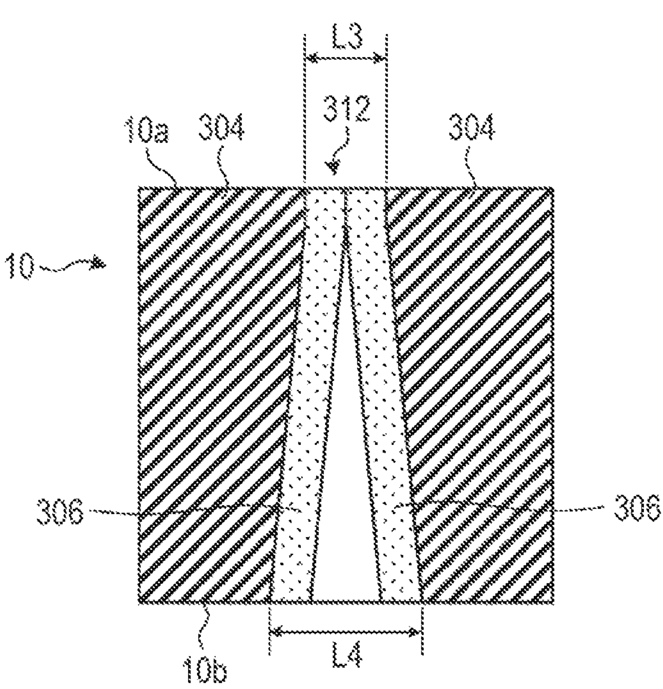
FIG. 41 is an explanatory diagram illustrating a part of a cross-section of an imaging element 100 according to a comparative example of a tenth embodiment of the present disclosure.

Further, in the embodiment of the present disclosure, the protruding portion 304 may be configured by an extension portion 304*a* and a projection portion 304*b*. Hereinafter, such an embodiment will be described as a tenth embodiment of the present disclosure with reference to FIGS. 39 to 41. FIG. 39 is an explanatory diagram illustrating a plane of the imaging element 100 according to the present embodiment, and specifically corresponds to a cross-section of the imaging element 100 cut along a plane direction. FIG. 40 is an explanatory diagram illustrating a part of a cross-section of the imaging element 100 according to the present embodiment, and specifically corresponds to a cross-section obtained by cutting the semiconductor substrate 10 along line I-I' illustrated in FIG. 39. FIG. 41 is an explanatory diagram illustrating a part of a cross-section of the imaging element 100 according to the comparative example of the present embodiment, and specifically corresponds to a cross-section obtained by cutting the semiconductor substrate 10 along the thickness direction of the semiconductor substrate 10.

As illustrated in FIG. 39, in the present embodiment, the two protruding portions 304 each have an extension portion 304*a* and a projection portion 304*b*. The extension portion 304*a* is connected to the element separation wall 310 and extends in the column direction from the element separation wall 310. The projection portion 304*b* is provided at an end of the extension portion 304*a* and extends in the row direction. When viewed from above the light receiving surface 10*a*, the shape of the extension portion 304*a* and the shape of the projection portion 304*b* are rectangular, and in the example of FIG. 39, the protruding portion 304 is T-shaped. Each projection portion 304*b* has opposing surfaces S1 facing each other. When viewed from above the light receiving surface 10*a*, an individual width (for example, a length in the row direction) of each opposing surface S1 is wider than an individual line width (for example, a length in the row direction) of each extension portion 304*a*.

According to such a configuration, as illustrated in FIG. 40, a diffusion layer (doping layer), that is, the diffusion region 306 is formed only by conformal doping on the wall surface of the element separation wall 310, and the slit 312 is filled with the diffusion region 306. This is because the two protruding portions 304 forming the slit 312 are formed straight so as to be orthogonal to the light receiving surface 10*a*. That is, this is because the shape of the slit 312 is not a tapered shape but a linear shape.

For example, as illustrated in FIG. 41, the processed shape of the full trench may be tapered due to the influence of the micro-loading effect at the time of etching. In this case, the region of the slit 312 is not completely filled with the diffusion region 306 only by the conformal doping, and sufficient potential separation may not be performed. As a countermeasure, it is desirable to perform ion implantation into the slit 312, but this leads to an increase in manufacturing processes. In general, the etching rate can be improved in the case of forming a trench (sparse) having a wide line width as compared with the case of forming a trench (dense) having a narrow line width. Therefore, by providing the projection portion 304*b* in the extension portion 304*a* to constitute the protruding portion 304, the etching rate can be increased as compared with the case where the protruding portion 304 is constituted only by the extension portion 304*a*, and the shape of the slit 312 can be made not a tapered shape but a linear shape. As a result, ion implantation can be omitted, and an increase in the number of manufacturing steps can be suppressed. Furthermore, since the perpendicularity of the slit 312 (perpendicularity of the trench) is improved, the saturation charge amount Qs can be improved as compared with a case where ion implantation is essential, color mixing and the quantum efficiency Qe can be improved, and crystal defect damage can be reduced to improve white spots.

Figure 42:
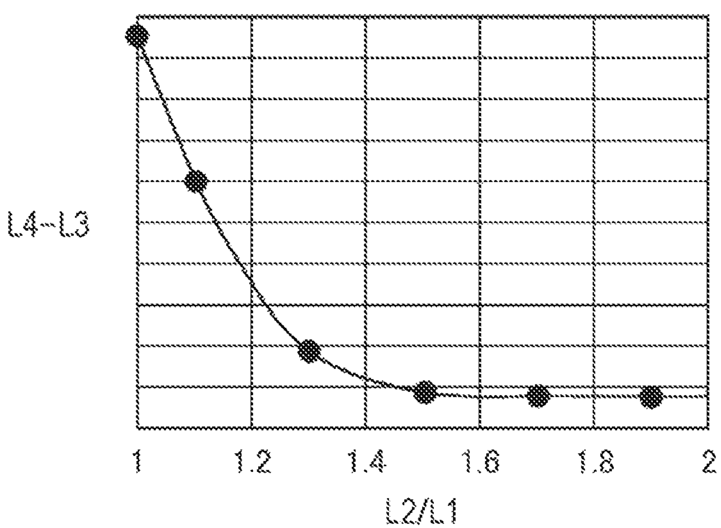
FIG. 42 is a graph illustrating a relationship between a slit width and a protruding portion width according to a tenth embodiment of the present disclosure.

Here, FIG. 42 is a graph illustrating a relationship between the width of the slit 312 and the width of the protruding portion 304 according to the present embodiment. When the line width (the length in the row direction) of the extension portion 304*a* is L1, the width (the length in the row direction) of the projection portion 304*b* is L2 as illustrated in FIG. 39, the width (the length in the column direction) of the slit 312 on the back surface 10*a* side of the semiconductor substrate 10 is L3 as illustrated in FIG. 41, and the width (the length in the column direction) of the slit 312 on the front surface 10*b* side of the semiconductor substrate 10 is L4, a graph showing the relationship between "L2/L1 (ratio)" and "L4-L3 (difference)" is obtained as illustrated in FIG. 42. From this graph, by making the width L2 of the projection portion 304*b* 1.2 times or more the line width L1 of the extension portion 304*a*, the slit 312 is made perpendicular, and a sufficient effect can be obtained at a practical level. In the case of obtaining further perpendicularity, it is desirable that the width L2 of the projection portion 304*b* be 1.4 times or more the line width L1 of the extension portion 304*a*.

Note that it is also possible to move the formation position of the slit 312 in the column direction. In this case, the length (for example, the length in the column direction) of the extension portion 304*a* is adjusted. Such movement of the formation position of the slit 312 is also possible in the following configurations of FIGS. 45 to 50. By moving the formation position of the slit 312 and taking the blooming path region to the end instead of the center, for example, the transfer gates 400*a* and 400*b* and the floating diffusion region can be separated from the blooming path region, and the margin for transfer, white spots, and the like can be improved.

Figure 43:
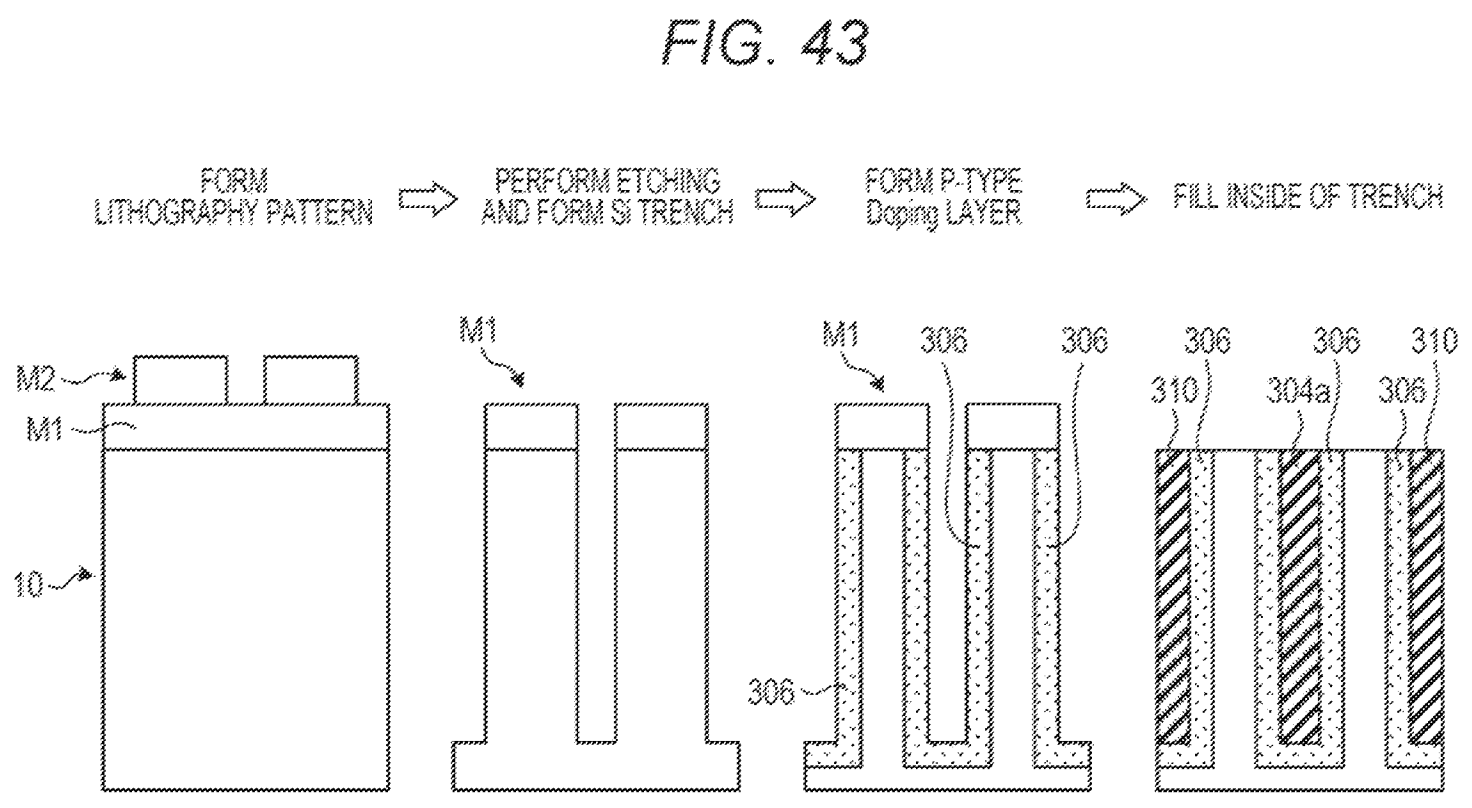
Figure 44:
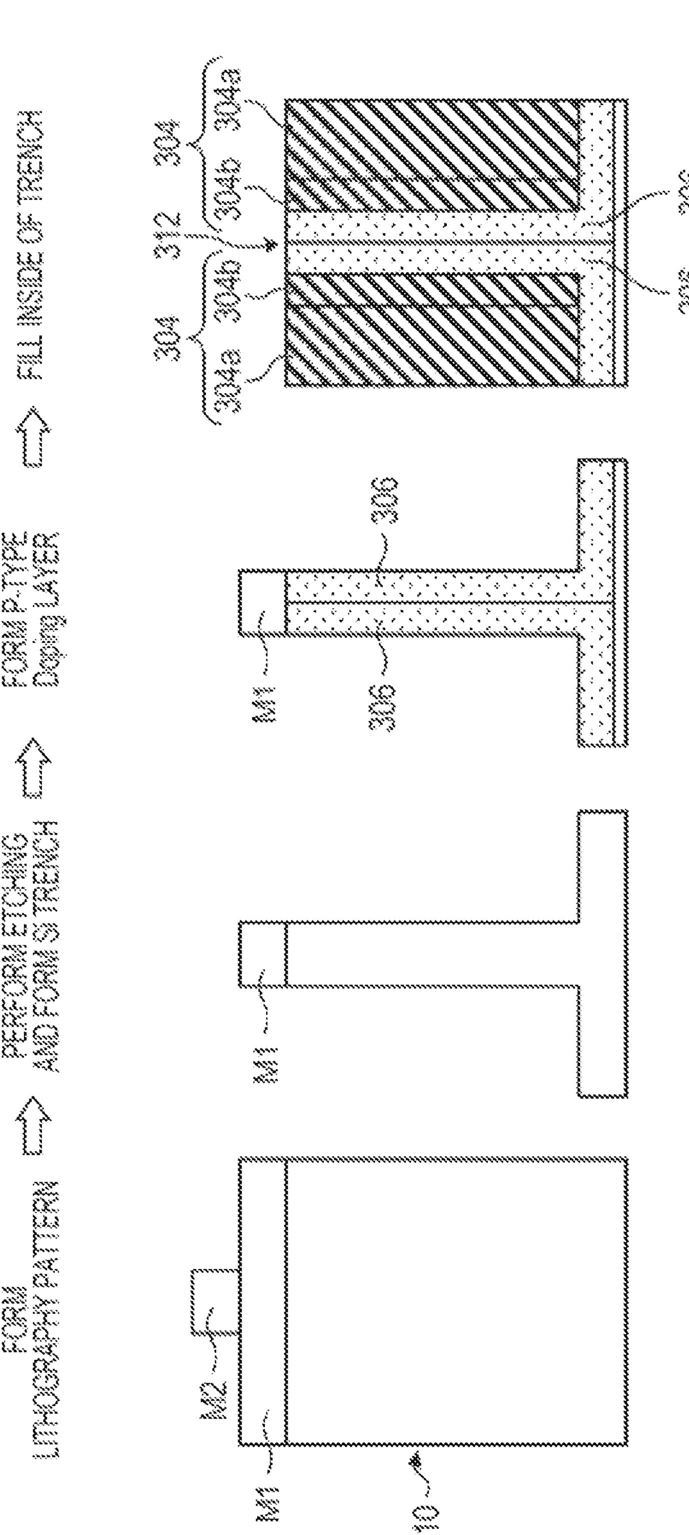
FIG. 44 is a process cross-sectional view (part 2) for explaining a part of the manufacturing process of the imaging element 100 according to the ninth embodiment of the present disclosure.

Here, a part of the manufacturing process (manufacturing method) of the imaging element 100 will be described with reference to FIGS. 43 and 44. FIG. 43 is a process cross-sectional view for explaining a part of the manufacturing process of the imaging element 100 according to the present embodiment, and specifically corresponds to a cross-section of the semiconductor substrate 10 taken along line L-L' illustrated in FIG. 39. FIG. 44 is a process cross-sectional view for explaining a part of the manufacturing process of the imaging element 100 according to the present embodiment, and specifically corresponds to a cross-section of the semiconductor substrate 10 taken along line I-I' illustrated in FIG. 39.

As illustrated in FIGS. 43 and 44, in the present embodiment, a mask M1 (for example, an inorganic mask such as $SiO_2$) is formed on the back surface 10*a* (or the front surface 10*b*) of the semiconductor substrate 10. Thereafter, the mask M2 is formed on the mask M1. The mask M2 is formed, for example, by stacking a photoresist layer on the mask M1 on the front surface 10*b* of the semiconductor substrate 10 by a spin coating method or the like and patterning the photoresist layer in accordance with a trench formation pattern. Next, trenches for forming the protruding portion 304 and the element separation wall 310 are formed by etching such as dry etching, and the mask M2 is removed. Then, for example, conformal doping is performed to form the diffusion region 306. Thereafter, a material such as an oxide film is embedded in each trench, and the protruding portion 304 and the element separation wall 310 are formed. Finally, the mask M1 is removed, and the imaging element 100 having the final structure is formed through a post-process.

Further, in the present embodiment, the protruding portion 304 can be modified as follows. Therefore, a detailed configuration of the protruding portion 304 will be described with reference to FIGS. 45 to 50. FIGS. 45 to 50 are explanatory diagrams illustrating a plane of the imaging element 100 according to the present embodiment, and specifically correspond to a cross-section of the imaging element 100 cut along a plane direction.

Figure 45:
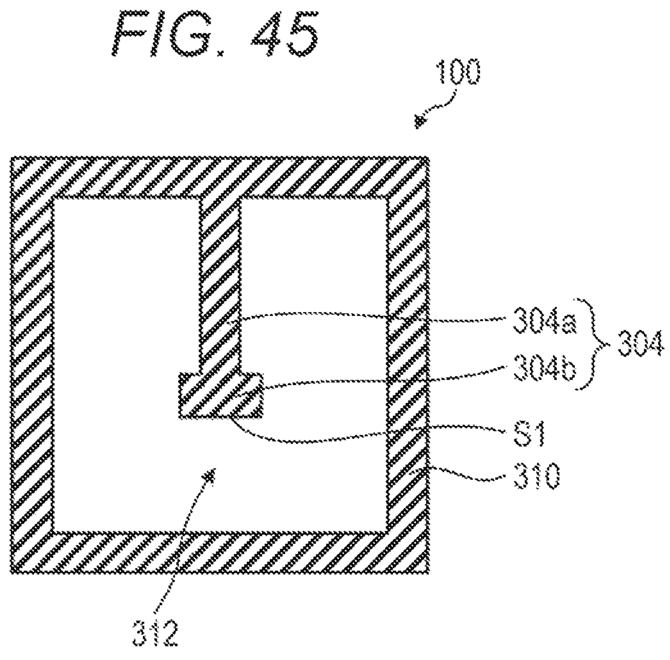
FIG. 45 is an explanatory diagram (part 2) illustrating a plane of an imaging element 100 according to a tenth embodiment of the present disclosure.

As illustrated in FIG. 45, in the present embodiment, the protruding portion 304 has an extension portion 304*a* and a projection portion 304*b*. The extension portion 304*a* is connected to the element separation wall 310 and extends in the column direction from the element separation wall 310. The projection portion 304*b* is provided at an end of the extension portion 304*a* and extends in the row direction. When viewed from above the light receiving surface 10*a*, the shape of the extension portion 304*a* and the shape of the projection portion 304*b* are rectangular, and in the example of FIG. 45, the shape of the protruding portion 304 is T-shaped. The projection portion 304*b* has an opposing surface S1 facing the wall surface of the element separation wall 310. When viewed from above the light receiving surface 10*a*, the width (for example, the length in the row direction) of the opposing surface S1 of the projection portion 304*b* is longer than the line width (for example, the length in the row direction) of the extension portion 304*a*.

Figure 46:
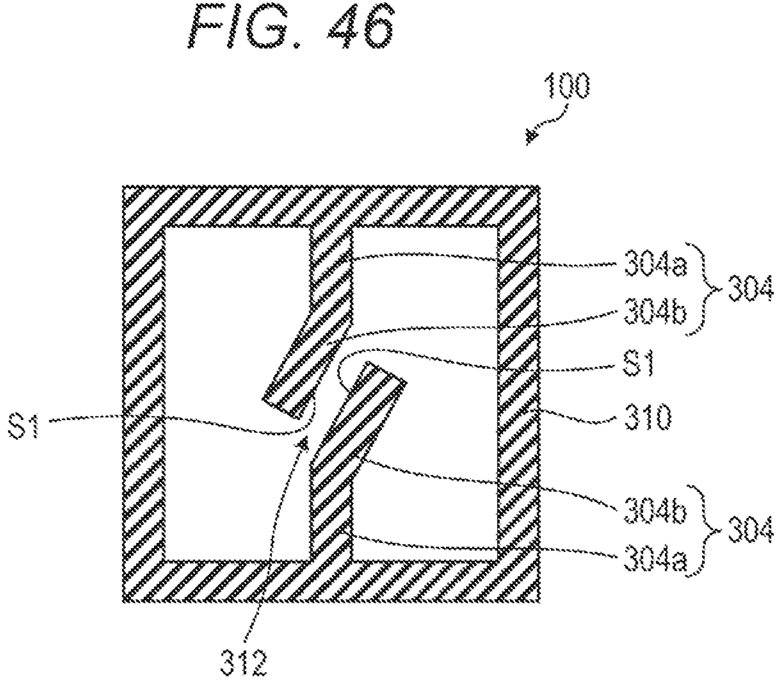
FIG. 46 is an explanatory diagram (part 3) illustrating a plane of an imaging element 100 according to the tenth embodiment of the present disclosure.

Further, as illustrated in FIG. 46, in the present embodiment, the two protruding portions 304 are formed so as to be bent in the middle and the slit 312 to be inclined. Each of the protruding portions 304 has opposing surfaces S1 facing each other. When viewed from above the light receiving surface 10*a*, the length (for example, the length in the inclination direction) of each of the opposing surfaces S1 is longer than the line width (for example, the length in the row direction) of each of the two protruding portions 304.

Figure 47:
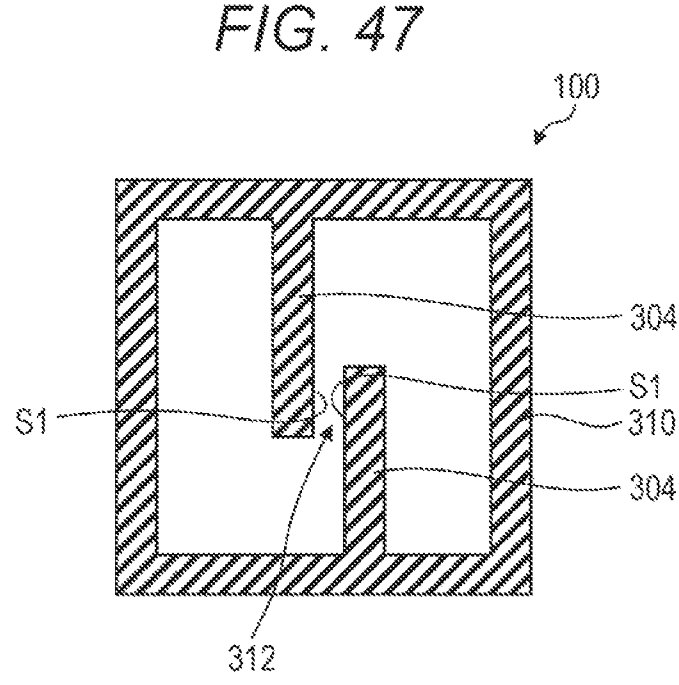
FIG. 47 is an explanatory diagram (part 4) illustrating a plane of the imaging element 100 according to the tenth embodiment of the present disclosure.

As illustrated in FIG. 47, in the present embodiment, the two protruding portions 304 are formed so as to be shifted in the row direction. Each of the protruding portions 304 has opposing surfaces S1 facing each other. When viewed from above the light receiving surface 10*a*, an individual length (for example, a length in the column direction) of each opposing surface S1 is longer than an individual line width (for example, a length in the row direction) of each protruding portion 304.

Figure 48:
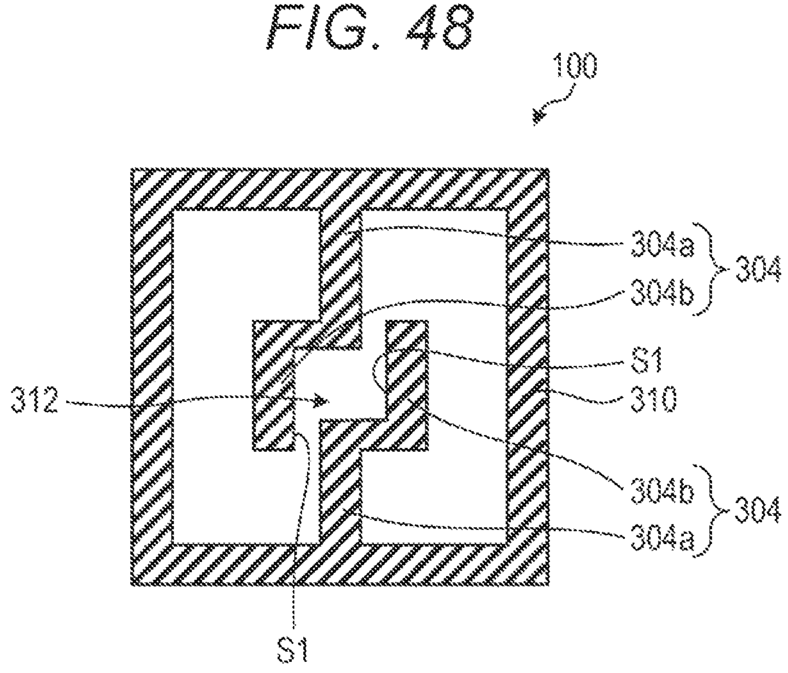
FIG. 48 is an explanatory diagram (part 5) illustrating a plane of the imaging element 100 according to the tenth embodiment of the present disclosure.

As illustrated in FIG. 48, in the present embodiment, the two protruding portions 304 each have an extension portion 304*a* and a projection portion 304*b*. The extension portion 304*a* is connected to the element separation wall 310 and extends in the column direction from the element separation wall 310. The projection portion 304*b* is provided at an end of the extension portion 304*a*, and is formed in a shape extending in the row direction and the column direction. When viewed from above the light receiving surface 10*a*, the shape of the extension portion 304*a* is rectangular, and in the example of FIG. 48, the shape of the projection portion 304*b* is L-shaped. Each of the protruding portions 304 has opposing surfaces S1 facing each other. When viewed from above the light receiving surface 10*a*, an individual length (for example, a length in the row direction and a length in the column direction) of each opposing surface S1 is longer than an individual line width (for example, a length in the row direction) of each extension portion 304*a*.

Figure 49:
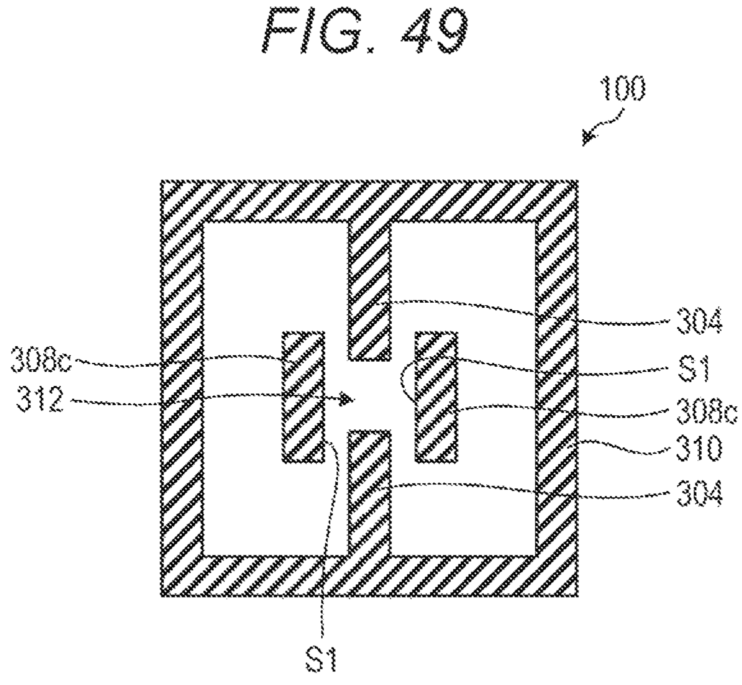
FIG. 49 is an explanatory diagram (part 6) illustrating a plane of the imaging element 100 according to the tenth embodiment of the present disclosure.

Furthermore, as illustrated in FIG. 49, in the present embodiment, in addition to the two protruding portions 304, two additional walls (an example of a separation portion) 308*c* are provided to face each other with the center of the imaging element 100 interposed therebetween. Each additional wall 308*c* has opposing surfaces S1 facing each other. When viewed from above the light receiving surface 10*a*, an individual length (for example, a length in the column direction) of each opposing surface S1 is longer than an individual line width (for example, a length in the row direction) of each protruding portion 304.

Figure 50:
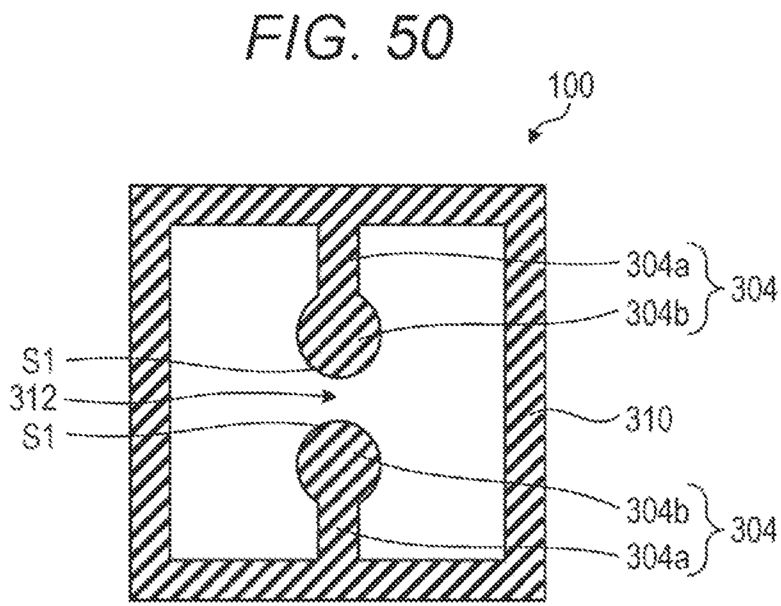
FIG. 50 is an explanatory diagram (part 7) illustrating a plane of the imaging element 100 according to the tenth embodiment of the present disclosure.

As illustrated in FIG. 50, in the present embodiment, the two protruding portions 304 each have an extension portion 304*a* and a projection portion 304*b*. In the example of FIG. 50, the configuration other than the circular shape of the projection portion 304*b* when viewed from above the light receiving surface 10*a* is the same as the configuration of FIG. 39. Note that the shape of the projection portion 304*b* may be various shapes such as an elliptical shape and a trapezoidal shape other than the circular shape.

As described above, according to the present embodiment (including modified examples), it is possible to obtain effects according to other embodiments (including modified examples). That is, deterioration of the captured image can be avoided while improving the accuracy of the phase difference detection. In addition, the width (for example, the length in the row direction) of the opposing surface S1 of the protruding portion 304 is wider than the line width (for example, the length in the row direction) of the extension portion 304*a* of the protruding portion 304. As a result, the etching rate on the opposing surface S1 side of the protruding portion 304 can be increased, and the shape of the slit 312 can be made not a tapered shape but a linear shape. As a result, ion implantation can be omitted, and an increase in the number of manufacturing steps can be suppressed. Furthermore, since the perpendicularity of the slit 312 (perpendicularity of the trench) is improved, the saturation charge amount Qs can be improved as compared with a case where ion implantation is essential, color mixing and the quantum efficiency Qe can be improved, and crystal defect damage can be reduced to improve white spots.

13. Eleventh Embodiment

Figure 51:
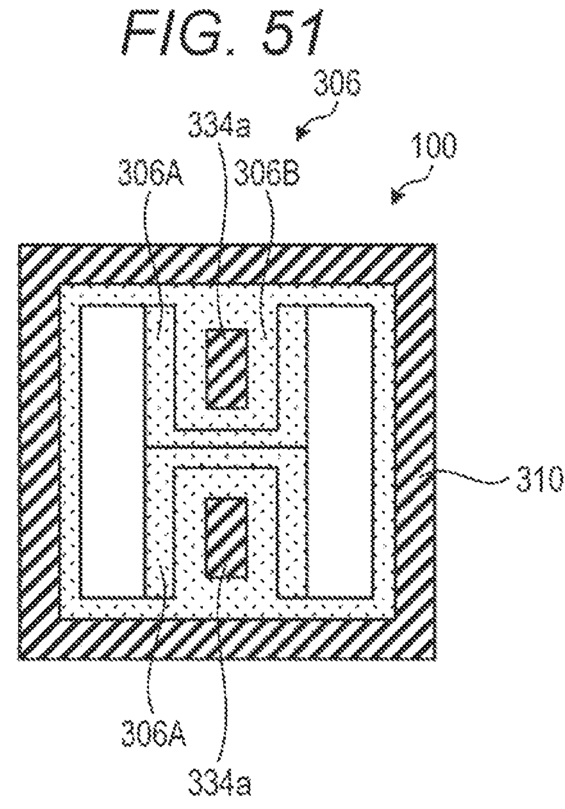
FIG. 51 is an explanatory diagram (part 1) illustrating a plane of an imaging element 100 according to an eleventh embodiment of the present disclosure.
Figure 52:
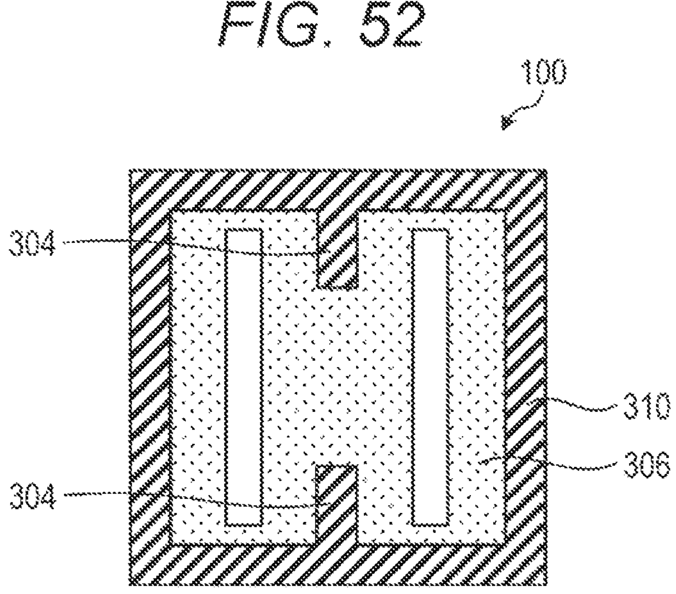
FIG. 52 is an explanatory diagram illustrating a plane of an imaging element 100 according to a comparative example of the eleventh embodiment of the present disclosure.

Furthermore, in the embodiment of the present disclosure, two pixel separation walls (an example of a separation portion) 334*a* may be provided. Hereinafter, such an embodiment will be described as an eleventh embodiment of the present disclosure with reference to FIGS. 51 and 52. FIG. 51 is an explanatory diagram illustrating a plane of the imaging element 100 according to the present embodiment, and specifically corresponds to a cross-section of the imaging element 100 cut along a plane direction. FIG. 52 is an explanatory diagram illustrating a plane of an imaging element 100 according to a comparative example of the present embodiment, and specifically, corresponds to a cross-section of the imaging element 100 according to the comparative example cut along a plane direction.

As illustrated in FIG. 51, in the present embodiment, the two pixel separation walls 334*a* are arranged in the column direction so as to face each other with the center of the imaging element 100 interposed therebetween. Each pixel separation wall 334*a* is separated from the element separation wall 310 without contacting the element separation wall 310, and is further separated from each other. In the example of FIG. 51, when viewed from above the light receiving surface 10*a*, each pixel separation wall 334*a* has a rectangular shape.

The diffusion region 306 includes a first region 306A and a second region 306B. The first region 306A is a region formed by a solid-phase diffusion process for each trench for forming the two pixel separation walls 334*a*. The second region 306B is a region formed by a solid-phase diffusion process for the trench for forming the element separation wall 310. That is, diffusion from the trench corresponding to the element separation wall 310 on the outer periphery and diffusion from each trench corresponding to the two protruding portions 304 occur independently, so that the diffusion region 306 has the first region 306A and the second region 306B.

Here, in order to enhance the separation between the two pixels, for example, it is possible to use a method of diffusing boron from doped silicon oxide deposited on the trench sidewall by solid-phase diffusion. In this case, in the structure as illustrated in FIG. 52, diffusion from the trench corresponding to the element separation wall 310 on the outer periphery and diffusion from each trench corresponding to the two protruding portions 304 simultaneously occur, and the diffusion region 306 of boron is widely formed. Since the diffusion region 306 is widely formed, the saturation charge amount decreases. Therefore, as described above, by disposing the element separation wall 310 and the two pixel separation walls 334*a* apart from each other and forming the separation structure independently, it is possible to independently perform solid-phase diffusion of the separation structure. Thus, it is possible to suppress a decrease in the saturation charge amount. That is, since diffusion from the trench corresponding to the element separation wall 310 and diffusion from each trench corresponding to the two protruding portions 304 occur independently, the size of the diffusion region 306 can be suppressed, and a decrease in the saturation charge amount can be suppressed.

In the present embodiment, for example, boron is diffused by a solid-phase diffusion process (an example of a diffusion process). However, the diffusion process is not limited to the solid-phase diffusion process, and a doping technique such as plasma doping in which doping is performed from a sidewall by heat can also be used.

Furthermore, in the example of FIG. 51, the two pixel separation walls 334*a* are positioned on the center line passing through the center of the imaging element 100. However, the present invention is not limited thereto, and for example, the pixel separation walls may be positioned so as to be shifted in the left-right direction (as an example, a row direction) of FIG. 51. The same applies to the following configurations illustrated in FIGS. 54 to 57.

Figure 53:
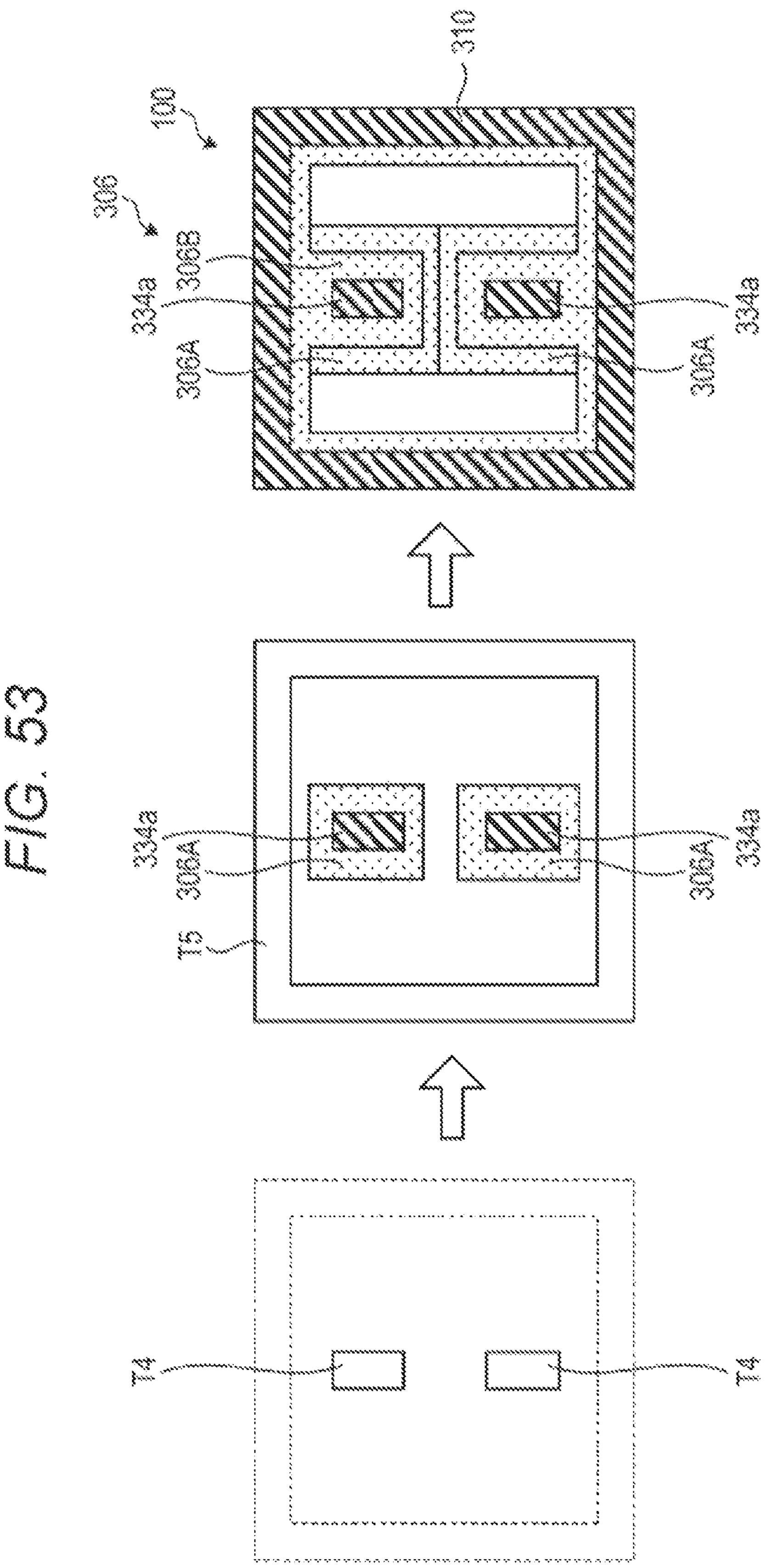
FIG. 53 is a process cross-sectional view for explaining a part of the manufacturing process of the imaging element 100 according to the eleventh embodiment of the present disclosure.

Here, a part of the manufacturing process (manufacturing method) of the imaging element 100 will be described with reference to FIG. 53. FIG. 53 is a process cross-sectional view for explaining a part of the manufacturing process of the imaging element 100 according to the present embodiment, and specifically corresponds to a cross-section of the imaging element 100 cut along the planar direction.

As illustrated in FIG. 53, in the present embodiment, individual trenches T4 for forming the two pixel separation walls 334*a* are formed at internal positions away from the formation positions of the element separation walls 310 (see the first diagram from the left in FIG. 53). Subsequently, a solid-phase diffusion process is used for the trenches T4, a solid-phase diffusion layer (for example, a P-type layer), that is, the first region 306A is formed around each trench T4, and then a material such as an oxide film is embedded in the trenches T4 to form the pixel separation wall 334*a* (see the second diagram from the left in FIG. 53). Next, the trench T5 for forming the element separation wall 310 is formed in a rectangular shape of a predetermined size surrounding each trench T4, a solid-phase diffusion process is used for the trench T5, a solid-phase diffusion layer (for example, a P-type layer), that is, the second region 306B is formed around the trench T5, and finally, a material such as an oxide film is embedded in the trench T5 to form the element separation wall 310 (see the third diagram from the left in FIG. 53). As a result, the diffusion region 306 including the first region 306A and the second region 306B is formed.

Furthermore, in the present embodiment, the pixel separation wall 334*a* can be modified as follows. Therefore, a detailed configuration of the pixel separation wall 334*a* will be described with reference to FIGS. 54 to 57. FIGS. 54 to 57 are explanatory diagrams illustrating a plane of the imaging element 100 according to the present embodiment, and specifically correspond to a cross-section of the imaging element 100 cut along a plane direction.

Figure 54:
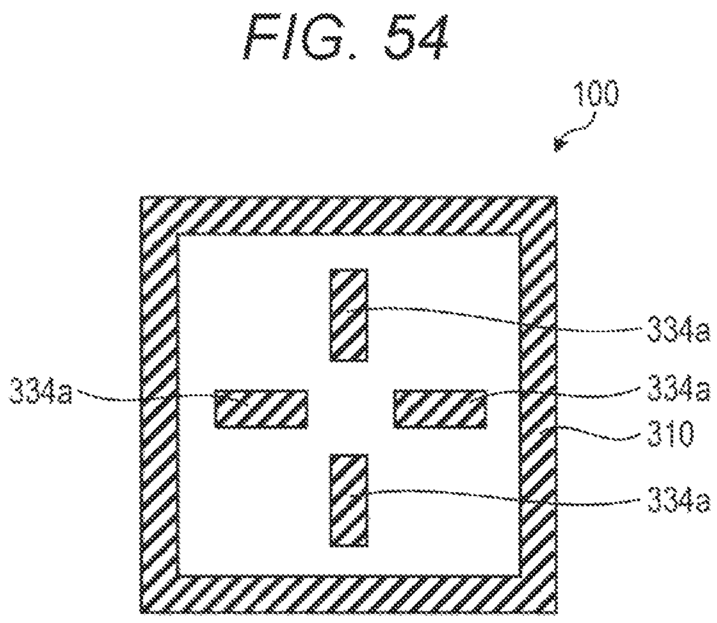
FIG. 54 is an explanatory diagram (part 2) illustrating a plane of the imaging element 100 according to the eleventh embodiment of the present disclosure.

As illustrated in FIG. 54, in the present embodiment, four pixel separation walls 334*a* are provided. Two of the four pixel separation walls 334*a* are arranged in the column direction so as to face each other with the center of the imaging element 100 therebetween, and the other two are arranged in the row direction so as to face each other with the center of the imaging element 100 therebetween. Each pixel separation wall 334*a* is separated from the element separation wall 310 without contacting the element separation wall 310, and is further separated from each other. In the example of FIG. 54, when viewed from above the light receiving surface 10*a*, each pixel separation wall 334*a* has a rectangular shape, and each pixel separation wall 334*a* is disposed so as to form a cross shape.

Figure 55:
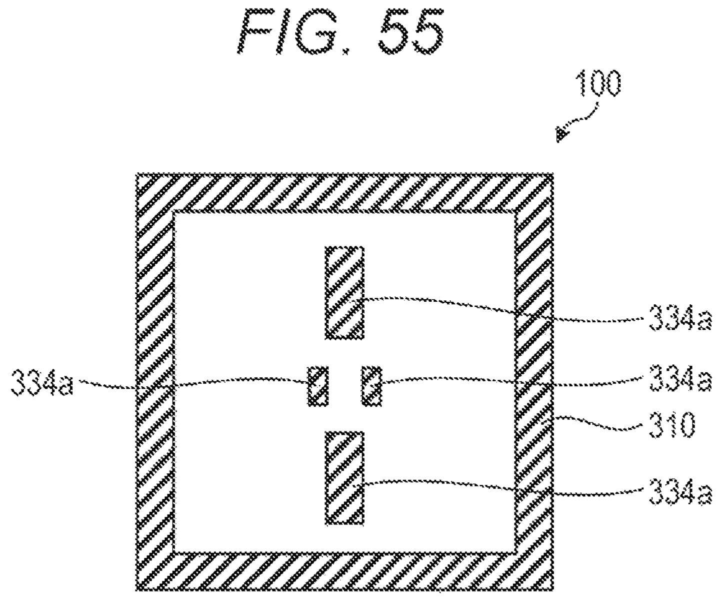
FIG. 55 is an explanatory diagram (part 3) illustrating a plane of the imaging element 100 according to the eleventh embodiment of the present disclosure.

Furthermore, as illustrated in FIG. 55, in the present embodiment, in addition to the two pixel separation walls 334*a*, two pixel separation walls 334*a* having a smaller planar area than those pixel separation walls 334*a* are provided. The pixel separation walls 334*a* having a small area (size) are arranged in the row direction so as to face each other with the center of the imaging element 100 therebetween. Individual parts of the two pixel separation walls 334*a* are positioned in a region between the other two pixel separation walls 334*a*. In the example of FIG. 55, when viewed from above the light receiving surface 10*a*, each pixel separation wall 334*a* has a rectangular shape.

Figure 56:
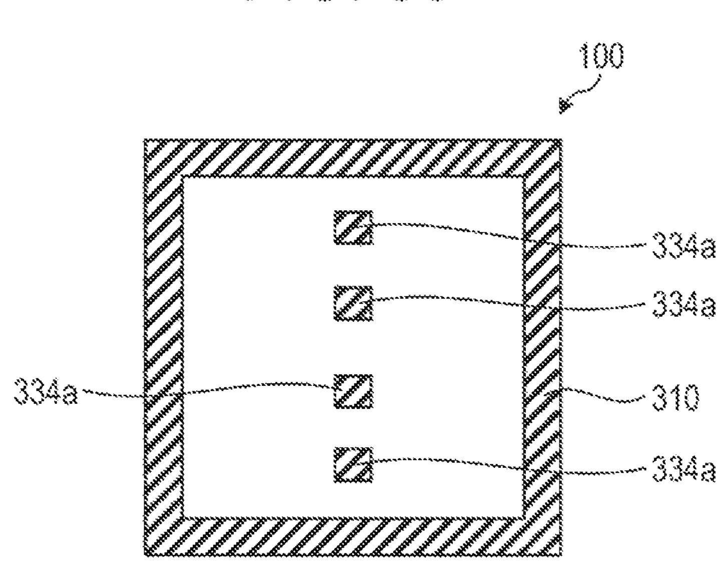
FIG. 56 is an explanatory diagram (part 4) illustrating a plane of the imaging element 100 according to the eleventh embodiment of the present disclosure.

Furthermore, as illustrated in FIG. 56, in the present embodiment, four pixel separation walls 334*a* are provided. The four pixel separation walls 334*a* are arranged in a dot shape in the column direction passing through the center of the imaging element 100. Each pixel separation wall 334*a* is separated from the element separation wall 310 without contacting the element separation wall 310, and is further separated from each other. In the example of FIG. 56, when viewed from above the light receiving surface 10*a*, each pixel separation wall 334*a* has a rectangular shape, and each pixel separation wall 334*a* is arranged on one straight line.

Figure 57:
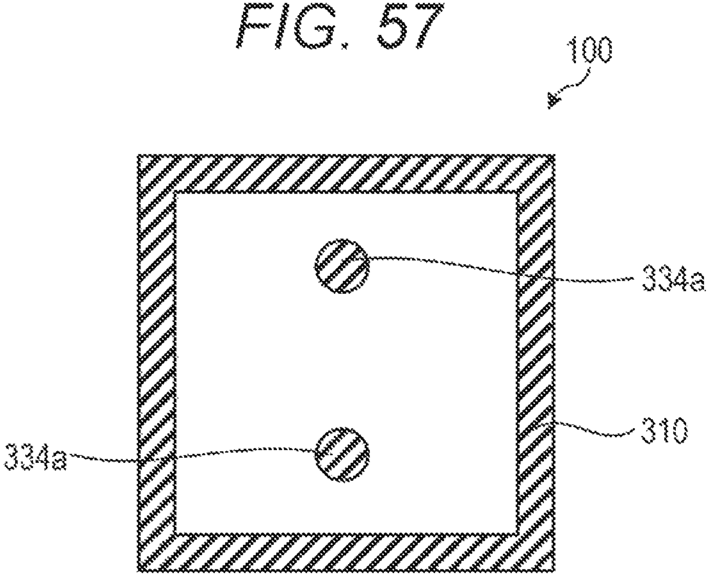
FIG. 57 is an explanatory diagram (part 5) illustrating a plane of the imaging element 100 according to the eleventh embodiment of the present disclosure.

Furthermore, as illustrated in FIG. 57, in the present embodiment, the two pixel separation walls 334*a* are each formed in a circular shape when viewed from above the light receiving surface 10*a*. In the example of FIG. 57, when viewed from above the light receiving surface 10*a*, the configuration other than that the shape of each pixel separation wall 334*a* is circular is the same as the configuration of FIG. 51. Note that the pixel separation wall 334*a* may have various shapes such as an elliptical shape and a trapezoidal shape in addition to the circular shape.

As described above, according to the present embodiment (including modified examples), it is possible to obtain effects according to other embodiments (including modified examples). That is, deterioration of the captured image can be avoided while improving the accuracy of the phase difference detection. Furthermore, by disposing the element separation wall 310 and each pixel separation wall 334*a* apart from each other and forming the separation structure independently, it is possible to independently perform a diffusion process such as solid-phase diffusion of the separation structure. Thus, it is possible to suppress a decrease in the saturation charge amount.

14. Twelfth Embodiment

Figure 58:
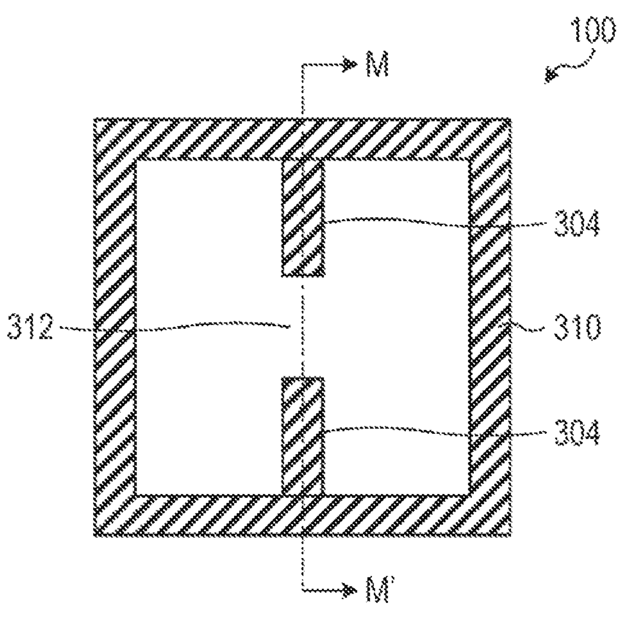
FIG. 58 is an explanatory diagram (part 1) illustrating a plane of an imaging element 100 according to a twelfth embodiment of the present disclosure.
Figure 59:
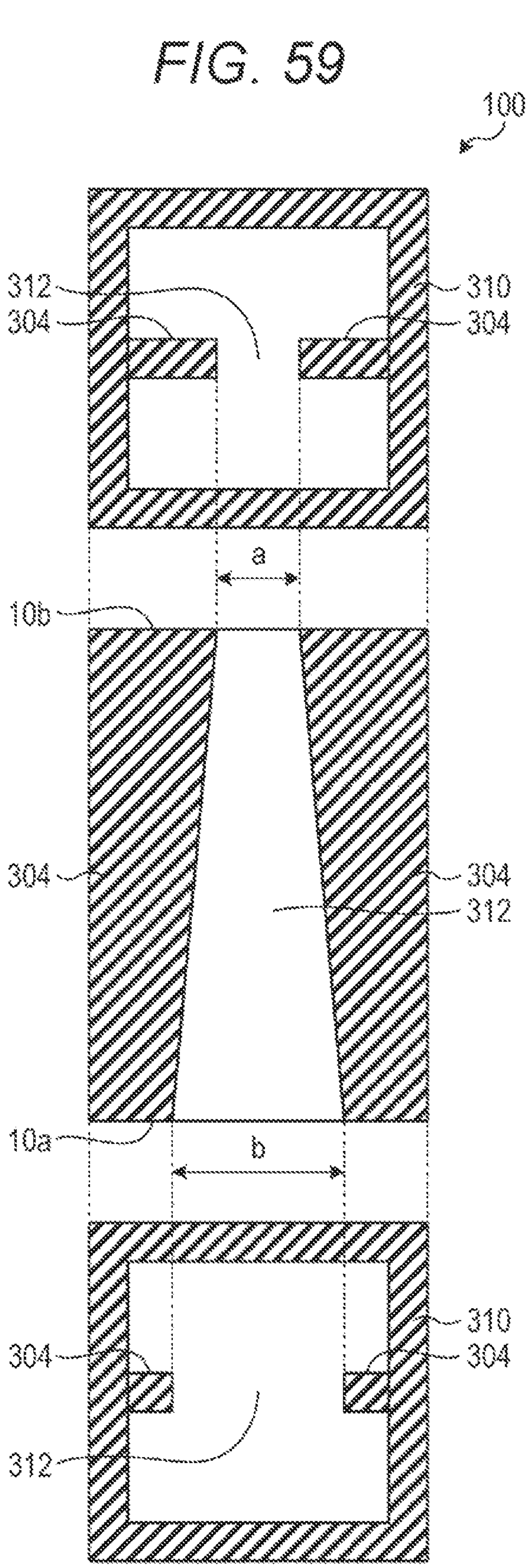
FIG. 59 is an explanatory diagram (part 1) illustrating both surfaces and a cross-section of the imaging element 100 according to the twelfth embodiment of the present disclosure.
Figure 60:
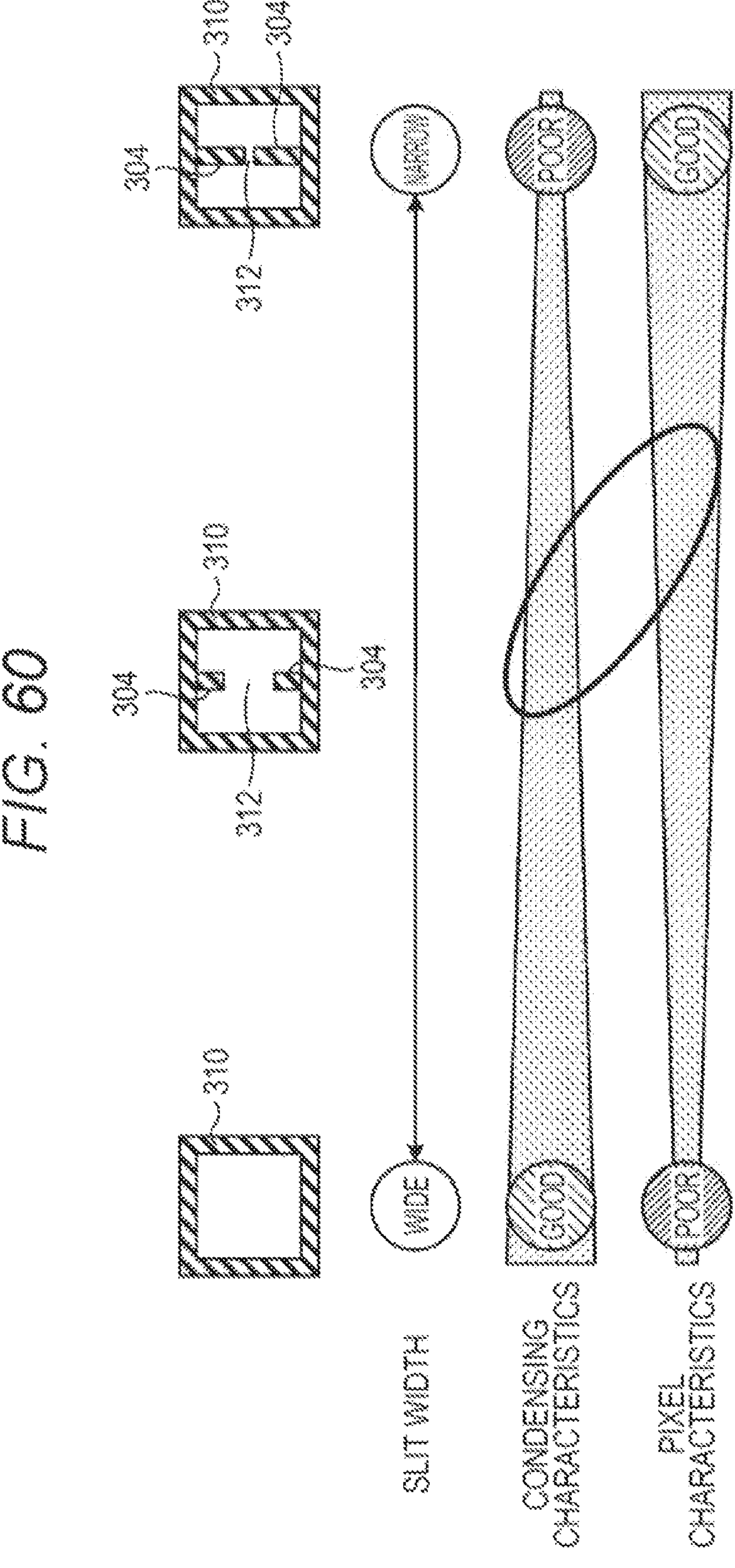
FIG. 60 is an explanatory diagram illustrating a relationship between a slit width, a condensing characteristic, and a pixel characteristic of the imaging element 100 according to the twelfth embodiment of the present disclosure.

In the embodiment of the present disclosure, the pair of protruding portions 304 is not limited to have the substantially same separation distance in the depth direction (height direction), and may have different distances. Therefore, such an embodiment will be described as a twelfth embodiment of the present disclosure with reference to FIGS. 58 to 60. FIG. 58 is an explanatory diagram illustrating a plane of the imaging element 100 according to the present embodiment, and specifically corresponds to a cross-section of the imaging element 100 cut along a plane direction. FIG. 59 is an explanatory diagram illustrating both surfaces and a cross-section of the imaging element 100 according to the present embodiment, and the cross-section corresponds to a cross-section of the imaging element 100 taken along line M-M' illustrated in FIG. 58. FIG. 60 is an explanatory diagram illustrating the relationship between the slit width (the length of the gap between the slits), the condensing characteristics, and the pixel characteristics of the imaging element 100 according to the present embodiment.

As illustrated in FIGS. 58 and 59, in the present embodiment, the pair of protruding portions 304 is formed in a tapered shape in which a separation distance (slit width) therebetween gradually changes in the depth direction. In the example of FIG. 59, the distance between the pair of protruding portions 304 gradually increases in the depth direction from the front surface 10*b* toward the back surface (light receiving surface) 10*a* (from the upper surface to the lower surface in FIG. 58) ($a<b$). As a result, it is possible to secure the protruding amount as a whole while moving the light receiving surface 10*a* side of the pair of protruding portions 304 away from the center. As illustrated in FIG. 60, it is possible to reduce scattering of light while maintaining pixel characteristics, and it is possible to eliminate a trade-off between light collection characteristics and pixel characteristics.

Here, there is a relationship of $b-a=2\times(t/\tan(\theta))$. Note that a is the length of the slit 312 on the front surface 10*b* side, b is the length of the slit 312 on the back surface (light receiving surface) 10*a* side, t is the thickness (length in the depth direction) from the front surface 10*b* to the back surface 10*a*, and θ is the taper angle of the slit 312 with respect to the front surface 10*b*. Even when the taper angle θ is small, a large difference occurs in the slit width from the front surface 10*b* to the back surface 10*a* depending on the thickness t from the front surface 10*b* to the back surface 10*a*.

Figure 71:
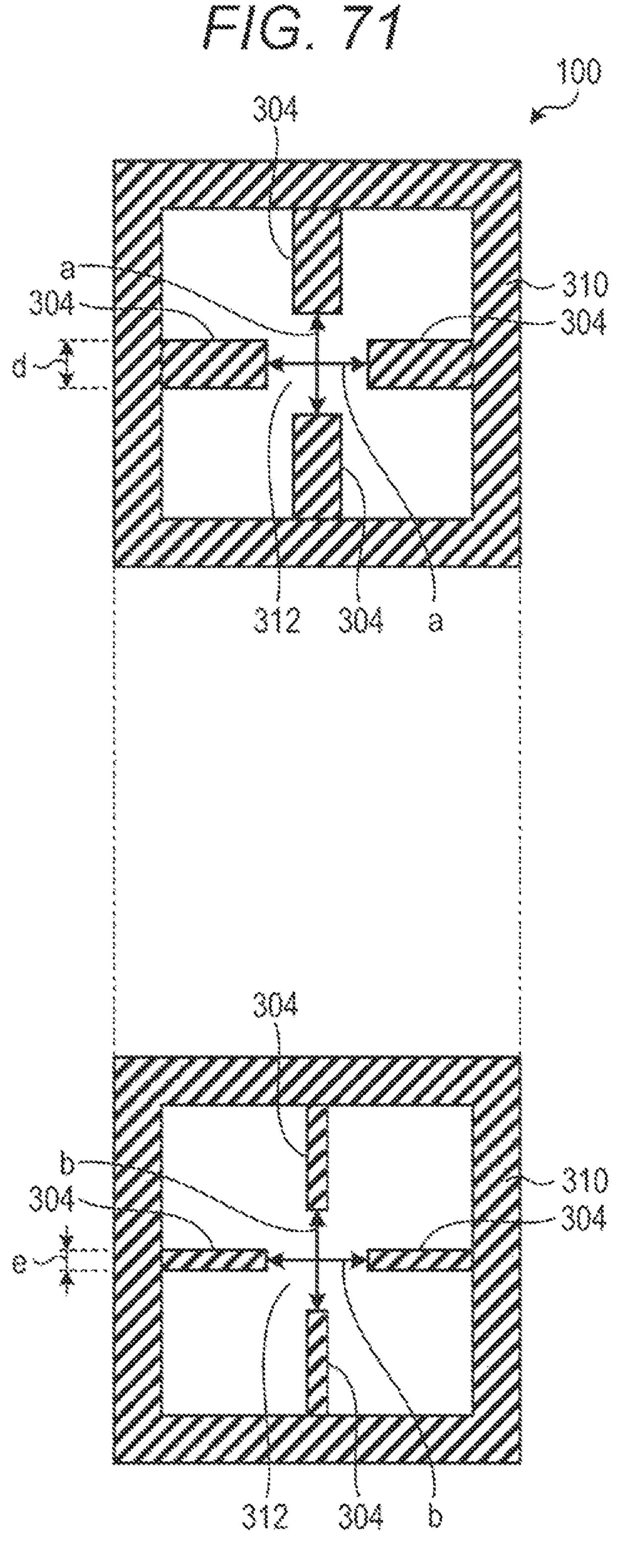
FIG. 71 is an explanatory diagram (part 12) illustrating both surfaces of the imaging element 100 according to the twelfth embodiment of the present disclosure.

In the present embodiment, the pair of protruding portions 304 can be modified as follows. Therefore, a detailed configuration of the pair of protruding portions 304 will be described with reference to FIGS. 61 to 71. FIGS. 61, 65, 68, and 69 are explanatory diagrams illustrating both surfaces and a cross-section of the imaging element 100 according to the present embodiment, respectively. FIGS. 62 to 64 and 66 are explanatory diagrams illustrating a cross-section of the imaging element 100 according to the present embodiment. FIGS. 67, 70, and 71 are explanatory diagrams illustrating both surfaces of the imaging element 100 according to the present embodiment.

Figure 61:
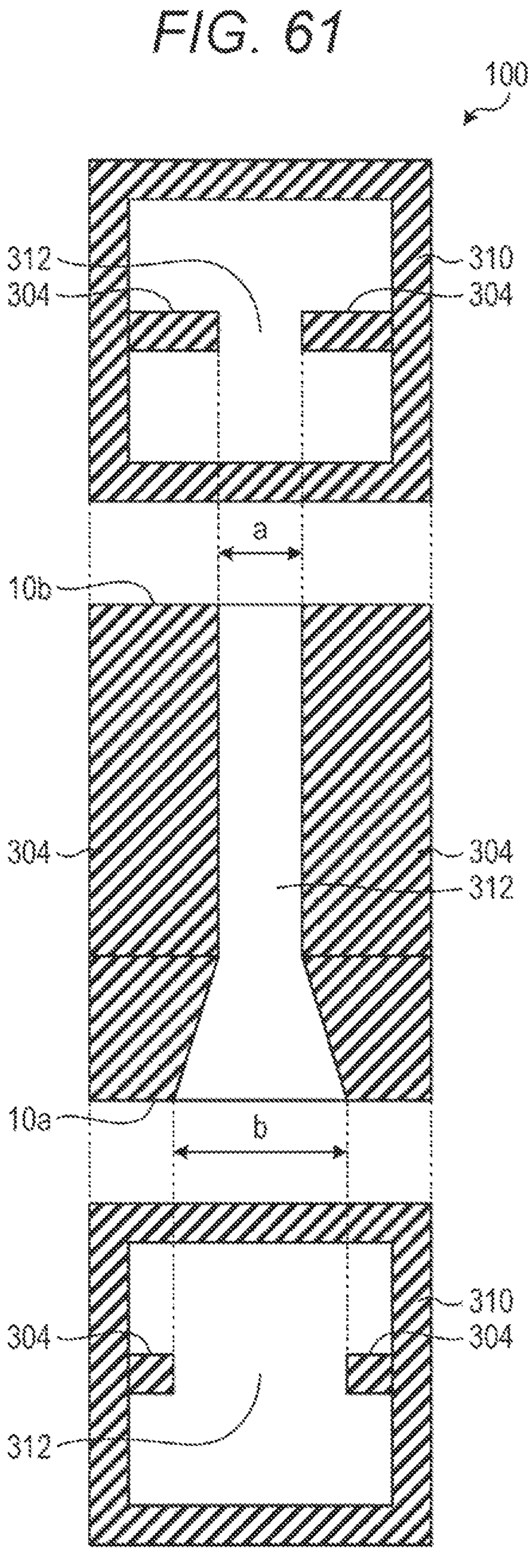
FIG. 61 is an explanatory diagram (part 2) illustrating both surfaces and a cross-section of the imaging element 100 according to the twelfth embodiment of the present disclosure.

As illustrated in FIG. 61, in the present embodiment, the pair of protruding portions 304 is formed such that the separation distances from the front surface 10*b* to the back surface 10*a* (from the upper surface to the lower surface in FIG. 61) are substantially the same by a predetermined depth in the depth direction, and gradually widen in the depth direction from the middle in the depth direction ($a<b$). Note that, as for color mixing deterioration, the trench shape in the light condensing portion is dominant, and thus it is effective if the light condensing portion is changed.

Figure 62:
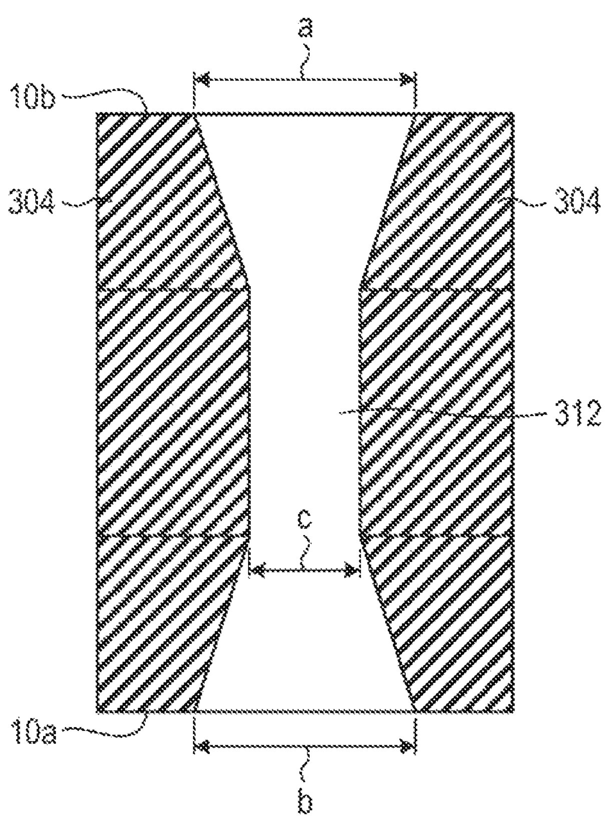
FIG. 62 is an explanatory diagram (part 3) illustrating a cross-section of the imaging element 100 according to the twelfth embodiment of the present disclosure.

As illustrated in FIG. 62, in the present embodiment, the pair of protruding portions 304 is formed such that the separation distance between the protruding portions 304 gradually narrows in the depth direction from the front surface 10*b* toward the back surface 10*a* (from the upper surface to the lower surface in FIG. 62), becomes substantially the same by a predetermined depth in the depth direction, and gradually widens in the depth direction from the middle in the depth direction ($a=b>c$). Note that $a<b$ or $a>b$ may be satisfied. The separation distance on the back surface (light receiving surface) 10*a* side is preferably wide because it is effective for light collection, and the separation distance on the front surface 10*b* side is preferably wide from the viewpoint of potential design. The central separation distance works for Qs, so it is better to be narrow.

Figure 63:
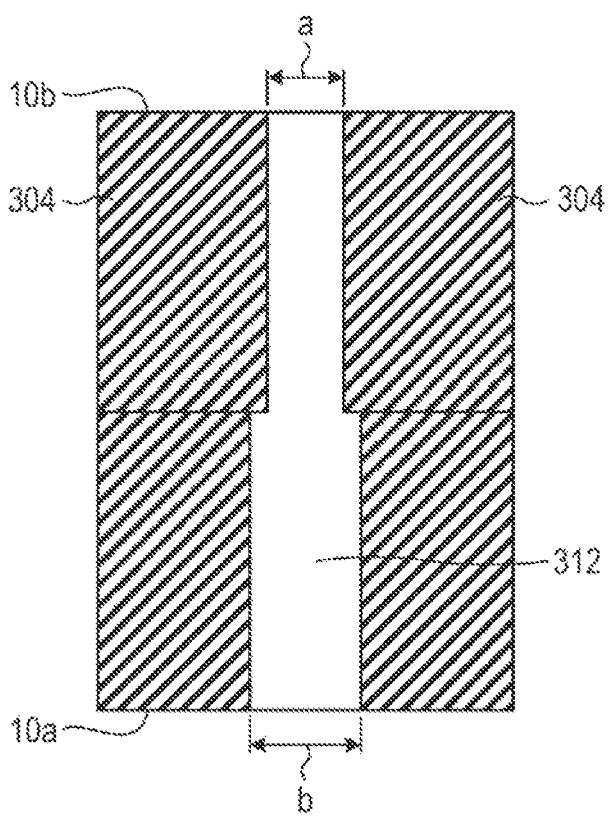
FIG. 63 is an explanatory diagram (part 4) illustrating a cross-section of the imaging element 100 according to the twelfth embodiment of the present disclosure.

Further, as illustrated in FIG. 63, in the present embodiment, the pair of protruding portions 304 is formed such that the separation distance therebetween changes in multiple stages in the depth direction from the front surface 10*b* toward the back surface 10*a* (from the upper surface to the lower surface in FIG. 63). In the example of FIG. 63, the separation distance between the pair of protruding portions 304 changes in two stages in the depth direction, and the separation distance on the front surface 10*b* side is narrower than the separation distance on the back surface 10*a* side ($a<b$). Therefore, each of the pair of protruding portions 304 has a step. As described above, the separation distance between the pair of protruding portions 304 may be changed not continuously but discontinuously, and may be changed in multiple stages such as three stages or four stages instead of two stages.

Figure 64:
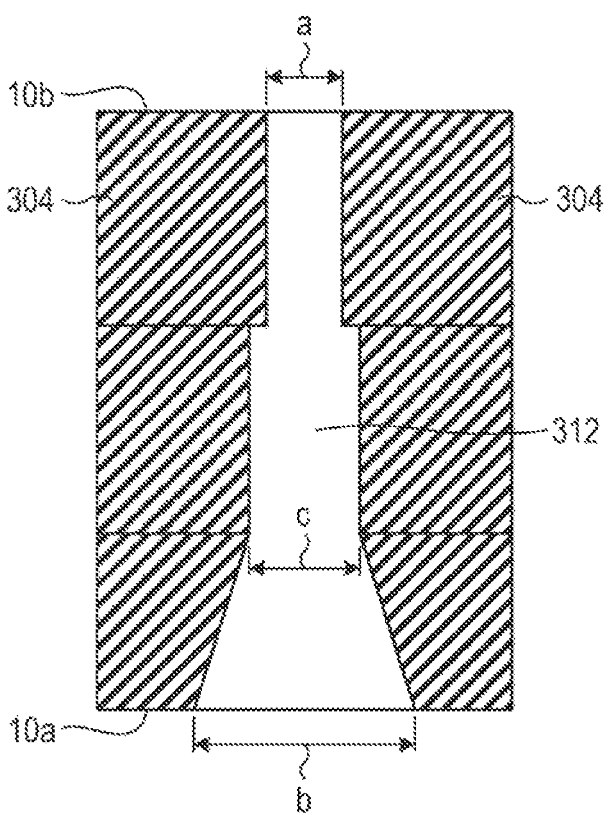
FIG. 64 is an explanatory diagram (part 5) illustrating a cross-section of the imaging element 100 according to the twelfth embodiment of the present disclosure.

In addition, as illustrated in FIG. 64, in the present embodiment, the pair of protruding portions 304 is formed such that the separation distance between the protruding portions changes in two stages in the depth direction from the front surface 10*b* toward the back surface 10*a* (from the upper surface to the lower surface in FIG. 64) and gradually widens in the depth direction from the middle in the depth direction ($a<c<b$). In this manner, the intermediate tapered shape illustrated in FIGS. 61 and 62, the multistage processed shape illustrated in FIG. 63, or the like may be combined.

Figure 65:
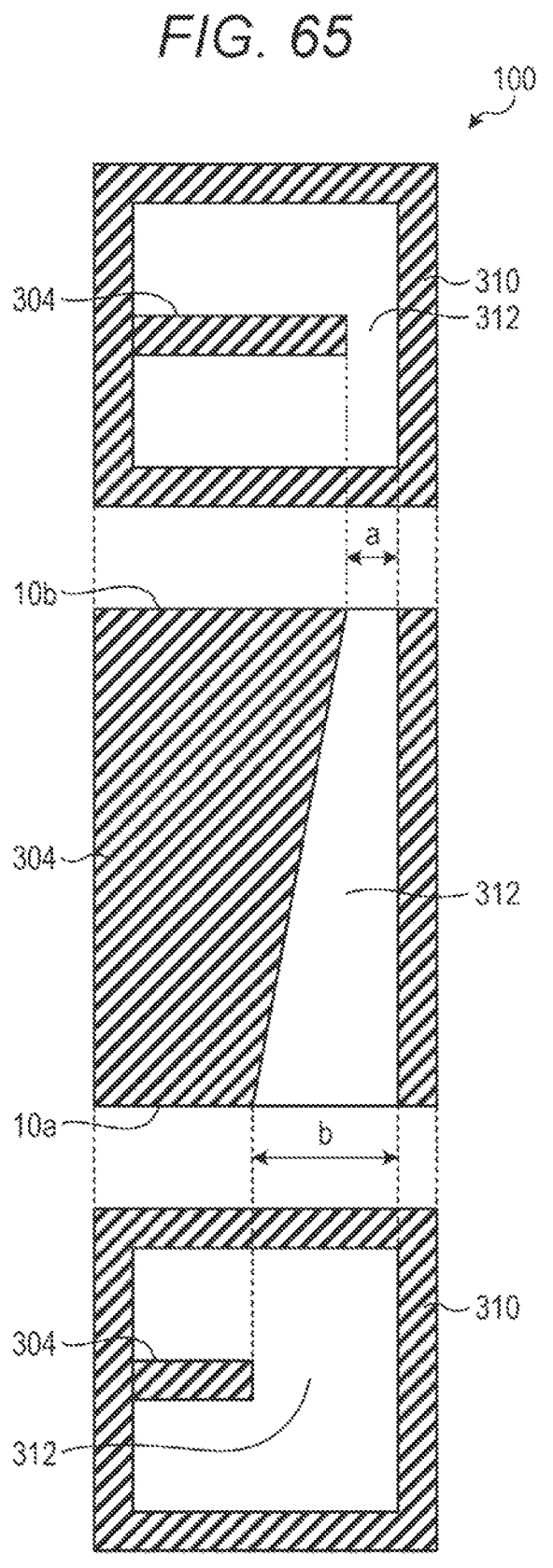

As illustrated in FIG. 65, in the present embodiment, one protruding portion 304 is formed such that a separation distance from the element separation wall 310 gradually increases in the depth direction from the front surface 10*b* toward the back surface 10*a* (from the upper surface to the lower surface in FIG. 65) ($a<b$).

Figure 66:
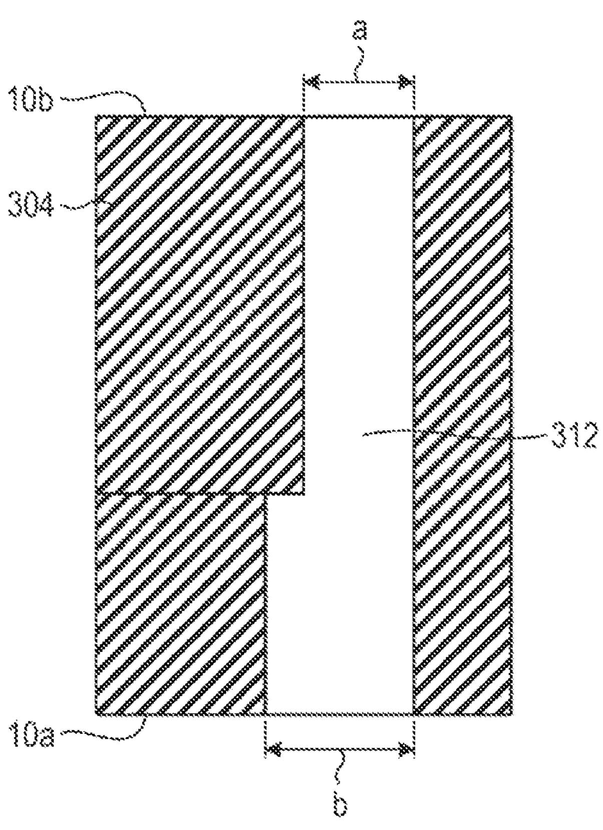
FIG. 66 is an explanatory diagram (part 7) illustrating a cross-section of the imaging element 100 according to the twelfth embodiment of the present disclosure.
Figure 67:
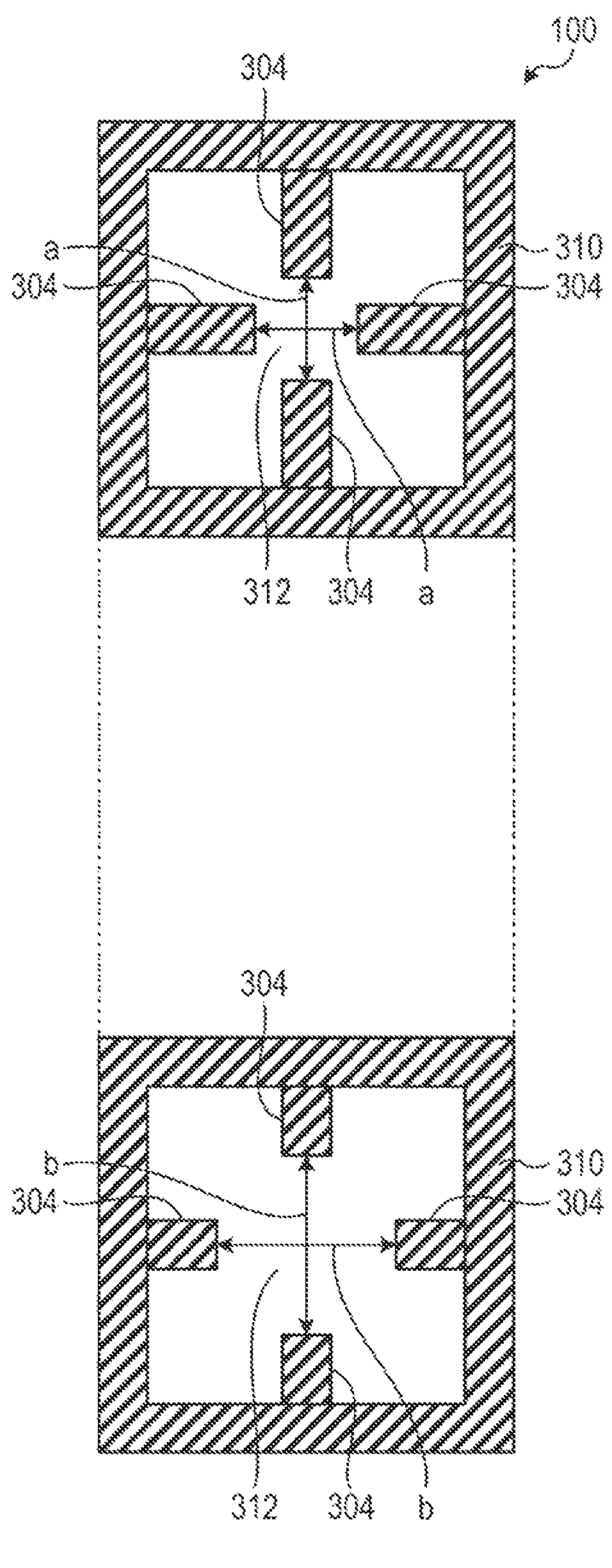
FIG. 67 is an explanatory diagram (part 8) illustrating both surfaces of the imaging element 100 according to the twelfth embodiment of the present disclosure.

As illustrated in FIG. 66, in the present embodiment, one protruding portion 304 is formed so as to change in two stages in the depth direction from the front surface 10*b* toward the back surface 10*a* (from the upper surface to the lower surface in FIG. 66). In the example of FIG. 66, the separation distance on the front surface 10*b* side is narrower than the separation distance on the back surface 10*a* side ($a<b$).

As illustrated in FIG. 67, in the present embodiment, the four protruding portions 304 are formed such that the distance between the pair of protruding portions 304 facing each other gradually increases in the depth direction from the front surface 10*b* toward the back surface 10*a* ($a<b$). These protruding portions 304 are arranged in a cross shape.

As illustrated in FIGS. 65 to 67, the intermediate tapered shape illustrated in FIGS. 61 and 62, the multistage processed shape illustrated in FIG. 63, or the like may be applied to the plurality of protruding portions 304 such as one protruding portion 304 and four protruding portions 304, or a combination thereof may be applied.

Figure 68:
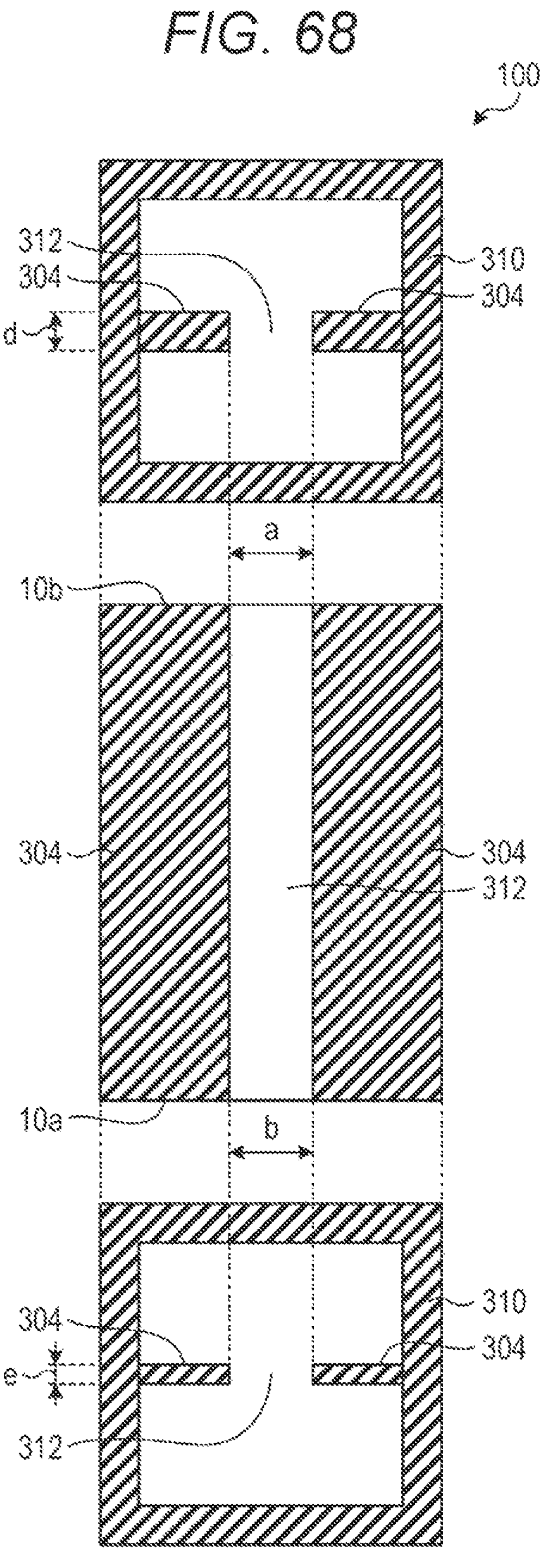
FIG. 68 is an explanatory diagram (part 9) illustrating both surfaces and a cross-section of the imaging element 100 according to the twelfth embodiment of the present disclosure.

As illustrated in FIG. 68, in the present embodiment, the pair of protruding portions 304 is formed such that each line width (width in the direction orthogonal to the extension direction) gradually narrows in the depth direction from the front surface 10*b* toward the back surface 10*a* (from the upper surface to the lower surface in FIG. 68) (d>e). The distance between the pair of protruding portions 304 is substantially the same in the depth direction (a=b).

Figure 69:
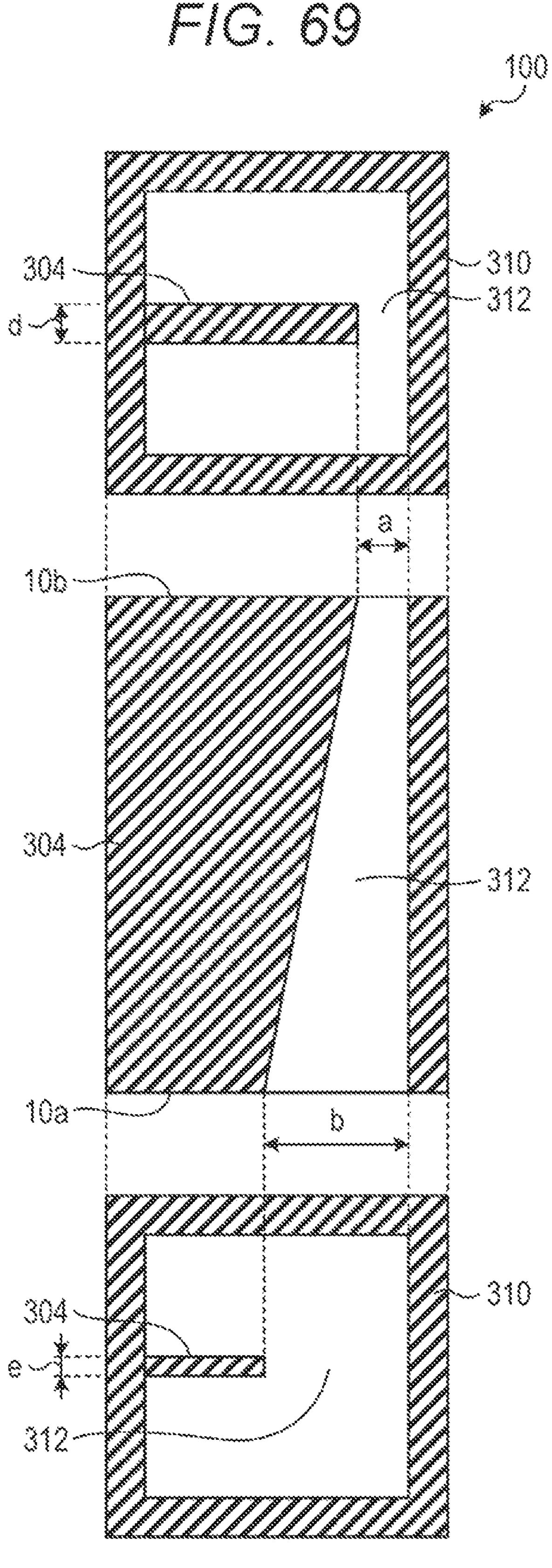
FIG. 69 is an explanatory diagram (part 10) illustrating both surfaces and a cross-section of the imaging element 100 according to the twelfth embodiment of the present disclosure.

As illustrated in FIG. 69, in the present embodiment, one protruding portion 304 is formed such that a line width (width in a direction orthogonal to the extension direction) thereof gradually narrows in the depth direction from the front surface 10*b* toward the back surface 10*a* (from the upper surface to the lower surface in FIG. 69) (d>e). The separation distance between the protruding portion 304 and the element separation wall 310 gradually increases along the depth direction from the front surface 10*b* toward the back surface 10*a* (a<b).

Furthermore, as illustrated in FIG. 70, in the present embodiment, the four pixel separation walls 334*a* are formed such that the line widths thereof gradually narrow in the depth direction from the front surface 10*b* toward the back surface 10*a*. These pixel separation walls 334*a* are arranged in a dot shape in the column direction passing through the center of the imaging element 100. Each pixel separation wall 334*a* is separated from the element separation wall 310 without contacting the element separation wall 310, and is further separated from each other.

As illustrated in FIG. 71, in the present embodiment, the four protruding portions 304 are formed such that the line width (width in the direction orthogonal to the extension direction) gradually decreases in the depth direction from the front surface 10*b* toward the back surface 10*a* (d<e). These protruding portions 304 are arranged in a cross shape. A distance between the pair of protruding portions 304 facing each other is substantially the same in the depth direction (a=b).

As described above, by widening the gap of the slit 312 (the width of the slit 312) on the light receiving surface 10*a* side, scattering by each protruding portion 304 is suppressed, and the condensing characteristic is particularly dominant in the vicinity of the light receiving surface 10*a*. Thus, both the condensing characteristic and the pixel characteristic can be achieved. In addition, not only the gap between the slits 312 is widened on the light receiving surface 10*a* side, but also the line width of the protruding portion 304 is narrowed on the light receiving surface 10*a* side. Thus, scattering by the protruding portion 304 can be suppressed, and color mixing can be suppressed.

Note that only one of widening the gap of the slit 312 on the light receiving surface 10*a* side and narrowing the line width of the protruding portion 304 may be performed, or both of them may be performed. That is, the configurations illustrated in FIGS. 61 to 71 may be used alone or in combination.

Figure 72:
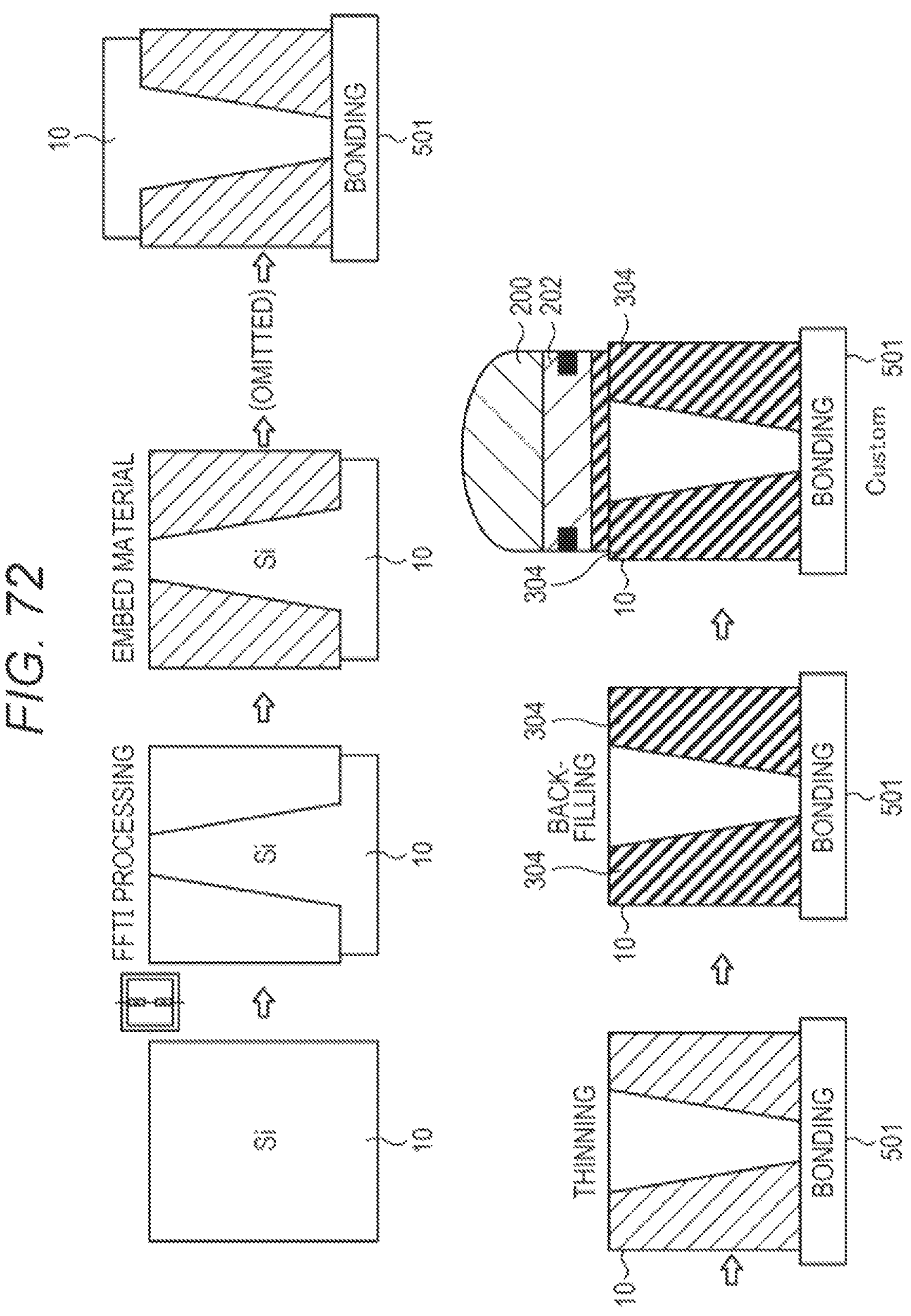
FIG. 72 is a process cross-sectional view for explaining a part of the manufacturing process of the imaging element 100 according to the twelfth embodiment of the present disclosure.

Here, a part of the manufacturing process (manufacturing method) of the imaging element 100 will be described with reference to FIG. 72. FIG. 72 is a process cross-sectional view for explaining a part of the manufacturing process of the imaging element 100 according to the present embodiment, and specifically corresponds to a cross-section obtained by cutting the semiconductor substrate 10 along the thickness direction of the semiconductor substrate 10.

As illustrated in FIG. 72, in the present embodiment, front surface full trench isolation (FFTI) processing is performed on the semiconductor substrate 10 to embed the material. Thereafter, after various steps (omitted), the semiconductor substrate 10 and the bonded substrate 501 are bonded to each other, and thinning is performed. The semiconductor substrate 10 that has been thinned is back-filled, and the color filter 202 and the on-chip lens 200 are stacked. Note that, as the bonded substrate 502, for example, a logic substrate, a semiconductor substrate, or the like is used.

15. Thirteenth Embodiment

Figure 73:
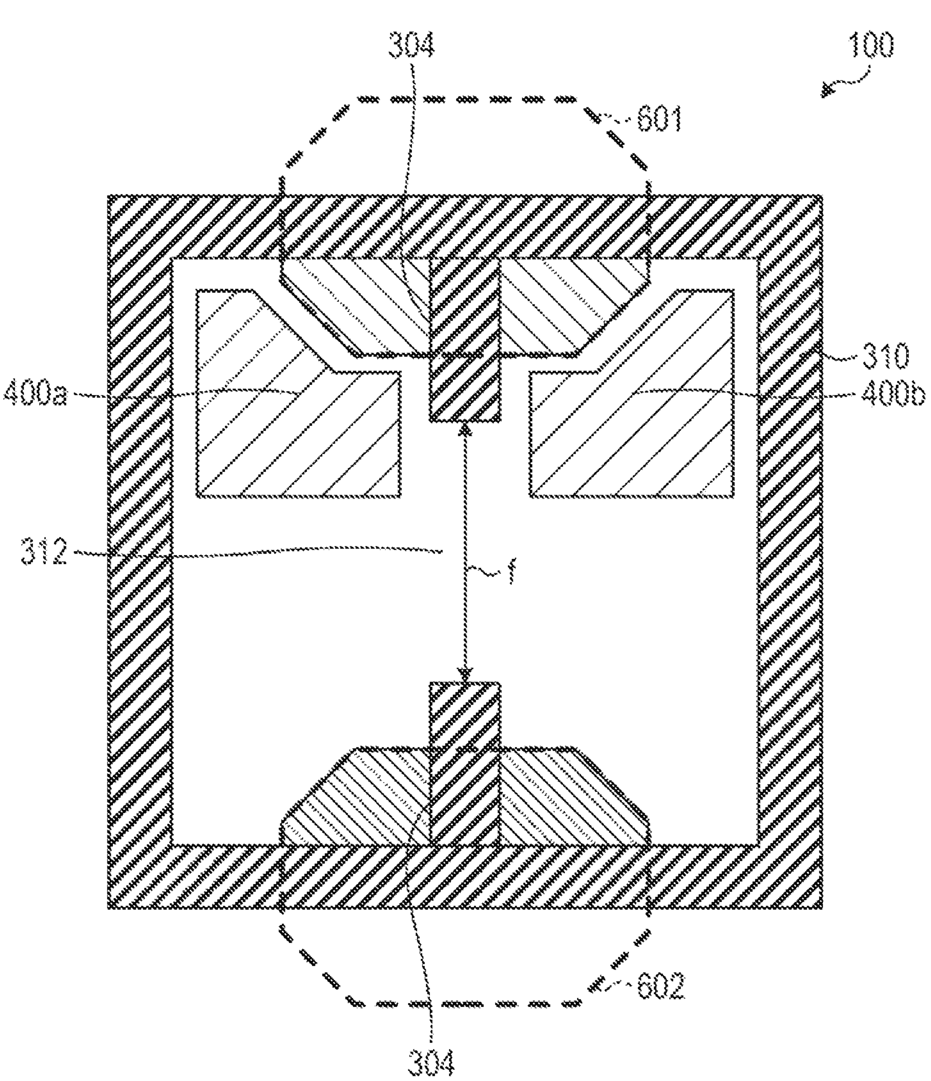
FIG. 73 is an explanatory diagram (part 1) illustrating a plane of an imaging element 100 according to a thirteenth embodiment of the present disclosure.
Figure 74:
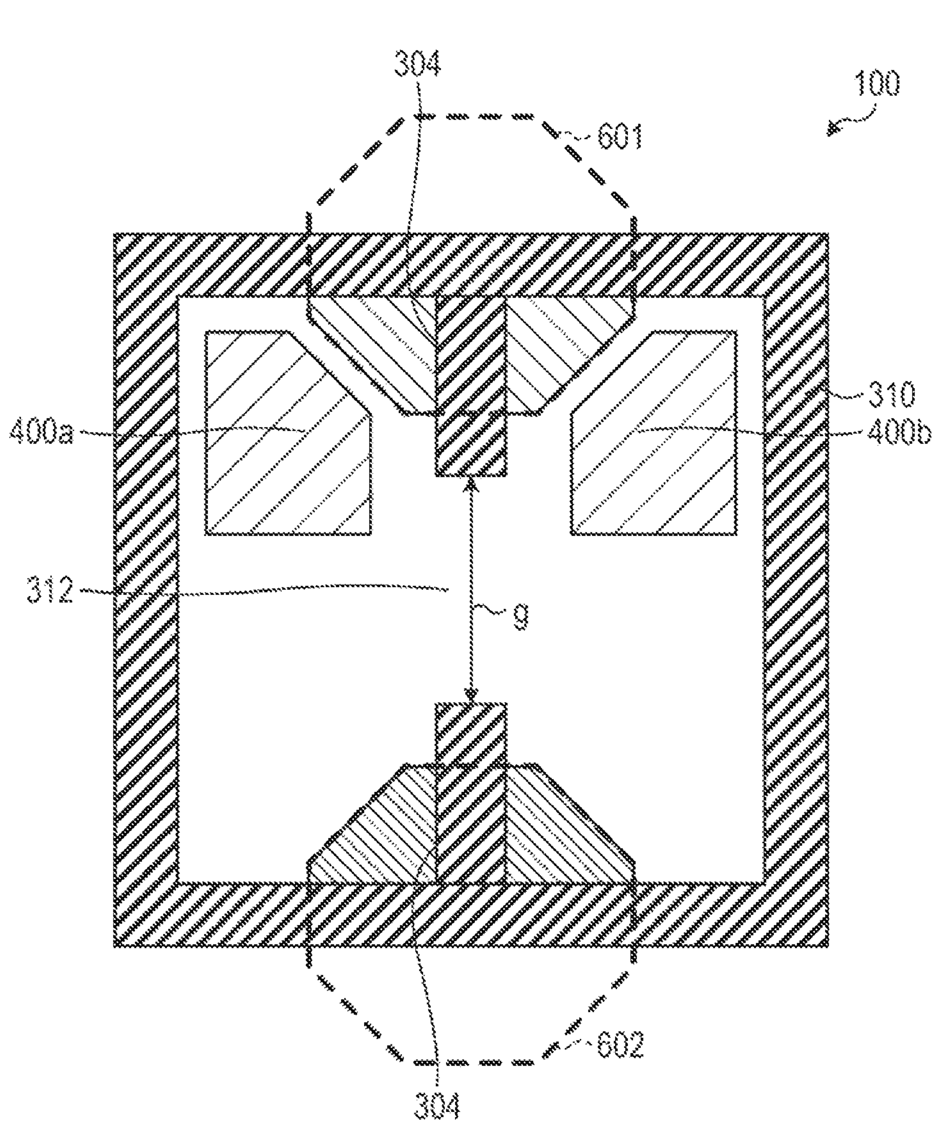
FIG. 74 is an explanatory diagram illustrating a plane of an imaging element 100 according to a comparative example of the thirteenth embodiment of the present disclosure.

Furthermore, in the embodiment of the present disclosure, the two transfer gates 400*a* and 400*b*, the FD portion (floating diffusion portion) 601, and the ground portion 602 may be arranged as illustrated in FIG. 73. Hereinafter, such an embodiment will be described as a thirteenth embodiment of the present disclosure with reference to FIGS. 73 and 74. FIG. 73 is an explanatory diagram illustrating a plane of the imaging element 100 according to the present embodiment, and specifically corresponds to a cross-section of the imaging element 100 cut along a plane direction. FIG. 74 is an explanatory diagram illustrating a plane of an imaging element 100 according to a comparative example of the present embodiment, and specifically, corresponds to a cross-section of the imaging element 100 according to the comparative example cut along a plane direction.

As illustrated in FIG. 73, in the present embodiment, the two transfer gates 400*a* and 400*b* are positioned on one end side (for example, the upper side of FIG. 73) of the cell region surrounded by the element separation wall 310. The cell region is included in the imaging element 100. In the example of FIG. 73, the cell region is a square.

The FD portion 601 is a floating diffusion shared by two adjacent cell regions (see a dotted line region in FIG. 73). The FD portion 601 is positioned on one end side (for example, the upper side of FIG. 73) of the cell region. In the example of FIG. 73, the shape of the FD portion 601 is not a regular octagon but an octagon having long sides and short sides. Specifically, the FD portion 601 is horizontally long, and in the FD portion 601, the length in the direction orthogonal to the extension direction of the protruding portion 304 is longer than the length in the extension direction of the protruding portion 304. As the FD portion 601, for example, Poly-Si (polycrystalline Si) is used.

The ground portion 602 is a ground portion shared by two adjacent cell regions (see a dotted line region in FIG. 73). The ground portion 602 is positioned on one end side (for example, the lower side of FIG. 73) of the cell region. In the example of FIG. 73, the shape of the ground portion 602 is not a regular octagon but an octagon having long sides and short sides. Specifically, the ground portion 602 is horizontally long, and in the ground portion 602, a length of the protruding portion 304 in a direction orthogonal to an extension direction is longer than a length of the protruding portion 304 in the extension direction. As the ground portion 602, for example, Poly-Si (polycrystalline Si) is used. The ground portion 602 is at the ground (GND) potential, and functions as, for example, a well contact.

Figure 75:
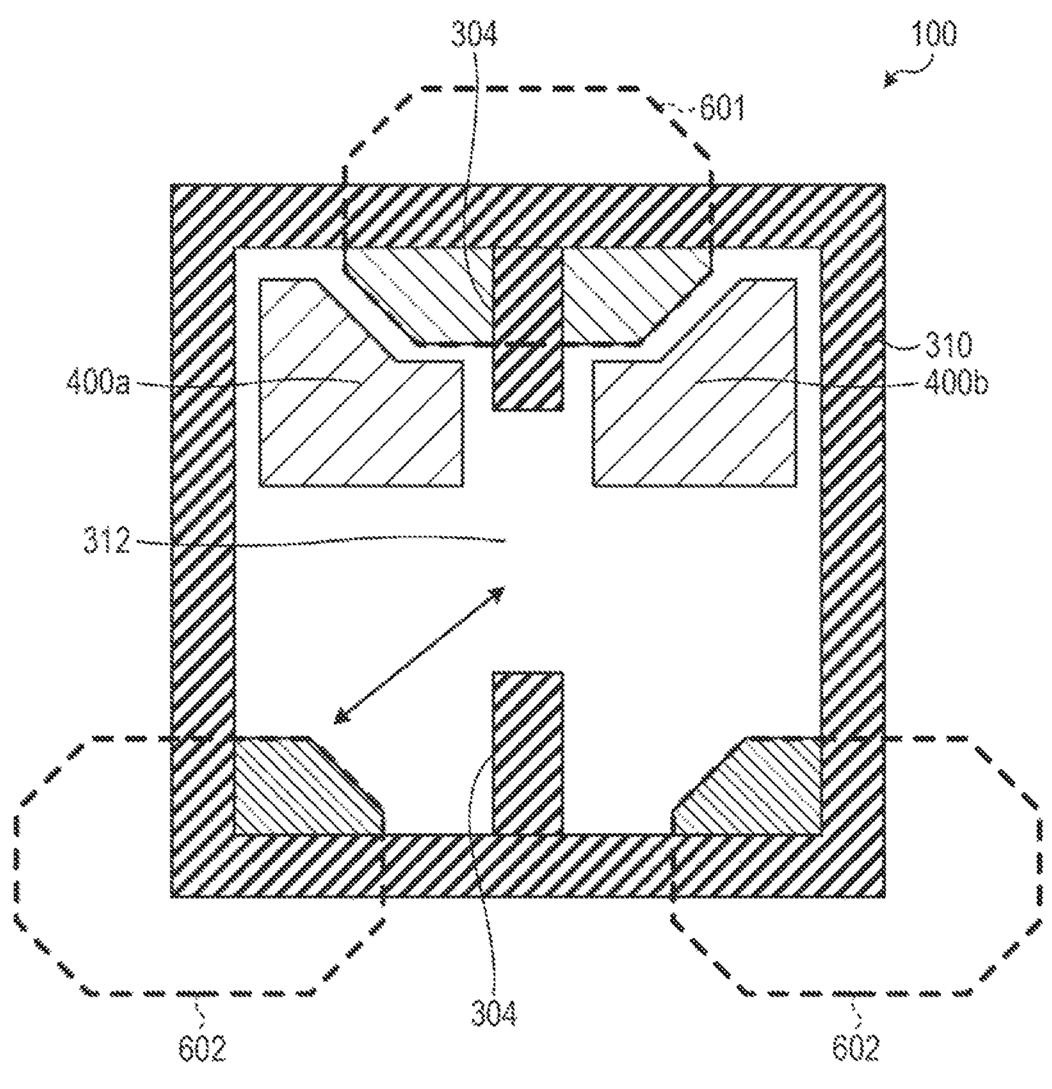
FIG. 75 is an explanatory diagram (part 2) illustrating a plane of the imaging element 100 according to the thirteenth embodiment of the present disclosure.

Here, as illustrated in FIG. 74, when the shape of each of the FD portion 601 and the ground portion 602 is a regular octagon, the width g (the length in the vertical direction in FIG. 74) of the slit 312 is narrower than the width f (the length in the vertical direction in FIG. 75) of the slit 312 illustrated in FIG. 75. In FIG. 74 as described above, the ratio of the width g of the slit 312 to the cell pitch of the cell region (length in the vertical direction in FIG. 74) is increased from the viewpoint of optical factors (improvement in Qe and suppression of color mixing) or further miniaturization. For example, when the width g of the slit 312 illustrated in FIG. 74 increases, the region (division portion) of the slit 312 approaches the FD portion 601 (for example, N+ diffusion layer) and the ground portion 602 (for example, a P+ diffusion layer). Therefore, the FD portion 601 and the ground portion 602 may interfere with the region of the slit 312, and an increase in single pixel Qs variation, FD white spot deterioration, and the like may occur.

Therefore, in the present embodiment, as illustrated in FIG. 73, each of the FD portion 601 and the ground portion 602 has a horizontally long shape. For example, in each of FD portion 601 and ground portion 602, the length of the protruding portion 304 in the extension direction is shorter than the length of the protruding portion 304 in the direction orthogonal to the extension direction. As a result, the FD portion 601 and the ground portion 602 are separated from the region (division portion) of the slit 312 as compared with FIG. 74. Therefore, the influence of the diffusion of the FD portion 601 and the ground portion 602 on the potential of the region of the slit 312 is suppressed. Thus, it is possible to suppress an increase in single pixel Qs variation, FD white spot deterioration, and the like. Furthermore, the shape of each of the transfer gates 400*a* and 400*b*, for example, the shape of the slit 312 side in the transfer gates 400*a* and 400*b* can be enlarged, and transfer improvement (improvement of transfer characteristics) and suppression of variation in potential barriers can be realized.

In the present embodiment, the ground portion 602 can be modified as follows. Therefore, a detailed configuration of the ground portion 602 will be described with reference to FIGS. 75 to 78. Each of FIGS. 75 to 78 is an explanatory diagram illustrating a plane of the imaging element 100 according to the present embodiment, and specifically corresponds to a cross-section of the imaging element 100 cut along a plane direction.

As illustrated in FIG. 75, in the present embodiment, the ground portion 602 is provided at two of the four corners of the cell region. These ground portions 602 are ground portions shared by four adjacent cell regions. In the example of FIG. 75, the cells are provided at the lower left and lower right of the four corners of the cell region. Each ground portion 602 is shifted from the FD portion 601 by a half of the cell pitch (length in the left-right direction in FIG. 75) of the cell region. As a result, each ground portion 602 is further away from the region of the slit 312 as compared with FIGS. 73 and 74. Therefore, an increase in single pixel Qs variation, FD white point deterioration, and the like can be reliably suppressed.

Figure 76:
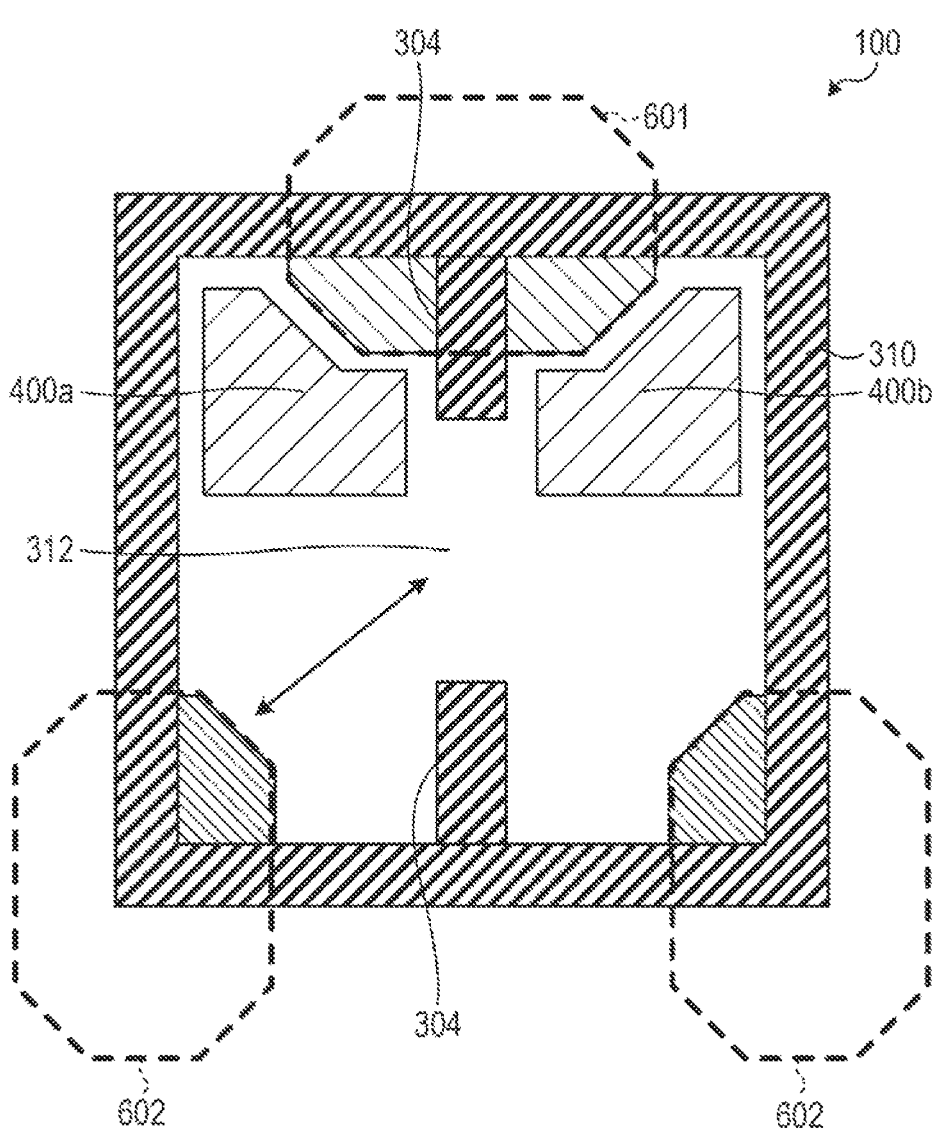
FIG. 76 is an explanatory diagram (part 3) illustrating a plane of the imaging element 100 according to the thirteenth embodiment of the present disclosure.

As illustrated in FIG. 76, in the present embodiment, the ground portion 602 illustrated in FIG. 75 is provided rotated by 90 degrees (the other configurations are the same as those of FIG. 75). As a result, each ground portion 602 is further away from the region of the slit 312 as compared with FIG. 75. Therefore, it is possible to more reliably suppress an increase in single pixel Qs variation, FD white spot deterioration, and the like.

Figure 77:
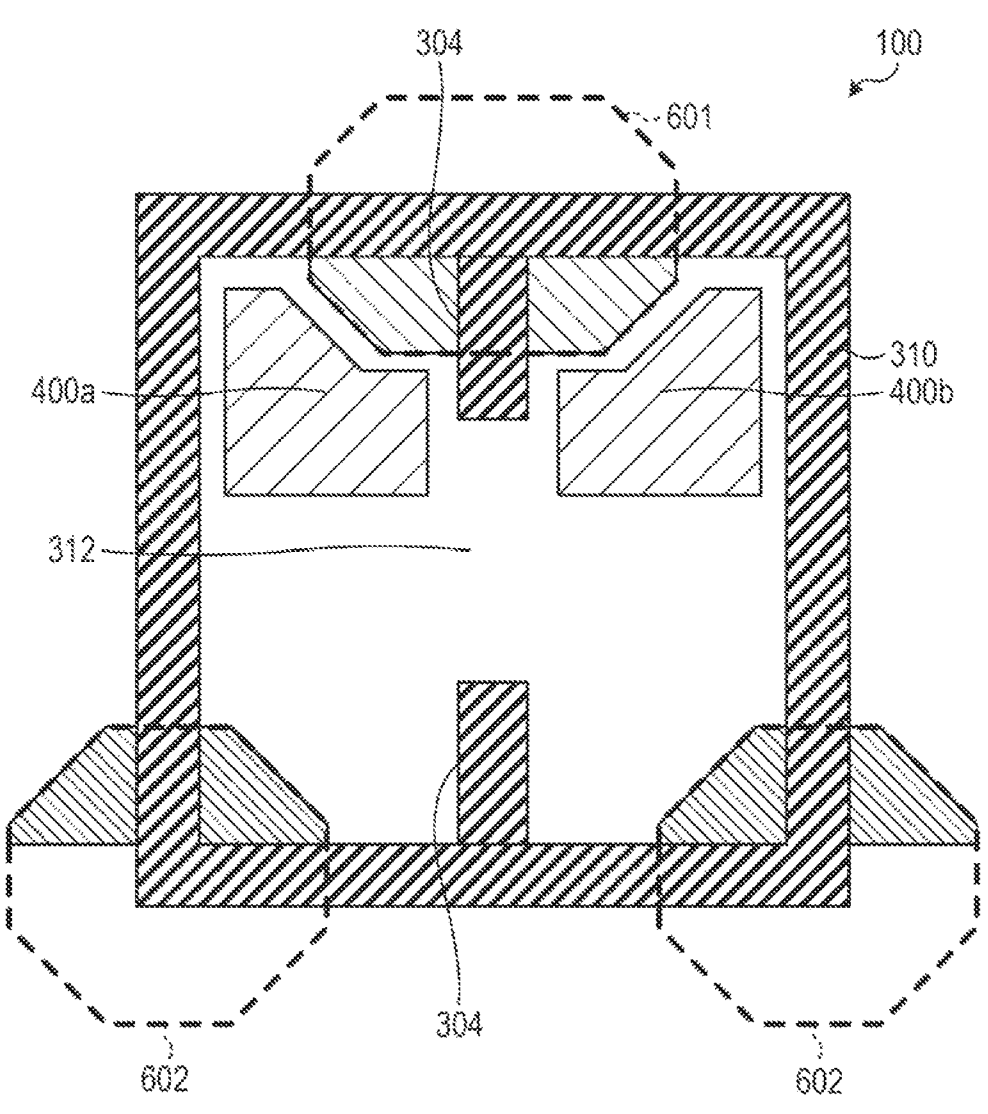
FIG. 77 is an explanatory diagram (part 4) illustrating a plane of the imaging element 100 according to the thirteenth embodiment of the present disclosure.

As illustrated in FIG. 77, in the present embodiment, the ground portion 602 illustrated in FIG. 75 is formed in a regular octagon (the other configurations are the same as those of FIG. 75). Even in this case, each ground portion 602 is separated from the region of the slit 312 as compared with FIG. 74. Therefore, an increase in single pixel Qs variation, FD white point deterioration, and the like can be reliably suppressed.

Figure 78:
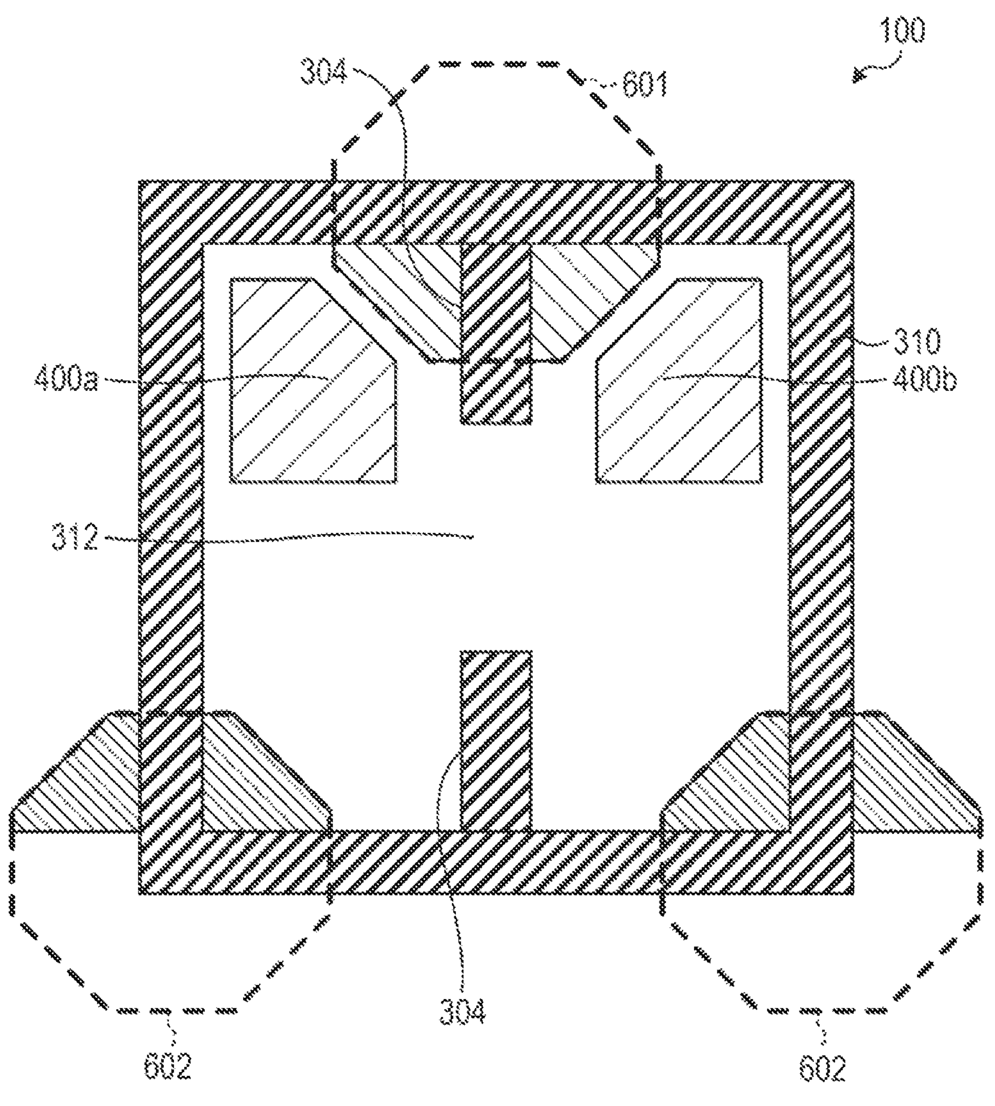
FIG. 78 is an explanatory diagram (part 5) illustrating a plane of the imaging element 100 according to the thirteenth embodiment of the present disclosure.

Furthermore, as illustrated in FIG. 78, in the present embodiment, the FD portion 601 illustrated in FIG. 77 is formed in a regular octagon, and the shapes of the transfer gates 400*a* and 400*b* are the same as those of FIG. 74 (the other configurations are the same as those of FIG. 77). Even in this case, each ground portion 602 is separated from the region of the slit 312 as compared with FIG. 74. Therefore, an increase in single pixel Qs variation, FD white point deterioration, and the like can be reliably suppressed.

Note that the FD portion 601 and the ground portion 602 may have the same shape (see FIGS. 73 to 76 and 78) or different shapes (see FIG. 77). Furthermore, the shape of the FD portion 601 or the ground portion 602 may be a shape having long sides and short sides, for example, a vertically and horizontally symmetrical shape (see FIGS. 73 to 78), or a vertically and horizontally asymmetrical shape.

Furthermore, the FD portion 601 and the ground portion 602 are arranged in an array (for example, a matrix shape along the row direction and the column direction), but may be arranged at the same pitch as the cell pitch of the cell region, or may be arranged by being shifted from each other by a half pitch.

Furthermore, the shape of the FD portion 601 and the ground portion 602 may be, for example, other polygonal shapes or elliptical shapes other than the octagonal shape having the long side and the short side.

16. Summary

As described above, according to each embodiment of the present disclosure, since the element that separates the pair of pixels 300*a* and 300*b* is provided at the time of phase difference detection, and in addition to the separating element, the element that functions as the overflow path at the time of normal imaging is provided, it is possible to avoid deterioration of the captured image while improving the accuracy of phase difference detection.

Note that, in the embodiment of the present disclosure described above, a case where the present disclosure is applied to a back-illuminated CMOS image sensor structure has been described. However, the embodiment of the present disclosure is not limited thereto, and may be applied to other structures.

Note that, in the embodiment of the present disclosure described above, the imaging element 100 in which the first conductivity type is N type, the second conductivity type is P type, and electrons are used as signal charges has been described, but the embodiment of the present disclosure is not limited to such an example. For example, the present embodiment can be applied to the imaging element 100 in which the first conductivity type is P-type, the second conductivity type is N-type, and holes are used as signal charges.

Furthermore, in the embodiment of the present disclosure described above, the semiconductor substrate 10 is not necessarily a silicon substrate, and may be another substrate (for example, a silicon on insulator (SOI) substrate, a SiGe substrate, or the like). In addition, the semiconductor substrate 10 may have a semiconductor structure or the like formed on such various substrates.

Furthermore, the imaging device 1 according to the embodiment of the present disclosure is not limited to an imaging device that detects a distribution of the amount of incident light of visible light and captures the distribution as an image. For example, the present embodiment can be applied to an imaging device that captures a distribution of incident amounts of infrared rays, X-rays, particles, or the like as an image, or an imaging device (physical quantity distribution detection device) such as a fingerprint detection sensor that detects a distribution of other physical quantities such as pressure and capacitance and captures the distribution as an image.

Furthermore, the imaging device 1 according to the embodiment of the present disclosure can be manufactured using a method, a device, and conditions used for manufacturing a general semiconductor device. That is, the imaging device 1 according to the present embodiment can be manufactured using an existing semiconductor device manufacturing process.

Examples of the above-described method include a physical vapor deposition (PVD) method, a chemical vapor deposition (CVD) method, and an atomic layer deposition (ALD) method. Examples of the PVD method include a vacuum vapor deposition method, an electron beam (EB) vapor deposition method, various sputtering methods (Magnetron sputtering method, radio frequency (RF)-direct current (DC) coupled bias sputtering method, electron cyclotron resonance (ECR) sputtering method, counter target sputtering method, high frequency sputtering method, and the like), an ion plating method, a laser ablation method, a molecular beam epitaxy (MBE) method, and a laser transfer method. Examples of the CVD method include a plasma CVD method, a thermal CVD method, an organic metal (MO) CVD method, and a photo CVD method. Further, other methods include an electroplating method, an electroless plating method, a spin coating method; an immersion method; a cast method; a micro contact printing method; a drop cast method; various printing methods such as a screen printing method, an inkjet printing method, an offset printing method, a gravure printing method, and a flexographic printing method; a stamp method; a spray method; and various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method. Furthermore, examples of the patterning method include chemical etching such as shadow mask, laser transfer, and photolithography, and physical etching using ultraviolet rays, laser, or the like. In addition, examples of the planarization technique include a chemical mechanical polishing (CMP) method, a laser planarization method, a reflow method, and the like.

Note that, in the embodiment of the present disclosure described above, the structures of the protruding portions (an example of the separation portion) 304 and 324, the additional walls (an example of the separation portion) 308, 308*a*, 308*b*, and 308*c*, and the pixel separation walls (an example of the separation portion) 334 and 334*a* have been described, but the structure according to the embodiment of the present disclosure is not limited thereto. Here, various aspects of the structure of each part will be described in detail with reference to FIGS. 79 to 84.

Figure 79:
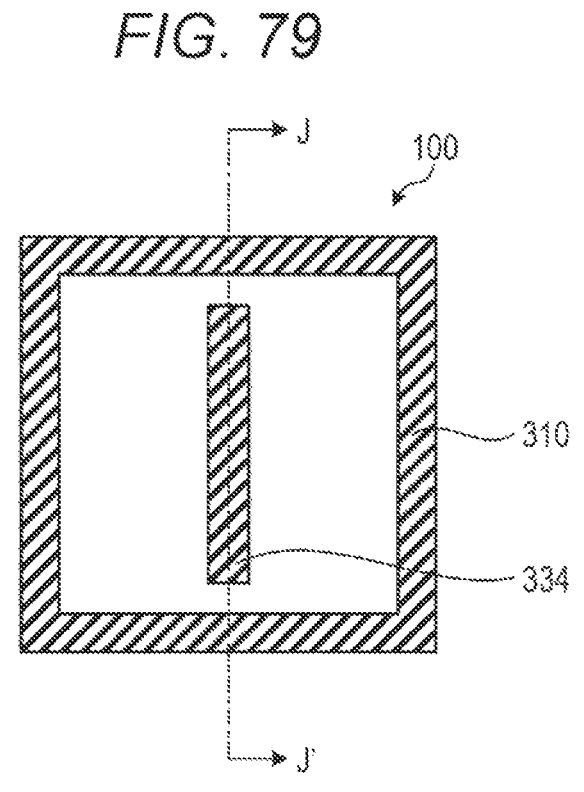
Figure 80:
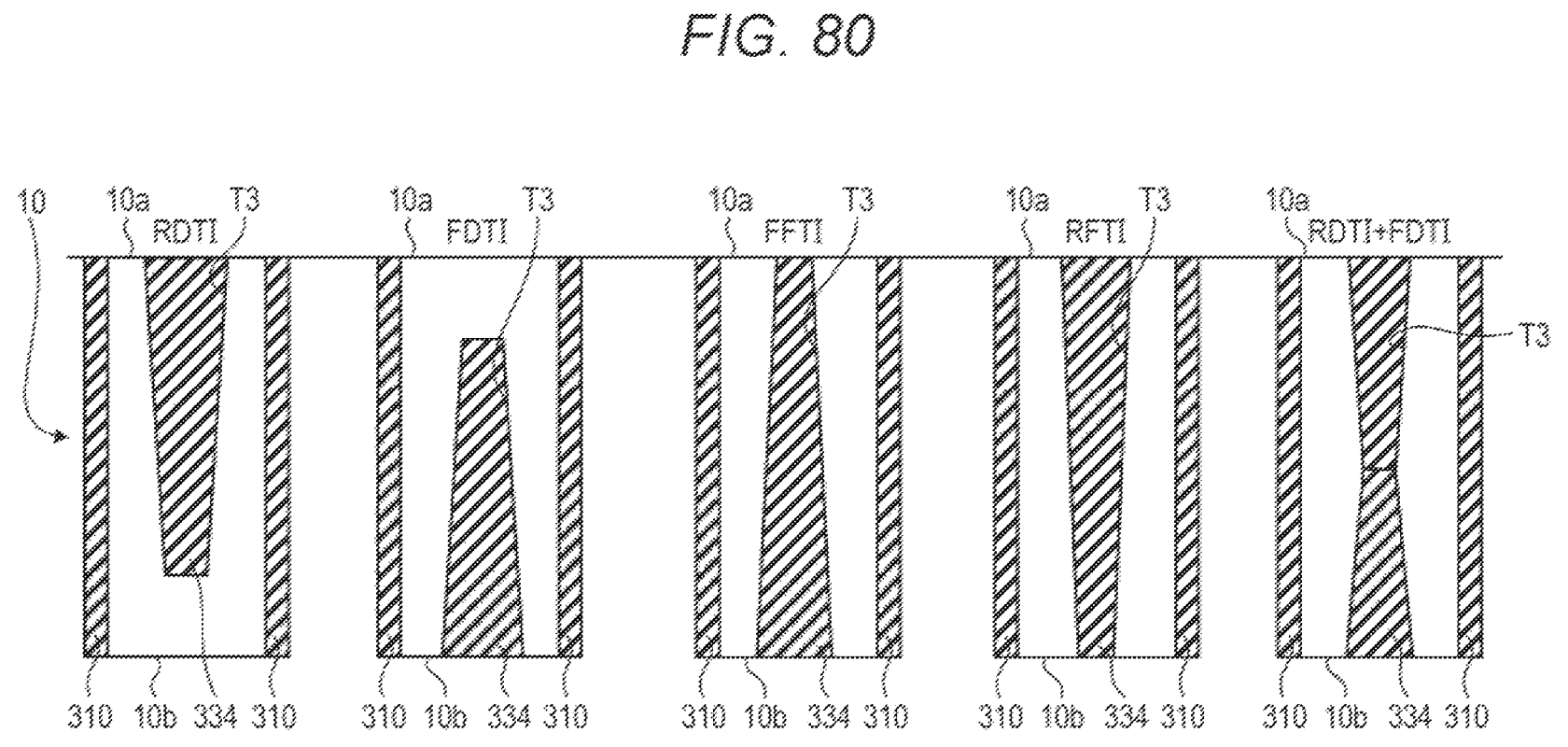

FIG. 79 is an explanatory diagram illustrating a plane of the imaging element 100 according to the present embodiment (modified example), and specifically corresponds to a cross-section of the imaging element 100 cut along a plane direction. FIG. 80 is an explanatory diagram illustrating a part of a cross-section of the imaging element 100 for each structure, that is, the semiconductor substrate 10 for each structure according to the present embodiment (modified example), and specifically, corresponds to a cross-section obtained by cutting the semiconductor substrate 10 for each structure along the line J-J' illustrated in FIG. 79.

As illustrated in FIGS. 79 and 80, the pixel separation wall 334 is formed in any structure of RDTI (back surface DTI), FDTI (front surface DTI), FFTI (front surface FTI: Full Trench Isolation), RFTI (back surface FTI), and RDTI+FDTI. In these structures, the trench T3 is formed in the thickness direction of the semiconductor substrate 10. A material such as an oxide film is embedded in the trench T3. In the example of FIG. 80, the trench T3 is formed in a tapered shape expanding from the surface of the semiconductor substrate 10 toward the inside, but the present invention is not limited thereto. For example, the trench T3 may be formed straight so as to be orthogonal (or substantially orthogonal) to the surface of the semiconductor substrate 10.

The RDTI has a structure in which a trench T3 is formed from the back surface 10*a* (light receiving surface 10*a*) of the semiconductor substrate 10 to the middle of the semiconductor substrate 10. The FDTI has a structure in which a trench is formed from the front surface 10*b* (the surface opposite to the light receiving surface 10*a*) of the semiconductor substrate 10 to the middle of the semiconductor substrate 10. The FFTI is a structure formed by penetrating the trench T3 from the front surface 10*b* to the back surface 10*a* of the semiconductor substrate 10. The RFTI is formed by penetrating the trench T3 from the back surface 10*a* to the front surface 10*b* of the semiconductor substrate 10. The RDTI+FDTI is a method in which the RDTI and the FDTI described above are combined. In the RDTI+FDTI, the trench T3 extending from the back surface 10*a* and the trench T3 extending from the front surface 10*b* are connected near the center in the thickness direction of the semiconductor substrate 10.

Figure 81:
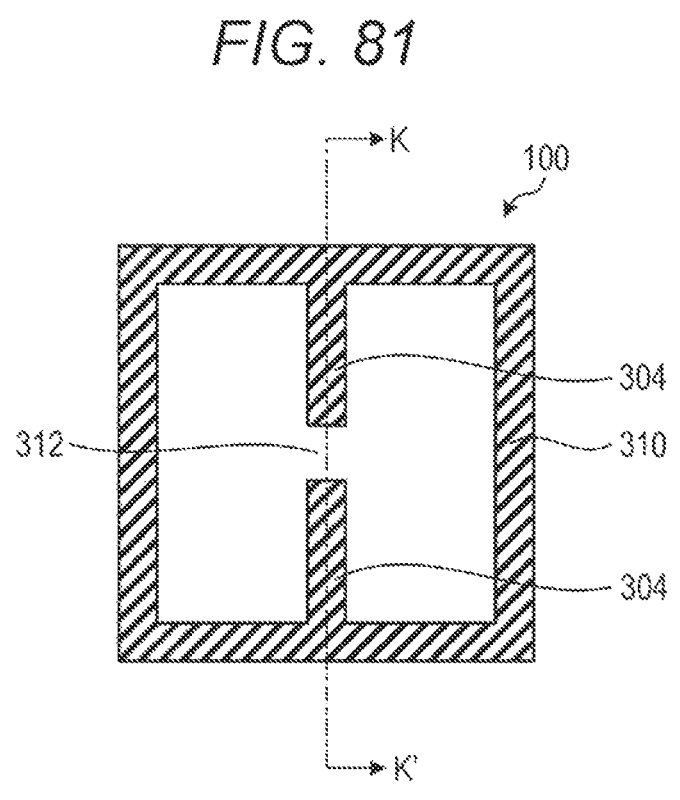
Figure 82:
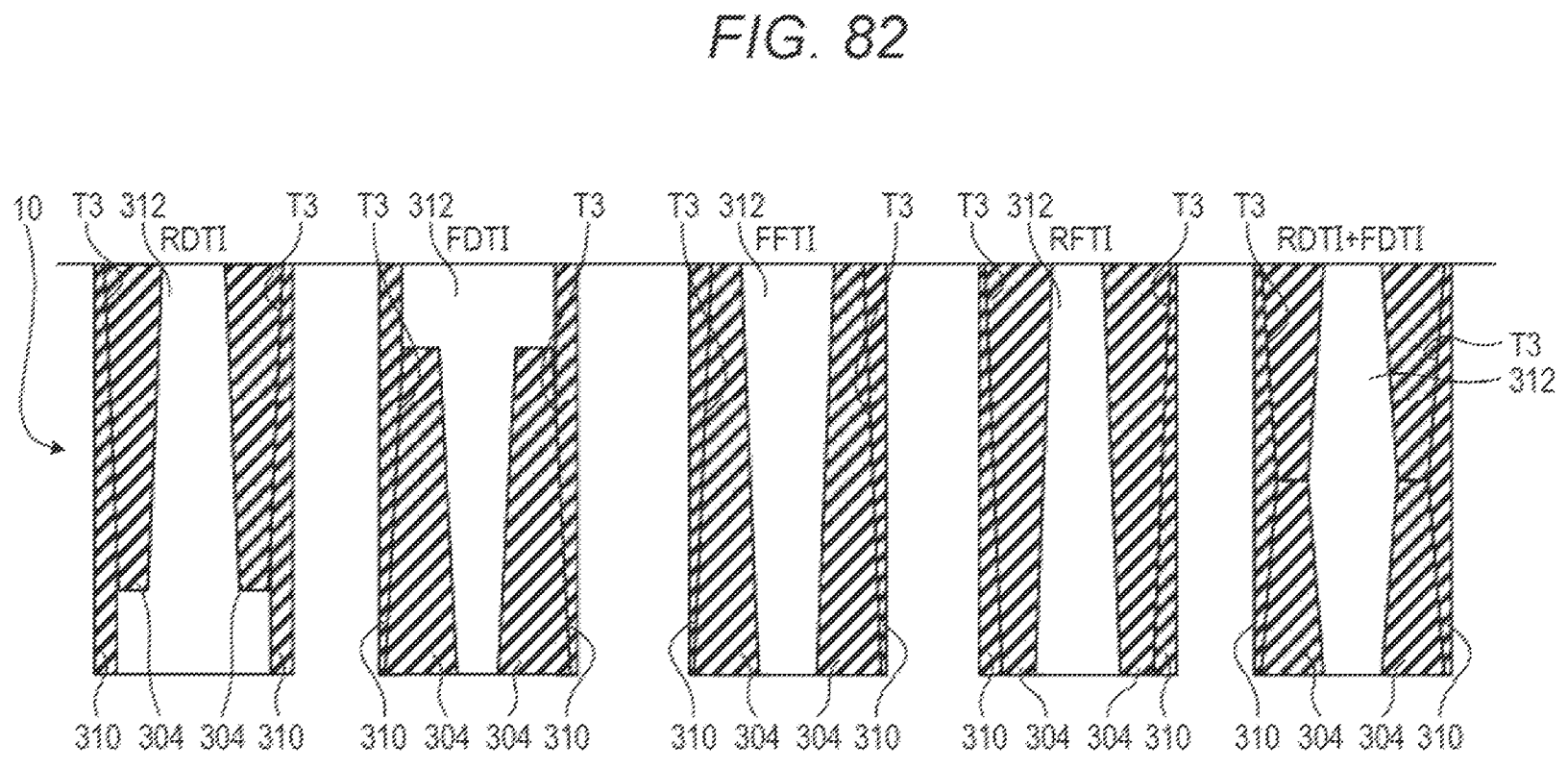

FIG. 81 is an explanatory diagram illustrating a plane of the imaging element 100 according to the present embodiment (modified example), and specifically corresponds to a cross-section of the imaging element 100 cut along a plane direction. FIG. 82 is an explanatory diagram illustrating a part of a cross-section of the imaging element 100 for each structure, that is, the semiconductor substrate 10 for each structure according to the present embodiment (modified example), and specifically, corresponds to a cross-section obtained by cutting the semiconductor substrate 10 for each structure along the line K-K' illustrated in FIG. 81.

As illustrated in FIGS. 81 and 82, the protruding portion 304 is formed in any structure of RDTI, FDTI, FFTI, RFTI, and RDTI+FDTI similarly to the above-described pixel separation wall 334 (see FIG. 80). In these structures, the trench T3 is formed in the thickness direction of the semiconductor substrate 10. At this time, as illustrated in FIG. 82, the trench T3 is formed such that the protruding portion 304 is in contact with the element separation wall 310 and is not separated from each other. A material to be an oxide film or the like is embedded in the trench T3. In the example of FIG. 82, the trench T3 is formed in a tapered shape expanding from the surface of the semiconductor substrate 10 toward the inside, but the present invention is not limited thereto. For example, the trench T3 may be formed straight so as to be orthogonal (or substantially orthogonal) to the surface of the semiconductor substrate 10.

Figures 83, 84:
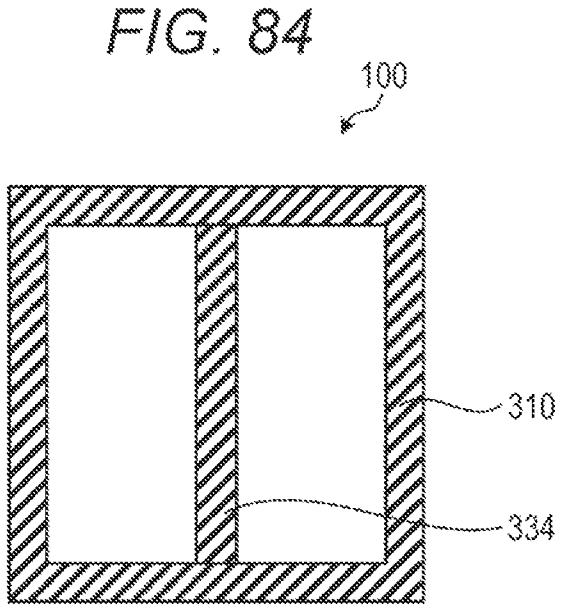
FIG. 83 is an explanatory diagram (part 3) illustrating a plane of an imaging element 100 according to another embodiment of the present disclosure.
FIG. 84 is an explanatory diagram (part 4) illustrating a plane of an imaging element 100 according to another embodiment of the present disclosure.

Here, as illustrated in FIG. 79, as the pixel separation wall 334, another structure may be used in addition to one pixel separation wall 334 that is not in contact with the element separation wall 310. For example, as illustrated in FIG. 83, a plurality of pixel separation walls 334 may be formed in a line in a dot shape so as not to be in contact with the element separation wall 310. In the example of FIG. 83, the number of pixel separation walls 334 is 6, but the number is not limited. Furthermore, as illustrated in FIG. 84, the pixel separation wall 334 may be formed such that both ends thereof are in contact with the element separation wall 310. Note that, in the examples of FIGS. 79, 83, and 84, the pixel separation wall 334 is formed in the column direction, but is not limited thereto, and may be formed in the row direction, for example.

In addition, the structures of the RDTI, the FDTI, the FFTI, the RFTI, and the RDTI+FDTI described above can be applied not only to the pixel separation wall 334 and the protruding portion 304 described above but also to the second protruding portion 324, the pixel separation wall 334*a*, the additional walls 308, 308*a*, 308*b*, and 308*c* according to the respective embodiments described above.

Figure 85:
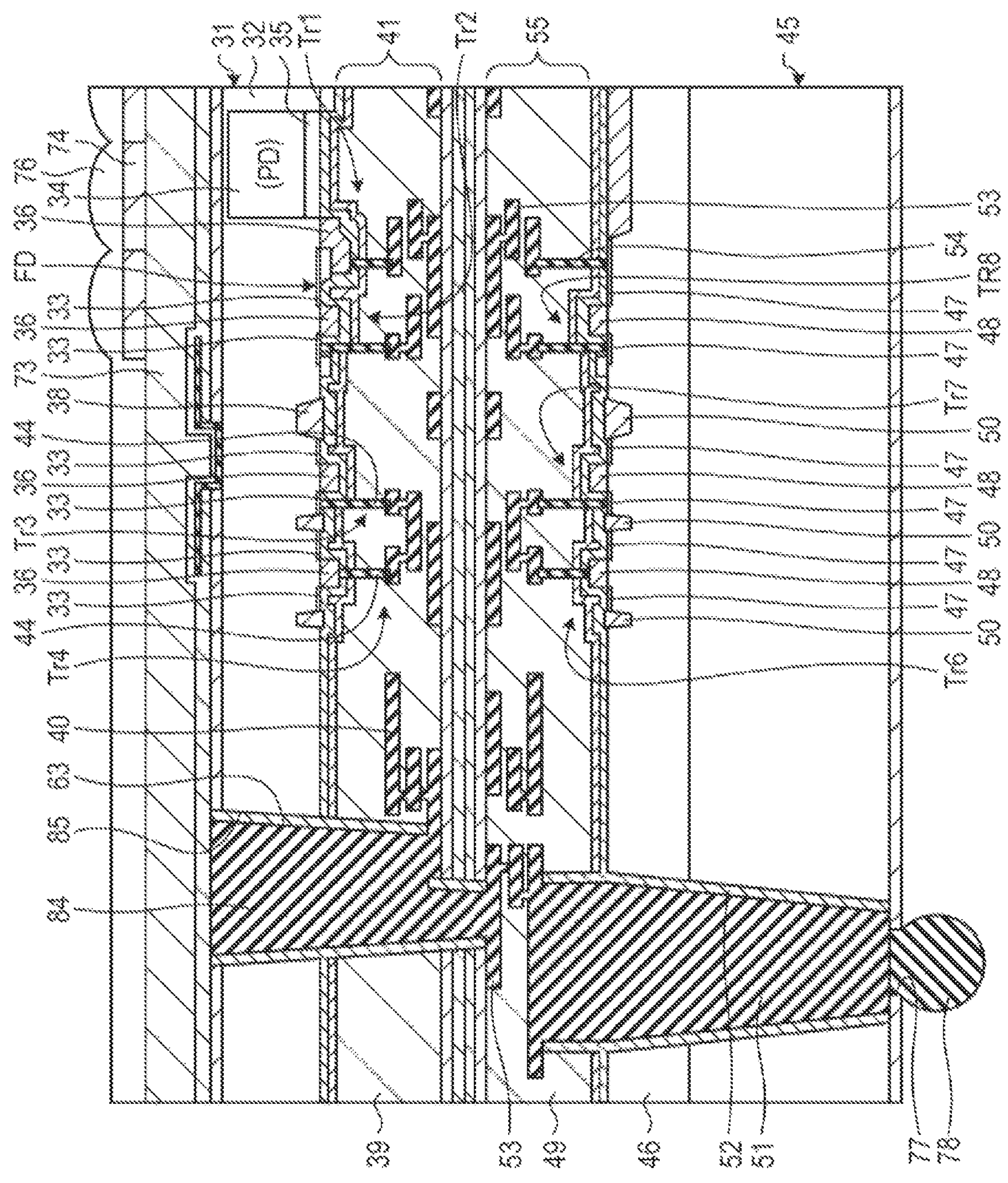
FIG. 85 is an explanatory diagram illustrating a cross-section of a two-layer stacked structure to which the imaging device 1 according to the embodiment of the present disclosure can be applied.
Figure 86:
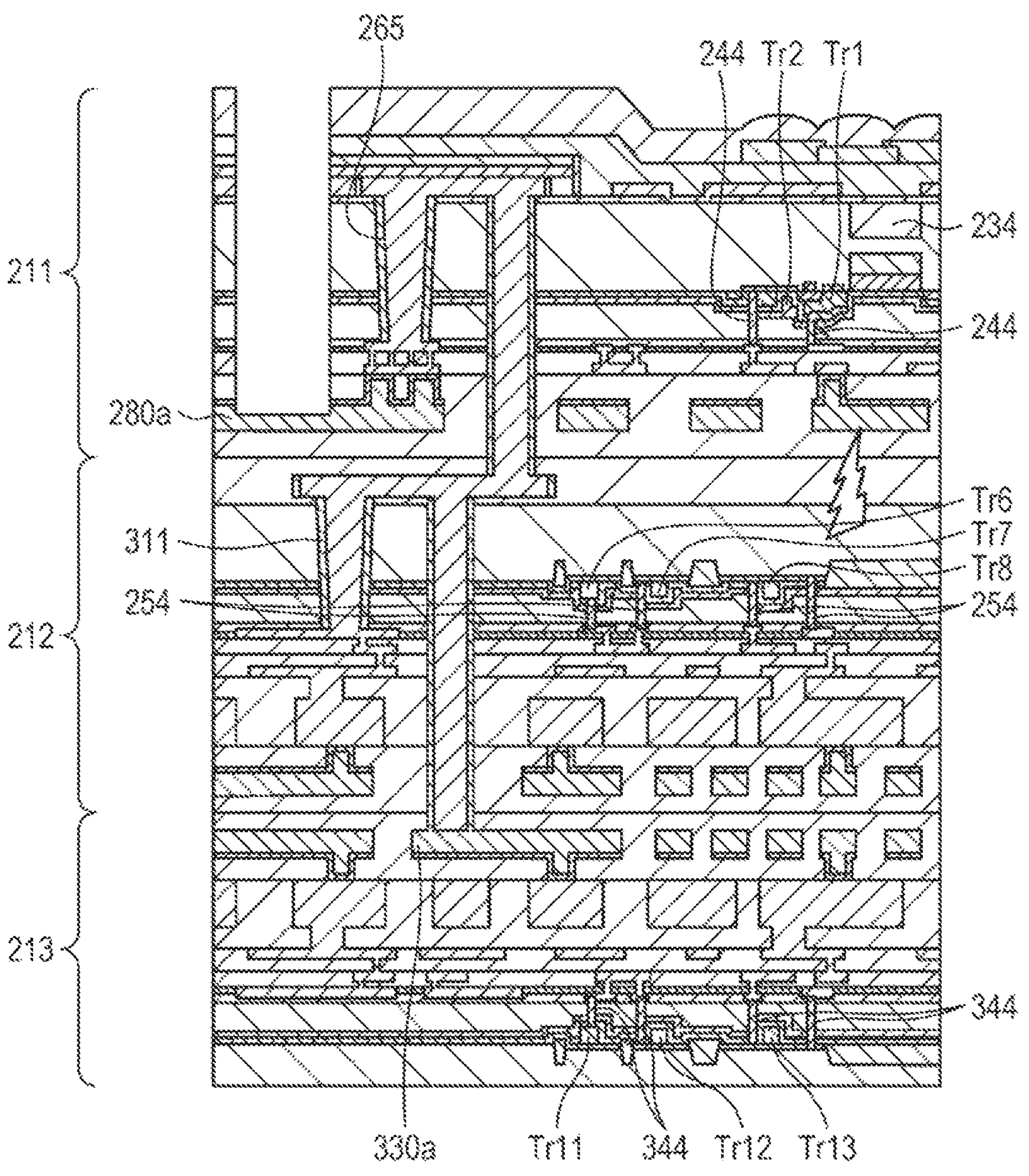
FIG. 86 is an explanatory diagram illustrating a cross-section of a three-layer stacked structure to which the imaging device 1 according to the embodiment of the present disclosure can be applied.
Figure 87:
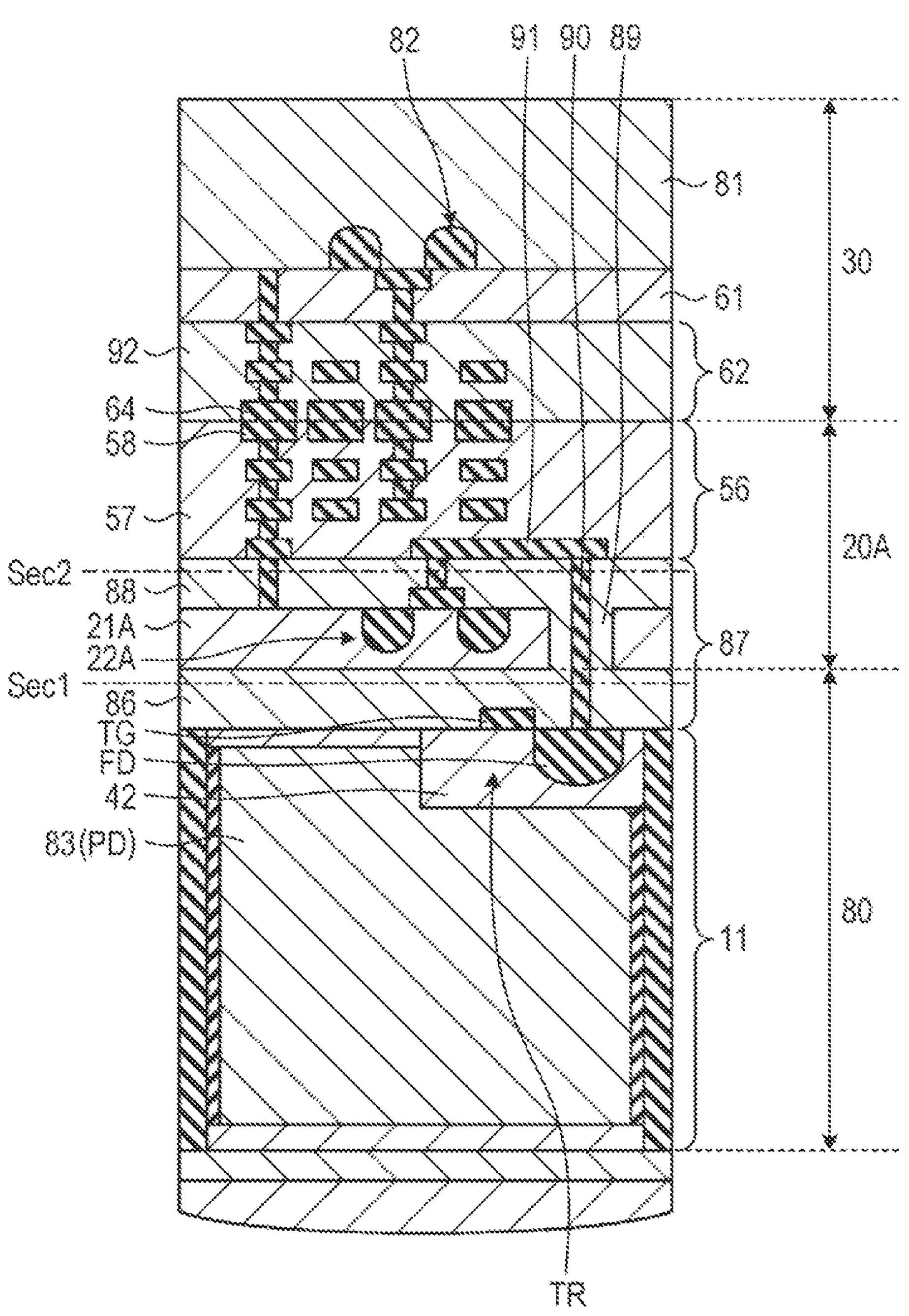
FIG. 87 is an explanatory diagram illustrating a cross-section of a two-stage pixel structure to which the imaging device 1 according to the embodiment of the present disclosure is applicable.

Note that, in the embodiment of the present disclosure described above, a case where the present disclosure is applied to a one-layer CMOS image sensor structure has been described. However, the embodiment of the present disclosure is not limited thereto, and may be applied to other structures such as a stacked CMOS image sensor (CIS) structure. For example, as illustrated in FIGS. 85 to 87, the embodiments of the present disclosure may be applied to a two-layer stacked CIS, a three-layer stacked CIS, a two-stage pixel CIS, or the like. Application to the two-stage pixel CIS is an example, and application to one-stage pixel is also possible. Here, the structures of the two-layer stacked CIS, the three-layer stacked CIS, and the two-stage pixel CIS will be described in detail with reference to FIGS. 85 to 87.

(Two-Layer Stacked CIS)

FIG. 85 illustrates an example of a two-layer stacked structure to which the embodiment of the present disclosure is applicable. FIG. 85 is an explanatory diagram illustrating a cross-section of a two-layer stacked structure to which the imaging device 1 according to the embodiment of the present disclosure can be applied.

In the structure illustrated in FIG. 85, the imaging device 1 is configured by electrically connecting the pixel region (pixel array unit 20) and the control circuit unit 25 on the first semiconductor substrate 31 side and the logic circuit (not illustrated) on the second semiconductor substrate 45 side by one through-connection conductor 84 formed on the first semiconductor substrate 31. That is, in the example of FIG. 85, the first semiconductor substrate 31 and the second semiconductor substrate 45 are stacked, and these semiconductor substrates 31 and 45 are electrically connected by the through-connection conductor 84. Specifically, a through-connection hole 85 that penetrates the first semiconductor substrate 31 from the back surface 31*b* side of the first semiconductor substrate, reaches the uppermost layer wiring 53 of the second semiconductor substrate 45, and reaches the uppermost layer wiring 40 of the first semiconductor substrate 31 is formed. After the insulating film 63 is formed on the inner wall surface of the through-connection hole 85, a through-connection conductor 84 that connects the wiring 40 on the pixel region and control circuit unit 25 side and the wiring 53 on the logic circuit side is embedded in the through-connection hole 85. In FIG. 85, since the through-connection conductor 84 is connected to the uppermost layer wiring 40, the wirings 40 of the respective layers are connected to each other such that the connected uppermost layer wiring 40 becomes a connection end.

In the structure illustrated in FIG. 85, a photodiode (PD) serving as a photoelectric conversion unit of each pixel is formed in the semiconductor well region 32 of the first semiconductor substrate 31. Further, a source/drain region 33 of each pixel transistor is formed in the semiconductor well region 32. The semiconductor well region 32 is formed by introducing p-type impurities, for example, and the source/drain region 33 is formed by introducing n-type impurities, for example. Specifically, the photodiode (PD) and the source/drain region 33 of each pixel transistor are formed by ion implantation from the substrate surface.

The photodiode (PD) has an n-type semiconductor region 34 and a p-type semiconductor region 35 on the substrate surface side. A gate electrode 36 is formed on the surface of the substrate constituting the pixel via a gate insulating film, and pixel transistors Tr1 and Tr2 are formed by the gate electrode 36 and a pair of source/drain regions 33. For example, the pixel transistor Tr1 adjacent to the photodiode (PD) corresponds to a transfer transistor, and its source/drain region corresponds to a floating diffusion (FD). Unit pixels are separated by the element separation region 38.

On the first semiconductor substrate 31, MOS transistors Tr3, Tr4 constituting a control circuit are formed. The MOS transistors Tr3 and Tr4 are formed by an n-type source/drain region 33 and a gate electrode 36 formed via a gate insulating film. Furthermore, a first interlayer insulating film 39 is formed on the surface of the first semiconductor substrate 31, and a connection conductor 44 connected to a required transistor is formed in the interlayer insulating film 39. In addition, the multilayer wiring layer 41 is formed of the plurality of layers of wiring 40 via the interlayer insulating film 39 so as to be connected to each connection conductor 44.

In addition, as illustrated in FIG. 85, a plurality of MOS transistors constituting a logic circuit separated by the element separation region 50 is formed in the p-type semiconductor well region 46 on the front surface side of the second semiconductor substrate 45. Each of the MOS transistors Tr6, Tr7, and Tr8 has a pair of n-type source/drain regions 47 and a gate electrode 48 formed via a gate insulating film. Furthermore, a first interlayer insulating film 49 is formed on the surface of the second semiconductor substrate 45, and a connection conductor 54 connected to a required transistor is formed in the interlayer insulating film 49. Furthermore, a connection conductor 51 penetrating from the surface of the interlayer insulating film 49 to a desired depth in the second semiconductor substrate 45 is provided. Furthermore, an insulating film 52 for insulating the connection conductor 51 and the semiconductor substrate 45 is provided.

In addition, the multilayer wiring layer 55 is formed by providing a plurality of layers of wiring 53 in the interlayer insulating film 49 so as to be connected to each of the connection conductors 54 and the connection conductor 51 for electrode extraction.

Furthermore, as illustrated in FIG. 85, the first semiconductor substrate 31 and the second semiconductor substrate 45 are bonded to each other such that the multilayer wiring layers 41 and 55 face each other.

In addition, as illustrated in FIG. 85, for example, on-chip color filters 74 of red (R), green (G), and blue (B) are provided on the flattening film 73 corresponding to each pixel, and an on-chip microlens 75 is provided thereon.

On the other hand, on the second semiconductor substrate 45 side, an opening 77 corresponding to the connection conductor 51 is provided, and a spherical electrode bump 78 electrically connected to the connection conductor 51 through the opening 77 is provided.

(Three-Layer Stacked CIS)

FIG. 86 illustrates an example of a three-layer stacked structure to which the embodiment of the present disclosure is applicable. FIG. 86 is an explanatory diagram illustrating a cross-section of a three-layer stacked structure to which the imaging device 1 according to the embodiment of the present disclosure can be applied.

In the structure illustrated in FIG. 86, the imaging device 1 has a three-layer stacked structure in which a first semiconductor substrate 211, a second semiconductor substrate 212, and a third semiconductor substrate 213 are stacked. Specifically, in the structure illustrated in FIG. 86, for example, in addition to the first semiconductor substrate 211 on which a sensor circuit is formed and the second semiconductor substrate 212 on which a logic circuit is formed, the third semiconductor substrate 213 on which a memory circuit is formed is included. Note that the logic circuit and the memory circuit are configured to operate together with input and output of signals to and from the outside.

As illustrated in FIG. 86, a photodiode (PD) 234 serving as a photoelectric conversion unit of a pixel is formed in the first semiconductor substrate 211, and a source/drain region of each pixel transistor is formed in the semiconductor well region. Furthermore, a gate electrode is formed on the substrate surface of the first semiconductor substrate 211 via a gate insulating film, and a pixel transistor Tr1 and a pixel transistor Tr2 are provided by source/drain regions paired with the gate electrode. Specifically, the pixel transistor Tr1 adjacent to the photodiode (PD) 234 corresponds to a transfer transistor, and its source/drain region corresponds to a floating diffusion (FD). Furthermore, an interlayer insulating film (not illustrated) is provided on the first semiconductor substrate 211, and a connection conductor 244 connected to the pixel transistors Tr1 and Tr2 is provided in the interlayer insulating film.

Furthermore, the first semiconductor substrate 211 is provided with a contact 265 used for electrical connection with the second semiconductor substrate 212. The contact 265 is connected to a contact 311 of the second semiconductor substrate 212 to be described later, and is also connected to a pad 280*a* of the first semiconductor substrate 211.

On the other hand, a logic circuit is formed on the second semiconductor substrate 212. Specifically, the MOS transistor Tr6, the MOS transistor Tr7, and the MOS transistor Tr8, which are a plurality of transistors constituting a logic circuit, are formed in a p-type semiconductor well region (not illustrated) of the second semiconductor substrate 212. Furthermore, in the second semiconductor substrate 212, a connection conductor 254 connected to the MOS transistor Tr6, the MOS transistor Tr7, and the MOS transistor Tr8 is formed.

Furthermore, a contact 311 used for electrical connection with the first semiconductor substrate 211 and the third semiconductor substrate 213 is formed on the second semiconductor substrate 212. The contact 311 is connected to the contact 265 of the first semiconductor substrate 211 and is also connected to the pad 330*a* of the third semiconductor substrate 213.

Further, a memory circuit is formed on the third semiconductor substrate 213. Specifically, the MOS transistor Tr11, the MOS transistor Tr12, and the MOS transistor Tr13, which are a plurality of transistors constituting a memory circuit, are formed in a p-type semiconductor well region (not illustrated) of the third semiconductor substrate 213.

Furthermore, in the third semiconductor substrate 213, a connection conductor 344 connected to the MOS transistor Tr11, the MOS transistor Tr12, and the MOS transistor Tr13 is formed.

(Two-Stage Pixel CIS)

FIG. 87 illustrates an example of a two-stage pixel structure to which the embodiment of the present disclosure is applicable. FIG. 87 is an explanatory diagram illustrating a cross-section of a two-stage pixel structure to which the imaging device 1 according to the embodiment of the present disclosure can be applied.

In the structure illustrated in FIG. 87, a first substrate 80 is configured by stacking an insulating layer 86 on a semiconductor substrate 11. The first substrate 80 includes an insulating layer 86 as a part of the interlayer insulating film 87. The insulating layer 86 is provided in a gap between the semiconductor substrate 11 and a semiconductor substrate 21A described later. The first substrate 80 includes a photodiode PD (83), a transfer transistor TR, and a floating diffusion FD. The first substrate 80 has a configuration in which the transfer transistor TR and the floating diffusion FD are provided in a portion on the front surface side (side opposite to light incident surface side, second substrate 20A side) of the semiconductor substrate 11.

In the structure illustrated in FIG. 87, the transfer transistor TR has a planar transfer gate TG. However, the present invention is not limited to such a configuration, and the transfer gate TG may be a vertical transfer gate penetrating the well layer 42.

The second substrate 20A is formed by stacking an insulating layer 88 on a semiconductor substrate 21A. The second substrate 20A includes an insulating layer 88 as a part of the interlayer insulating film 87. The insulating layer 88 is provided in a gap between the semiconductor substrate 21A and the semiconductor substrate 81. The second substrate 20A includes a readout circuit 22A. Specifically, the second substrate 20A has a configuration in which the readout circuit 22A is provided in a portion on the front surface side (third substrate 30 side) of the semiconductor substrate 21A. The second substrate 20A is bonded to the first substrate 80 with the back surface of the semiconductor substrate 21A facing the front surface side of the semiconductor substrate 11. That is, the second substrate 20A is bonded to the first substrate 80 in a face-to-back manner. The second substrate 20A further includes an insulating layer 89 penetrating the semiconductor substrate 21A in the same layer as the semiconductor substrate 21A. The second substrate 20A includes an insulating layer 89 as a part of the interlayer insulating film 87.

The stacked structure including the first substrate 80 and the second substrate 20A has an interlayer insulating film 87 and a through-wiring 90 provided in the interlayer insulating film 87. Specifically, the through-wiring 90 is electrically connected to the floating diffusion FD and a connection wiring 91 to be described later. The second substrate 20A further includes, for example, a wiring layer 56 on the insulating layer 88.

The wiring layer 56 further includes, for example, a plurality of pad electrodes 58 in the insulating layer 57. Each pad electrode 58 is made of metal such as copper (Cu) or aluminum (Al), for example. Each pad electrode 58 is exposed on the surface of the wiring layer 56. Each pad electrode 58 is used for electrical connection between the second substrate 20A and the third substrate 30 and bonding between the second substrate 20A and the third substrate 30.

The third substrate 30 is formed by stacking an interlayer insulating film 61 on a semiconductor substrate 81, for example. As will be described later, the third substrate 30 is bonded to the second substrate 20A on the front surface side. The third substrate 30 has a configuration in which the logic circuit 82 is provided in a portion on the front surface side of the semiconductor substrate 81. The third substrate 30 further includes, for example, a wiring layer 62 on the interlayer insulating film 61. The wiring layer 62 includes, for example, an insulating layer 92 and a plurality of pad electrodes 64 provided in the insulating layer 92. The plurality of pad electrodes 64 is electrically connected to the logic circuit 82. Each pad electrode 64 is made of, for example, Cu (copper). Each pad electrode 64 is exposed on the surface of the wiring layer 62. Each pad electrode 64 is used for electrical connection between the second substrate 20A and the third substrate 30 and bonding between the second substrate 20A and the third substrate 30.

Figure 88:
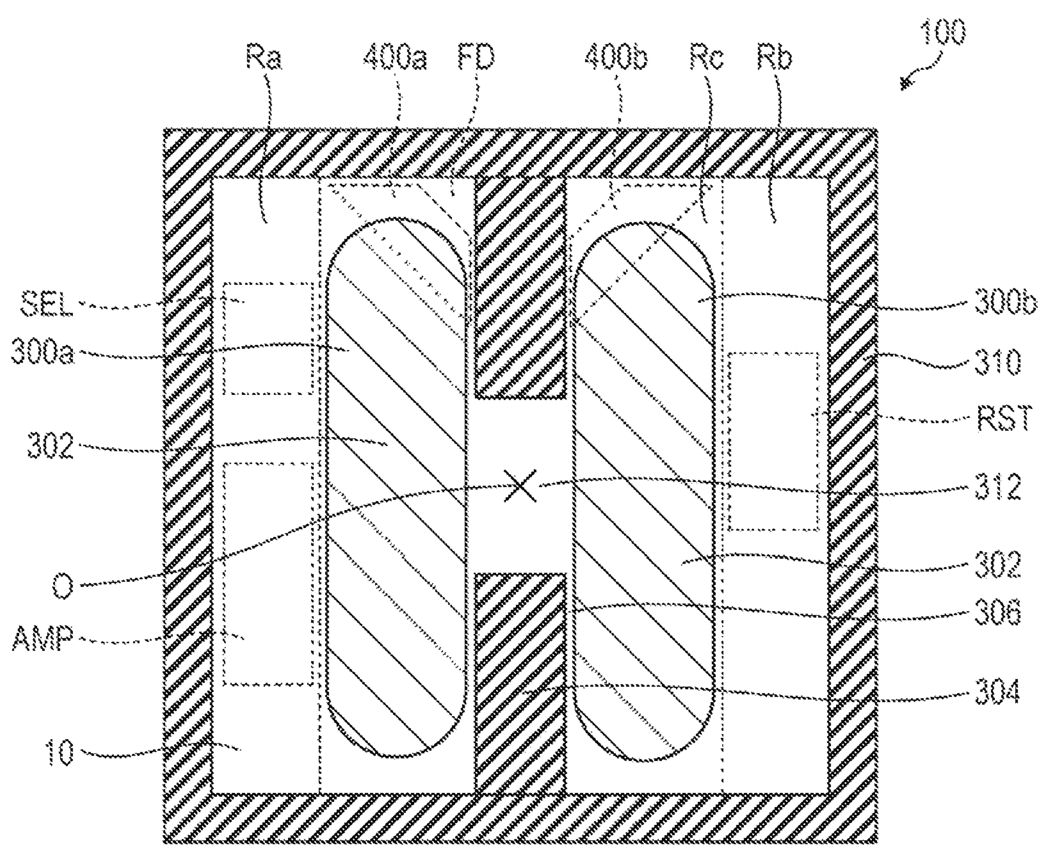
FIG. 88 is an explanatory diagram illustrating a plane of an imaging element 100 according to an embodiment of the present disclosure.

Note that, in a case where the technology of the present disclosure is applied to a single-stage pixel (normal CIS), as an example, as illustrated in FIG. 88, transistors (for example, CMOS transistors) other than the transfer gates 400*a* and 400*b* can be arranged in the two pixel transistor regions Ra and Rb in the imaging element 100. The floating diffusion FD is provided at a position adjacent to the transfer gates 400*a* and 400*b*. In the example of FIG. 88, the pixel transistor regions Ra and Rb are formed so as to sandwich the pixel region Rc including the pixels 300*a* and 300*b*. The selection transistor SEL and the amplification transistor AMP are arranged in the pixel transistor region Ra on the left side in FIG. 88, and the reset transistor RST is arranged in the pixel transistor region Rb on the right side in FIG. 88. The pixel sharing system, the arrangement of the transistors, the embedded structure of the photodiode, and the like according to FIG. 88 are merely examples, and the present invention is not limited thereto.

Figure 89:
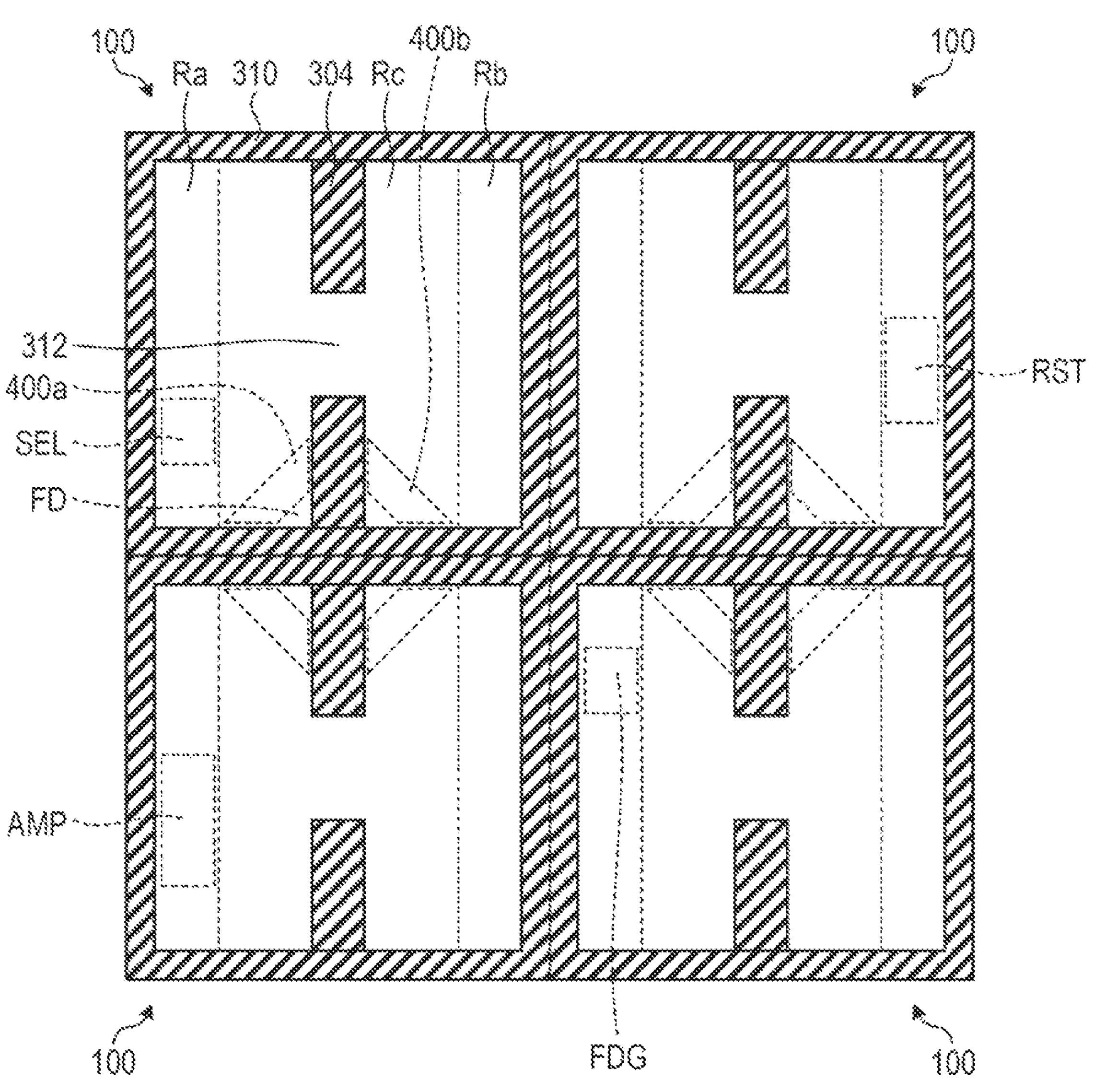
FIG. 89 is an explanatory diagram illustrating planes of a plurality of imaging elements 100 according to an embodiment of the present disclosure.

Furthermore, the imaging element 100 illustrated in FIG. 88 may be arranged as illustrated in FIG. 89 (repeated arrangement), and one selection transistor SEL, one amplification transistor AMP, one reset transistor RST, and one FD transfer transistor FDG may be arranged in each of the pixel transistor regions Ra and Rb of each imaging element 100. The FD transfer transistor FDG is used to switch the conversion efficiency. The arrangement of each transistor may be equal or unequal to each of the pixel transistor regions Ra and Rb. For example, a plurality of amplification transistors AMP may be arranged for four imaging elements 100, and the amplification transistors AMP can be arranged in parallel.

17. Application Example to Camera

Figure 90:
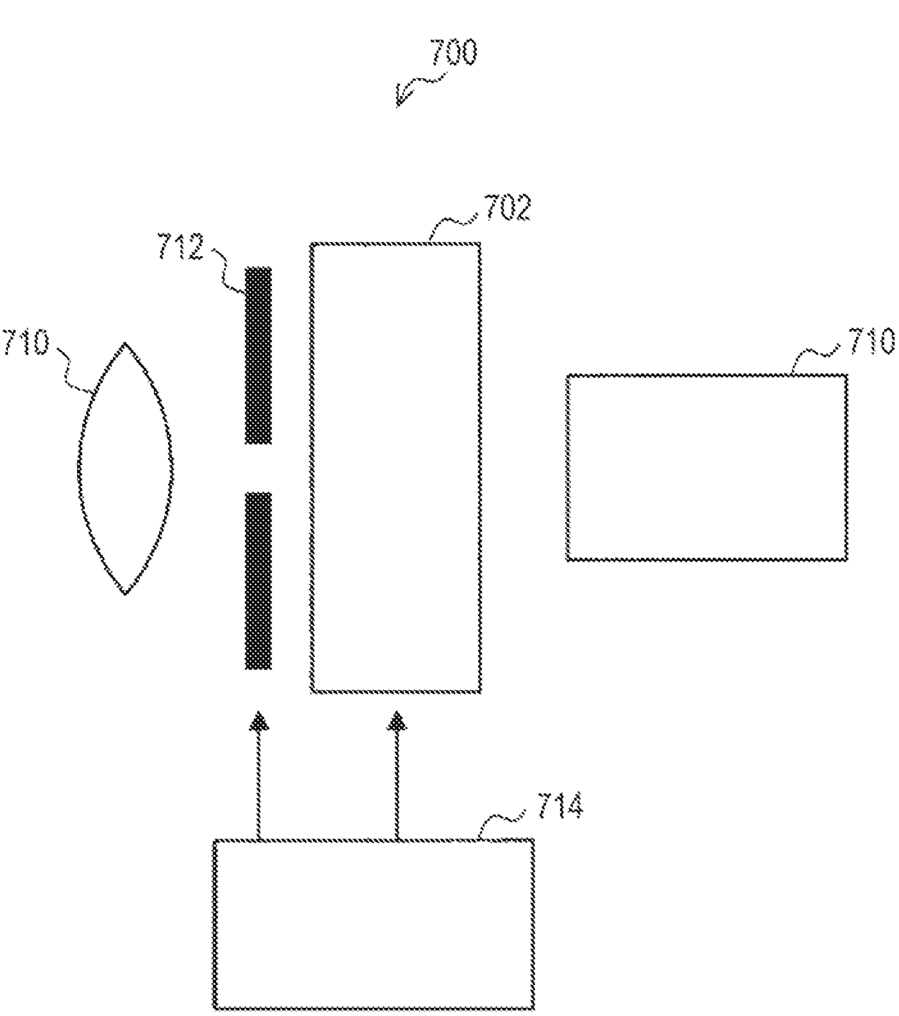
FIG. 90 is an explanatory diagram illustrating an example of a schematic functional configuration of a camera.

The technology (present technology) according to the present disclosure can be further applied to various products. For example, the technology according to the present disclosure may be applied to a camera or the like. Therefore, a configuration example of a camera 700 as an electronic device to which the present technology is applied will be described with reference to FIG. 90. FIG. 90 is an explanatory diagram illustrating an example of a schematic functional configuration of a camera 700 to which the technology according to the present disclosure (the present technology) can be applied.

As illustrated in FIG. 90, the camera 700 includes an imaging device 702, an optical lens 710, a shutter mechanism 712, a drive circuit unit 714, and a signal processing circuit unit 716. The optical lens 710 forms an image of image light (incident light) from a subject on an imaging surface of the imaging device 702. As a result, signal charges are accumulated in the imaging element 100 of the imaging device 702 for a certain period of time. The shutter mechanism 712 opens and closes to control a light irradiation period and a light shielding period for the imaging device 702. The drive circuit unit 714 supplies a drive signal for controlling a signal transfer operation of the imaging device 702, a shutter operation of the shutter mechanism 712, and the like to these. That is, the imaging device 702 performs signal transfer on the basis of the drive signal (timing signal) supplied from the drive circuit unit 714. The signal processing circuit unit 716 performs various types of signal processing. For example, the signal processing circuit unit 716 outputs the video signal subjected to the signal processing to, for example, a storage medium (not illustrated) such as a memory, or to a display unit (not illustrated).

18. Application Example to Smartphone

Figure 91:
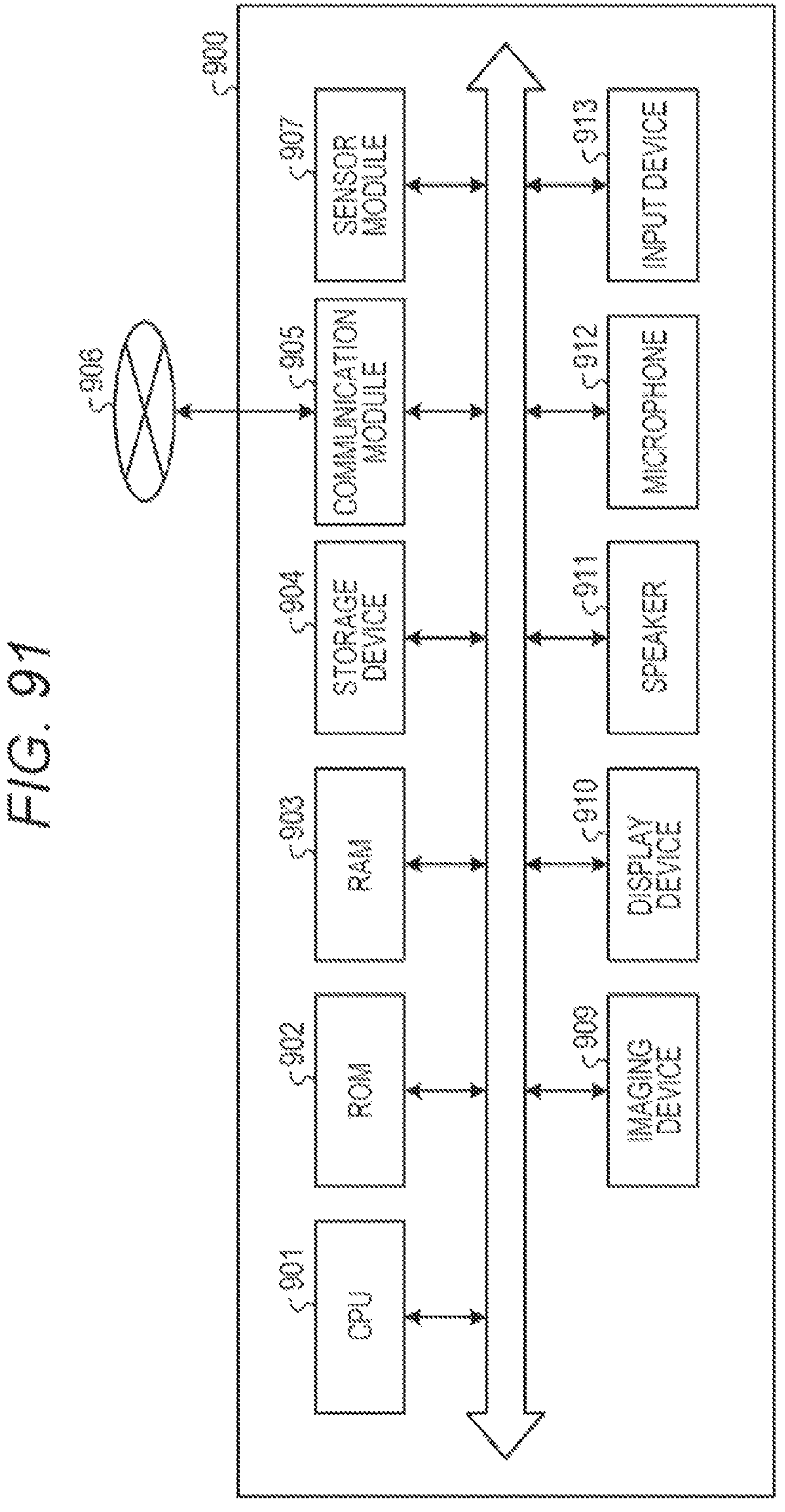
FIG. 91 is a block diagram illustrating an example of a schematic functional configuration of a smartphone.

The technology (present technology) according to the present disclosure can be further applied to various products. For example, the technology according to the present disclosure may be applied to a smartphone or the like. Therefore, a configuration example of a smartphone 900 as an electronic device to which the present technology is applied will be described with reference to FIG. 91. FIG. 91 is a block diagram illustrating an example of a schematic functional configuration of a smartphone 900 to which the technology according to the present disclosure (the present technology) can be applied.

As illustrated in FIG. 91, the smartphone 900 includes a central processing unit (CPU) 901, a read only memory (ROM) 902, and a random access memory (RAM) 903. In addition, the smartphone 900 includes a storage device 904, a communication module 905, and a sensor module 907. Furthermore, the smartphone 900 includes an imaging device 909, a display device 910, a speaker 911, a microphone 912, an input device 913, and a bus 914. Furthermore, the smartphone 900 may include a processing circuit such as a digital signal processor (DSP) instead of or in addition to the CPU 901.

The CPU 901 functions as an arithmetic processing device and a control device, and controls the overall operation in the smartphone 900 or a part thereof according to various programs recorded in the ROM 902, the RAM 903, the storage device 904, or the like. The ROM 902 stores programs, operation parameters, and the like used by the CPU 901. The RAM 903 primarily stores programs used in the execution of the CPU 901, parameters that appropriately change in the execution, and the like. The CPU 901, the ROM 902, and the RAM 903 are connected to one another by a bus 914. In addition, the storage device 904 is a device for data storage configured as an example of a storage unit of the smartphone 900. The storage device 904 includes, for example, a magnetic storage device such as a hard disk drive (HDD), a semiconductor storage device, an optical storage device, and the like. The storage device 904 stores programs and various data executed by the CPU 901, various data acquired from the outside, and the like.

The communication module 905 is a communication interface including, for example, a communication device for connecting to the communication network 906. The communication module 905 can be, for example, a communication card for wired or wireless local area network (LAN), Bluetooth (registered trademark), wireless USB (WUSB), or the like. Furthermore, the communication module 905 may be a router for optical communication, a router for asymmetric digital subscriber line (ADSL), a modem for various types of communication, or the like. The communication module 905 transmits and receives signals and the like to and from the Internet and other communication devices using a predetermined protocol such as Transmission Control Protocol (TCP)/Internet Protocol (IP). Furthermore, the communication network 906 connected to the communication module 905 is a network connected in a wired or wireless manner, and is, for example, the Internet, a home LAN, infrared communication, satellite communication, or the like.

The sensor module 907 includes, for example, various sensors such as a motion sensor (for example, an acceleration sensor, a gyro sensor, a geomagnetic sensor, or the like), a biological information sensor (for example, a pulse sensor, a blood pressure sensor, a fingerprint sensor, and the like), or a position sensor (for example, a global navigation satellite system (GNSS) receiver or the like).

The imaging device 909 is provided on the front surface of the smartphone 900, and can image an object or the like positioned on the back side or the front side of the smartphone 900. Specifically, the imaging device 909 can include an imaging element (not illustrated) such as a complementary MOS (CMOS) image sensor to which the technology (present technology) according to the present disclosure can be applied, and a signal processing circuit (not illustrated) that performs imaging signal processing on a signal photoelectrically converted by the imaging element. Furthermore, the imaging device 909 can further include an optical system mechanism (not illustrated) including an imaging lens, a zoom lens, a focus lens, and the like, and a drive system mechanism (not illustrated) that controls the operation of the optical system mechanism. Then, the imaging element collects incident light from an object as an optical image, and the signal processing circuit photoelectrically converts the formed optical image in units of pixels, reads a signal of each pixel as an imaging signal, and performs image processing to acquire a captured image.

The display device 910 is provided on the surface of the smartphone 900, and can be, for example, a display device such as a liquid crystal display (LCD) or an organic electro luminescence (EL) display. The display device 910 can display an operation screen, a captured image acquired by the above-described imaging device 909, and the like.

The speaker 911 can output, for example, a call voice, a voice accompanying the video content displayed by the display device 910 described above, and the like to the user.

The microphone 912 can collect, for example, a call voice of the user, a voice including a command to activate a function of the smartphone 900, and a voice in a surrounding environment of the smartphone 900.

The input device 913 is a device operated by the user, such as a button, a keyboard, a touch panel, or a mouse. The input device 913 includes an input control circuit that generates an input signal on the basis of information input by the user and outputs the input signal to the CPU 901. By operating the input device 913, the user can input various data to the smartphone 900 and give an instruction on a processing operation.

The configuration example of the smartphone 900 has been described above. Each of the above-described components may be configured using a general-purpose member, or may be configured by hardware specialized for the function of each component. Such a configuration can be appropriately changed according to the technical level at the time of implementation.

19. Application Example to Endoscopic Surgery System

The technology (present technology) according to the present disclosure can be further applied to various products. For example, the technology according to the present disclosure may be applied to an endoscopic surgical system.

Figure 92:
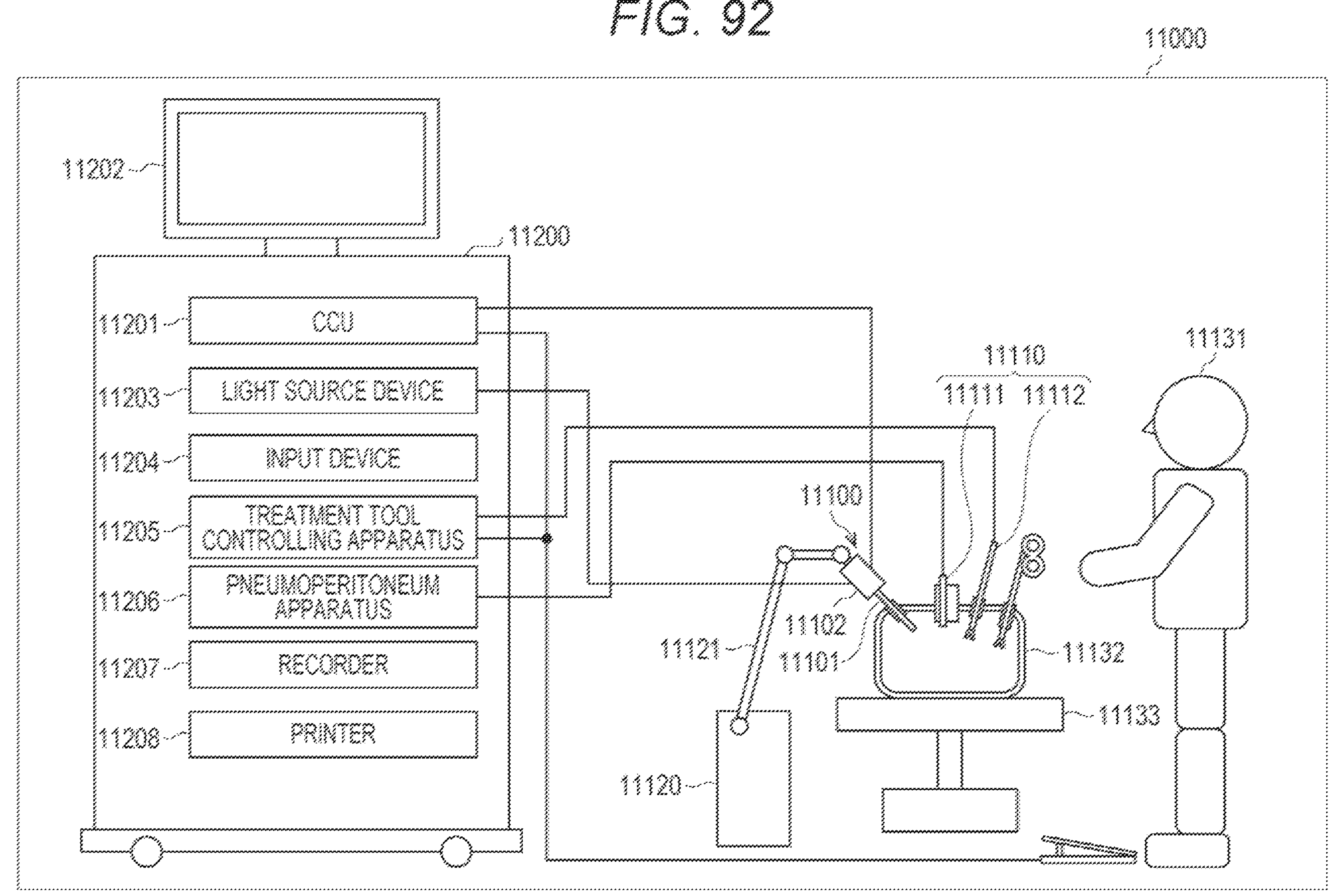
FIG. 92 is a diagram illustrating an example of a schematic configuration of an endoscopic surgery system.

FIG. 92 is a diagram illustrating an example of a schematic configuration of an endoscopic surgery system to which the technology according to the present disclosure (the present technology) can be applied.

FIG. 92 illustrates a state in which an operator (doctor) 11131 is performing surgery on a patient 11132 on a patient bed 11133 using an endoscopic surgery system 11000. As depicted, the endoscopic surgery system 11000 includes an endoscope 11100, other surgical tools 11110 such as a pneumoperitoneum tube 11111 and an energy device 11112, a supporting arm device 11120 which supports the endoscope 11100 thereon, and a cart 11200 on which various device for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel of the flexible type.

The lens barrel 11101 has, at a distal end thereof, an opening in which an objective lens is fitted. A light source device 11203 is connected to the endoscope 11100 such that light generated by the light source device 11203 is introduced to a distal end of the lens barrel by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an imaging element are provided in the inside of the camera head 11102 such that reflected light (observation light) from the observation target is condensed on the imaging element by the optical system. The observation light is photoelectrically converted by the imaging element to generate an electric signal corresponding to the observation light, namely, an image signal corresponding to an observation image. The image signal is transmitted to a camera control unit (CCU) 11201 as RAW data.

The CCU 11201 includes a central processing unit (CPU), a graphics processing unit (GPU) or the like and integrally controls operation of the endoscope 11100 and a display device 11202. Further, the CCU 11201 receives an image signal from the camera head 11102 and performs, for the image signal, various image processes for displaying an image based on the image signal such as, for example, a development process (demosaic process).

The display device 11202 displays thereon an image based on an image signal, for which the image processes have been performed by the CCU 11201, under the control of the CCU 11201.

The light source device 11203 includes a light source such as a light emitting diode (LED), for example, and supplies irradiation light for photographing a surgical site or the like to the endoscope 11100.

An inputting device 11204 is an input interface for the endoscopic surgery system 11000. A user can perform inputting of various kinds of information or instruction inputting to the endoscopic surgery system 11000 through the inputting device 11204. For example, the user would input an instruction or a like to change an imaging condition (type of irradiation light, magnification, focal distance or the like) by the endoscope 11100.

A treatment tool controlling device 11205 controls driving of the energy device 11112 for cautery or incision of a tissue, sealing of a blood vessel or the like. A pneumoperitoneum device 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is a device capable of recording various kinds of information relating to surgery. A printer 11208 is a device capable of printing various kinds of information relating to surgery in various forms such as a text, an image or a graph.

Note that the light source device 11203 that supplies the endoscope 11100 with the irradiation light at the time of imaging the surgical site can include, for example, an LED, a laser light source, or a white light source including a combination thereof. In a case where the white light source includes a combination of RGB laser light sources, since the output intensity and the output timing of each color (each wavelength) can be controlled with high accuracy, adjustment of the white balance of the captured image can be performed in the light source device 11203. Furthermore, in this case, by irradiating the observation target with the laser light from each of the RGB laser light sources in a time division manner and controlling the driving of the imaging element of the camera head 11102 in synchronization with the irradiation timing, it is also possible to capture an image corresponding to each of RGB in a time division manner. According to this method, a color image can be obtained even if color filters are not provided for the imaging element.

Further, the light source device 11203 may be controlled such that the intensity of light to be outputted is changed for each predetermined time. By controlling driving of the imaging element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source device 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source device 11203 can be configured to supply such narrow-band light and/or excitation light suitable for special light observation as described above.

Figure 93:
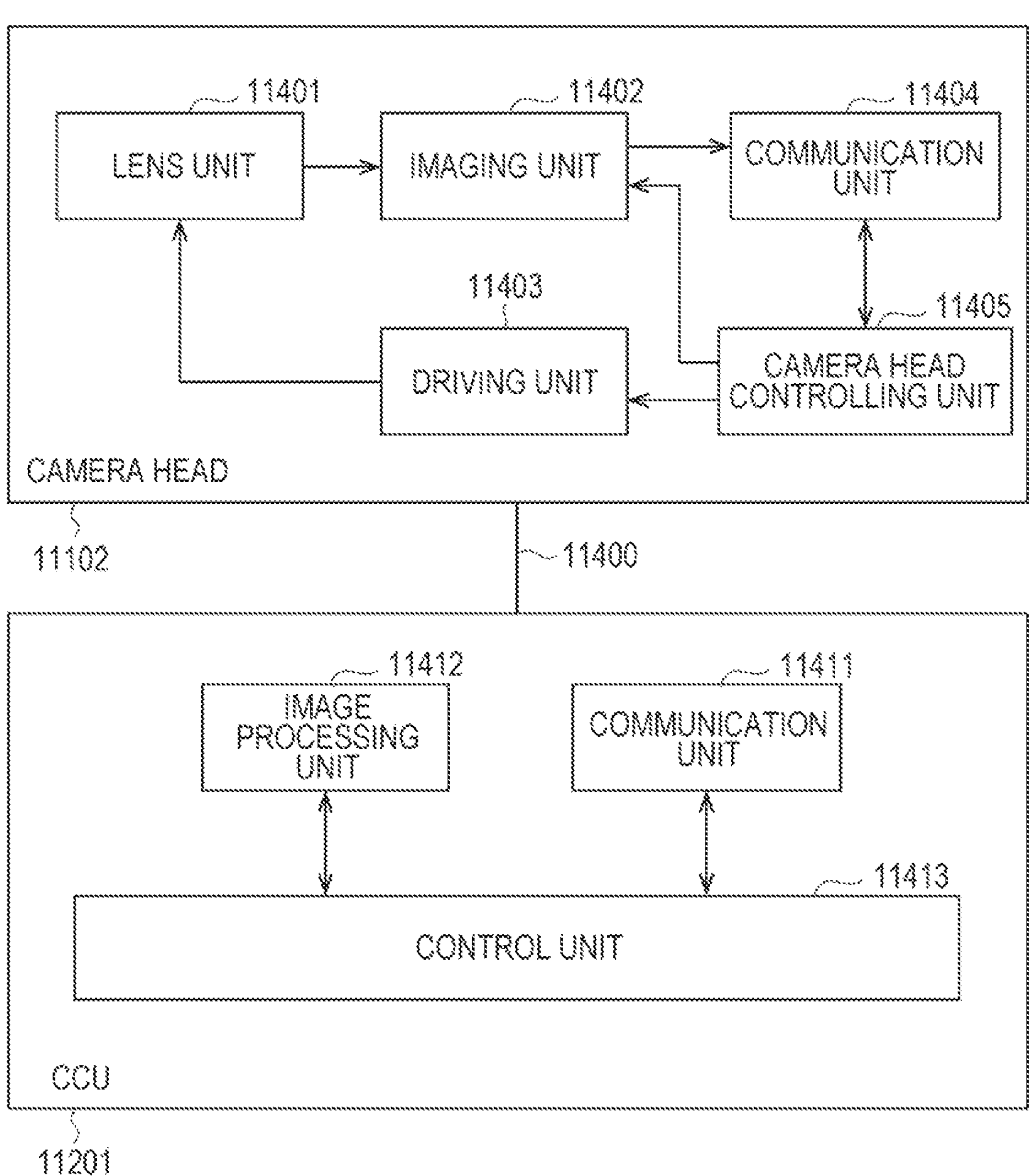
FIG. 93 is a block diagram illustrating an example of functional configurations of a camera head and a CCU.

FIG. 93 is a block diagram illustrating an example of functional configurations of the camera head 11102 and the CCU 11201 illustrated in FIG. 92.

The camera head 11102 includes a lens unit 11401, an imaging unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The imaging unit 11402 is configured of an imaging element. The number of imaging elements which is included by the imaging unit 11402 may be one (single-plate type) or a plural number (multi-plate type). Where the imaging unit 11402 is configured as that of the multi-plate type, for example, image signals corresponding to respective R, G and B are generated by the imaging elements, and the image signals may be synthesized to obtain a color image. Alternatively, the imaging unit 11402 may include a pair of imaging elements for acquiring right-eye and left-eye image signals corresponding to three-dimensional (3D) display. If 3D display is performed, then the depth of a living body tissue in a surgical region can be comprehended more accurately by the surgeon 11131. It is to be noted that, where the imaging unit 11402 is configured as that of stereoscopic type, a plurality of systems of lens units 11401 are provided corresponding to the individual imaging elements.

Further, the imaging unit 11402 may not necessarily be provided on the camera head 11102. For example, the imaging unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a captured image by the imaging unit 11402 can be adjusted suitably.

The communication unit 11404 includes a communication device for transmitting and receiving various kinds of information to and from the CCU 11201. The communication unit 11404 transmits an image signal acquired from the imaging unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to imaging conditions such as, for example, information that a frame rate of a captured image is designated, information that an exposure value upon imaging is designated and/or information that a magnification and a focal point of a captured image are designated.

It is to be noted that the imaging conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication device for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to imaging of a surgical region or the like by the endoscope 11100 and display of a captured image obtained by imaging of the surgical region or the like. For example, the control unit 11413 creates a control signal for controlling driving of the camera head 11102.

Further, the control unit 11413 controls, on the basis of an image signal for which image processes have been performed by the image processing unit 11412, the display device 11202 to display a captured image in which the surgical region or the like is imaged. Thereupon, the control unit 11413 may recognize various objects in the captured image using various image recognition technologies. For example, the control unit 11413 can recognize a surgical tool such as forceps, a particular living body region, bleeding, mist when the energy device 11112 is used and so forth by detecting the shape, color and so forth of edges of objects included in a captured image. The control unit 11413 may cause, when it controls the display device 11202 to display a captured image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure can be applied has been described above. The technology according to the present disclosure can be applied to, for example, the endoscope 11100, (the imaging unit 11402 of) the camera head 11102, (the image processing unit 11412 of) the CCU 11201, and the like) among the configurations described above.

Note that, here, the endoscopic surgery system has been described as an example, but the technology according to the present disclosure may be applied to, for example, a microscopic surgery system or the like.

20. Application Example to Mobile Body

The technology (present technology) according to the present disclosure can be applied to various products. For example, the technology according to the present disclosure may be realized as a device mounted on any type of mobile body such as an automobile, an electric vehicle, a hybrid electric vehicle, a motorcycle, a bicycle, a personal mobility, an airplane, a drone, a ship, and a robot.

FIG. 94 is a block diagram illustrating a schematic configuration example of a vehicle control system which is an example of a mobile body control system to which the technology according to the present disclosure can be applied.

The vehicle control system 12000 includes a plurality of electronic control units connected to each other via a communication network 12001. In the example illustrated in FIG. 94, the vehicle control system 12000 includes a driving system control unit 12010, a body system control unit 12020, a vehicle exterior information detection unit 12030, a vehicle interior information detection unit 12040, and an integrated control unit 12050. Furthermore, as a functional configuration of the integrated control unit 12050, a microcomputer 12051, an audio image output unit 12052, and an in-vehicle network interface (I/F) 12053 are illustrated.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The vehicle exterior information detection unit 12030 detects information about the outside of the vehicle including the vehicle control system 12000. For example, the vehicle exterior information detection unit 12030 is connected with an imaging unit 12031. The vehicle exterior information detection unit 12030 makes the imaging unit 12031 image an image of the outside of the vehicle, and receives the imaged image. On the basis of the received image, the vehicle exterior information detection unit 12030 may perform processing of detecting an object such as a human, a vehicle, an obstacle, a sign, a character on a road surface, or the like, or processing of detecting a distance thereto.

The imaging unit 12031 is an optical sensor that receives light, and which outputs an electric signal corresponding to a received light amount of the light. The imaging unit 12031 can output the electric signal as an image, or can output the electric signal as information about a measured distance. In addition, the light received by the imaging unit 12031 may be visible light, or may be invisible light such as infrared rays or the like.

The vehicle interior information detection unit 12040 detects information about the inside of the vehicle. The vehicle interior information detection unit 12040 is, for example, connected with a driver state detection unit 12041 that detects the state of a driver. The driver state detection unit 12041, for example, includes a camera that images the driver. On the basis of detection information input from the driver state detection unit 12041, the vehicle interior information detection unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the vehicle exterior information detection unit 12030 or the vehicle interior information detection unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the vehicle exterior information detection unit 12030 or the vehicle interior information detection unit 12040.

Furthermore, the microcomputer 12051 can output a control command to the body system control unit 12020 on the basis of the vehicle exterior information acquired by the vehicle exterior information detection unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the vehicle exterior information detection unit 12030.

The audio image output unit 12052 transmits an output signal of at least one of a sound and an image to an output device capable of visually or auditorily notifying information to an occupant of the vehicle or the outside of the vehicle. In the example of FIG. 94, an audio speaker 12061, a display unit 12062, and an instrument panel 12063 are illustrated as the output device. The display unit 12062 may, for example, include at least one of an on-board display and a head-up display.

Figure 95:
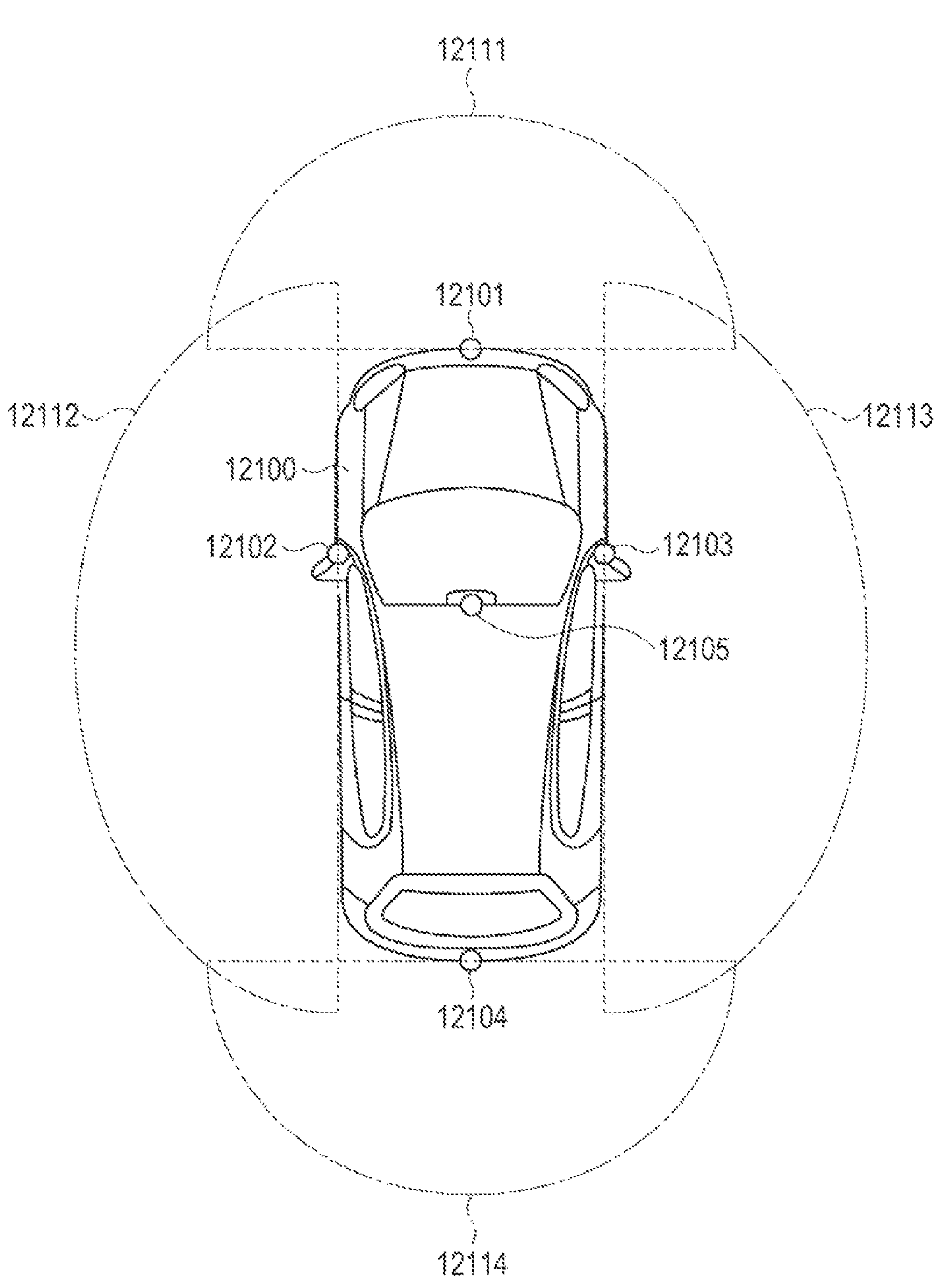
FIG. 95 is an explanatory diagram illustrating an example of installation positions of a vehicle exterior information detection unit and an imaging unit.

FIG. 95 is a diagram illustrating an example of an installation position of the imaging unit 12031.

In FIG. 95, the vehicle 12100 includes imaging units 12101, 12102, 12103, 12104, and 12105 as the imaging unit 12031.

The imaging units 12101, 12102, 12103, 12104, and 12105 are provided, for example, at positions such as a front nose, a side mirror, a rear bumper, a back door, and an upper portion of a windshield in a vehicle interior of the vehicle 12100. The imaging unit 12101 provided to the front nose and the imaging unit 12105 provided to the upper portion of the windshield within the interior of the vehicle obtain mainly an image of the front of the vehicle 12100. The imaging units 12102 and 12103 provided at the side mirrors mainly acquire images of the sides of the vehicle 12100. The imaging unit 12104 provided to the rear bumper or the back door obtains mainly an image of the rear of the vehicle 12100. The front images acquired by the imaging units 12101 and 12105 are mainly used for detecting a preceding vehicle, a pedestrian, an obstacle, a traffic light, a traffic sign, a lane, or the like.

Note that FIG. 95 illustrates an example of imaging ranges of the imaging units 12101 to 12104. An imaging range 12111 represents the imaging range of the imaging unit 12101 provided to the front nose. Imaging ranges 12112 and 12113 respectively represent the imaging ranges of the imaging units 12102 and 12103 provided to the sideview mirrors. An imaging range 12114 represents the imaging range of the imaging unit 12104 provided to the rear bumper or the back door. A bird's-eye image of the vehicle 12100 as viewed from above is obtained by superimposing image data imaged by the imaging units 12101 to 12104, for example.

At least one of the imaging units 12101 to 12104 may have a function of obtaining distance information. For example, at least one of the imaging units 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging units 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging units 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display unit 12062, and performs forced deceleration or avoidance steering via the driving system control unit 12010. The microcomputer 12051 can thereby assist in driving to avoid collision.

At least one of the imaging units 12101 to 12104 may be an infrared camera that detects infrared rays. The microcomputer 12051 can, for example, recognize a pedestrian by determining whether or not there is a pedestrian in imaged images of the imaging units 12101 to 12104. Such recognition of a pedestrian is, for example, performed by a procedure of extracting characteristic points in the imaged images of the imaging units 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging units 12101 to 12104, and thus recognizes the pedestrian, the audio image output unit 12052 controls the display unit 12062 so that a square contour line for emphasis is displayed so as to be superimposed on the recognized pedestrian. The audio image output unit 12052 may also control the display unit 12062 so that an icon or the like representing the pedestrian is displayed at a desired position.

An example of the vehicle control system to which the technology according to the present disclosure can be applied has been described above. The technology according to the present disclosure can be applied to, for example, the imaging unit 12031 and the like among the configurations described above.

21. Supplement

Although the preferred embodiments of the present disclosure have been described in detail with reference to the accompanying drawings, the technical scope of the present disclosure is not limited to such examples. It is obvious that a person having ordinary knowledge in the technical field of the present disclosure can conceive various changes or modifications within the scope of the technical idea described in the claims, and it is naturally understood that these also belong to the technical scope of the present disclosure.

Furthermore, the effects described in the present specification are merely illustrative or exemplary, and are not restrictive. That is, the technology according to the present disclosure can exhibit other effects obvious to those skilled in the art from the description of the present specification together with or instead of the above effects.

Note that the present technology can also have the following configurations.

(1) An imaging device including:

a semiconductor substrate; and a plurality of imaging elements arranged in a matrix on the semiconductor substrate along a row direction and a column direction, and configured to perform photoelectric conversion on incident light, in which each of the plurality of imaging elements includes:

a plurality of pixels provided adjacent to each other in the semiconductor substrate and containing impurities of a first conductivity type;

an element separation wall surrounding the plurality of pixels and provided so as to penetrate the semiconductor substrate;

an on-chip lens provided above a light receiving surface of the semiconductor substrate so as to be shared by the plurality of pixels; and a first separation portion provided in a region surrounded by the element separation wall to separate the plurality of pixels, the first separation portion is provided so as to extend in a thickness direction of the semiconductor substrate, and a first diffusion region containing impurities of a second conductivity type opposite to the first conductivity type is provided in a region positioned around the first separation portion and extending in the thickness direction of the semiconductor substrate.

(2) The imaging device according to (1), in which two first separation portions are provided, the two first separation portions extend to separate the plurality of pixels and face each other when viewed from above the light receiving surface, and the first diffusion region is provided in a region between the two first separation portions.

(3) The imaging device according to (2), in which an overflow path for exchanging saturation charges between the plurality of pixels is provided in a region between the two first separation portions.

(4) The imaging device according to (2) or (3), in which each of the two first separation portions is provided so as to penetrate the semiconductor substrate along the thickness direction of the semiconductor substrate.

(5) The imaging device according to (2) or (3), in which each of the two first separation portions is provided to extend from the light receiving surface of the semiconductor substrate or a surface of the semiconductor substrate opposite to the light receiving surface to a middle of the semiconductor substrate along the thickness direction of the semiconductor substrate.

(6) The imaging device according to any one of (2) to (5), in which the two first separation portions protrude from the element separation wall toward a center of the imaging element and face each other when viewed from above the light receiving surface.

(7) The imaging device according to any one of (2) to (6), in which the two first separation portions protrude from the element separation wall along the column direction when viewed from above the light receiving surface.

(8) The imaging device according to (7), in which the two first separation portions are provided so as to be positioned at the center of the imaging element in the row direction when viewed from above the light receiving surface.

(9) The imaging device according to (7), in which the two first separation portions are provided at positions shifted from the center of the imaging element by a predetermined distance in the row direction when viewed from above the light receiving surface.

(10) The imaging device according to any one of (2) to (6), in which the two first separation portions protrude from the element separation wall along the row direction when viewed from above the light receiving surface.

(11) The imaging device according to (10), in which the two first separation portions are provided so as to be positioned at the center of the imaging element in the column direction when viewed from above the light receiving surface.

(12) The imaging device according to (10), in which the two first separation portions are provided at positions shifted from the center of the imaging element by a predetermined distance in the column direction when viewed from above the light receiving surface.

(13) The imaging device according to any one of (2) to (12), in which lengths of the two first separation portions are the same when viewed from above the light receiving surface.

(14) The imaging device according to any one of (2) to (12), in which lengths of the two first separation portions are different from each other when viewed from above the light receiving surface.

(15) The imaging device according to any one of (2) to (14), further including:

two second separation portions extending along a direction different from a direction in which each of the two first separation portions extends, and facing each other when viewed from above the light receiving surface, in which each of the two second separation portions is provided so as to extend in the thickness direction of the semiconductor substrate, and a second diffusion region containing impurities of the second conductivity type is provided in a region between the two second separation portions.

(16) The imaging device according to any one of (2) to (15), including one or more additional walls provided between the two first separation portions.

(17) The imaging device according to (16), in which the additional wall is provided so as to penetrate the semiconductor substrate.

(18) The imaging device according to (16), in which the additional wall is provided to extend from the light receiving surface to a middle of the semiconductor substrate along the thickness direction of the semiconductor substrate.

(19) The imaging device according to (16), in which the additional wall is provided to extend from a surface of the semiconductor substrate opposite to the light receiving surface to a middle of the semiconductor substrate along the thickness direction of the semiconductor substrate.

(20) The imaging device according to (19), in which a length of the additional wall in the thickness direction is determined according to a wavelength of incident light incident on the light receiving surface.

(21) The imaging device according to (19) or (20), in which when viewed from above the light receiving surface, a width of a central portion of the additional wall is narrower than widths of both ends of the additional wall.

(22) The imaging device according to any one of (19) to (21), in which a length in the thickness direction of a central portion of the additional wall is shorter than a length in the thickness direction of both ends of the additional wall.

(23) The imaging device according to any one of (19) to (22), in which when viewed from above the light receiving surface, a width of both or one of the two first separation portions is narrower than a width of the additional wall.

(24) The imaging device according to any one of (19) to (23), in which the two first separation portions are provided to extend from a surface of the semiconductor substrate opposite to the light receiving surface to a middle of the semiconductor substrate along the thickness direction of the semiconductor substrate.

(25) The imaging device according to (24), in which a length of the additional wall in the thickness direction is shorter than a length of both or one of the two first separation portions in the thickness direction.

(26) The imaging device according to any one of (2) to (25), in which the element separation wall and the two first separation portions are made of the same material.

(27) The imaging device according to any one of (2) to (25), in which the element separation wall and the two first separation portions are made of materials different from each other.

(28) The imaging device according to any one of (2) to (25), in which the two first protruding portions are made of titanium oxide.

(29) The imaging device according to any one of (2) to (28), in which the plurality of imaging elements further includes a light shielding film provided along the element separation wall on the element separation wall when viewed from above the light receiving surface.

(30) The imaging device according to (29), in which the light shielding film is provided along the two first separation portions.

(31) The imaging device according to any one of (2) to (30), in which the first diffusion region is formed in a shape that expands from the light receiving surface toward the inside of the semiconductor substrate and narrows from the inside of the semiconductor substrate toward a surface of the semiconductor substrate opposite to the light receiving surface.

(32) The imaging device according to (31), in which the first diffusion region includes:

a first region that expands from the light receiving surface toward the inside of the semiconductor substrate; and a second region that narrows from the inside of the semiconductor substrate toward a surface of the semiconductor substrate opposite to the light receiving surface.

(33) The imaging device according to (32), in which the first region and the second region are separated from each other.

(34) The imaging device according to (32) or (33), in which lengths in the thickness direction of the first region and the second region are different.

(35) The imaging device according to (34), in which a length of the first region in the thickness direction is longer than a length of the second region in the thickness direction.

(36) The imaging device according to any one of (32) to (35), in which lengths of the first region and the second region in a direction orthogonal to the thickness direction are different.

(37) The imaging device according to (36), in which a length of the first region in a direction orthogonal to the thickness direction is shorter than a length of the second region in a direction orthogonal to the thickness direction.

(38) The imaging device according to any one of (32) to (37), in which concentrations of the impurities in the first region and the second region are different from each other.

(39) The imaging device according to (38), in which a concentration of the impurities in the first region is lower than a concentration of the impurities in the first region.

(40) The imaging device according to any one of (16) to (25), in which the first diffusion region is provided between each of the two first separation portions and at least one additional wall, and the two first diffusion regions have different shapes and are formed in a shape that expands from the light receiving surface toward the inside of the semiconductor substrate and narrows from the inside of the semiconductor substrate toward a surface of the semiconductor substrate opposite to the light receiving surface.

(41) The imaging device according to any one of (1) to (40), in which the first separation portion includes:

an extension portion connected to the element separation wall; and an opposing surface facing a wall surface of the element separation wall, and when viewed from above the light receiving surface, a width of the opposing surface of the first separation portion is wider than a line width of the extension portion.

(42) The imaging device according to (41), in which the first separation portion further includes:

a projection portion provided at an end of the extension portion and having the opposing surface.

(43) The imaging device according to any one of (2) to (40), in which each of the two first separation portions includes:

an extension portion connected to the element separation wall; and opposing surfaces facing each other, and when viewed from above the light receiving surface, a width of each of the opposing surfaces of each of the two first separation portions is wider than a width of each of the line widths of each of the two extension portions.

(44) The imaging device according to (43), in which each of the two first separation portions further includes:

a projection portion provided at an end of the extension portion and having the opposing surface.

(45) The imaging device according to any one of (2) to (44), including:

two additional walls provided so as to face each other with the center of the imaging element interposed therebetween when viewed from above the light receiving surface.

(46) The imaging device according to any one of (2) to (45), in which each of the two first separation portions is provided at a position separated from the element separation wall.

(47) The imaging device according to (46), in which three or more first separation portions are provided.

(48) The imaging device according to (47), in which four first separation portions are provided, two of the first separation portions are provided in the column direction so as to face each other with the center of the imaging element interposed therebetween when viewed from above the light receiving surface, and the other two first separation portions are provided in the row direction so as to face each other with the center of the imaging element interposed therebetween when viewed from above the light receiving surface.

(49) The imaging device according to (48), in which a size of each of the two first separation portions arranged in the column direction is different from a size of each of the two first separation portions arranged in the row direction.

(50) The imaging device according to any one of (2) to (49), in which the first diffusion region includes:

a first region formed by a diffusion process on individual trenches for forming the two first separation portions; and a second region formed by a diffusion process on a trench for forming the element separation wall.

(51) An imaging device including:

a semiconductor substrate; and a plurality of imaging elements arranged in a matrix on the semiconductor substrate along a row direction and a column direction, and configured to perform photoelectric conversion on incident light, in which each of the plurality of imaging elements includes:

a plurality of pixels provided adjacent to each other in the semiconductor substrate and containing impurities of a first conductivity type;

a pixel separation wall that separates the plurality of pixels; and an on-chip lens provided above a light receiving surface of the semiconductor substrate so as to be shared by the plurality of pixels, the pixel separation wall is provided so as to extend from the light receiving surface to a middle of the semiconductor substrate along a thickness direction of the semiconductor substrate, and a region positioned on a side opposite to the light receiving surface with respect to the pixel separation wall in the thickness direction of the semiconductor substrate contains impurities of a second conductivity type opposite to the first conductivity type.

(52) An electronic device including:

an imaging device including:

a semiconductor substrate; and a plurality of imaging elements arranged in a matrix on the semiconductor substrate along a row direction and a column direction, and configured to perform photoelectric conversion on incident light, in which each of the plurality of imaging elements includes:

a plurality of pixels provided adjacent to each other in the semiconductor substrate and containing impurities of a first conductivity type;

an element separation wall surrounding the plurality of pixels and provided so as to penetrate the semiconductor substrate;

an on-chip lens provided above a light receiving surface of the semiconductor substrate so as to be shared by the plurality of pixels; and a first separation portion provided in a region surrounded by the element separation wall to separate the plurality of pixels, the first separation portion is provided so as to extend in a thickness direction of the semiconductor substrate, and a first diffusion region containing impurities of a second conductivity type opposite to the first conductivity type is provided in a region positioned around the first separation portion and extending in the thickness direction of the semiconductor substrate.

(Added)

(53) An electronic device including the imaging device according to any one of (1) to (51).

(54) The imaging device according to (26) or (27), in which the material includes at least one or more materials selected from the group consisting of silicon oxide, silicon nitride, amorphous silicon, polycrystalline silicon, titanium oxide, aluminum, and tungsten.

(55) An imaging device including:

a semiconductor substrate; and a plurality of imaging elements arranged in a matrix on the semiconductor substrate along a row direction and a column direction, and configured to perform photoelectric conversion on incident light, in which each of the plurality of imaging elements includes:

a plurality of pixels provided adjacent to each other in the semiconductor substrate and containing impurities of a first conductivity type;

an element separation wall surrounding the plurality of pixels and provided so as to penetrate the semiconductor substrate; and an on-chip lens provided above a light receiving surface of the semiconductor substrate so as to be shared by the plurality of pixels, the element separation wall includes two first protruding portions protruding toward a center of the imaging element and facing each other when viewed from above the light receiving surface, each of the two first protruding portions is provided so as to penetrate the semiconductor substrate, and a first diffusion region containing impurities of a second conductivity type opposite to the first conductivity type is provided in a region between the two first protruding portions.

(56) An imaging device including:

a semiconductor substrate; and a plurality of imaging elements arranged in a matrix on the semiconductor substrate along a row direction and a column direction, and configured to perform photoelectric conversion on incident light, in which each of the plurality of imaging elements includes:

a plurality of pixels provided adjacent to each other in the semiconductor substrate and containing impurities of a first conductivity type;

an element separation wall surrounding the plurality of pixels and provided so as to penetrate the semiconductor substrate; and an on-chip lens provided above a light receiving surface of the semiconductor substrate so as to be shared by the plurality of pixels, the element separation wall includes a first protruding portion protruding toward a center of the imaging element when viewed from above the light receiving surface, the first protruding portion is provided so as to penetrate the semiconductor substrate, and a first diffusion region containing impurities of a second conductivity type opposite to the first conductivity type is provided in a region between the first protruding portion and a portion of the element separation wall facing the first protruding portion.

(57) An imaging device including:

a semiconductor substrate; and a plurality of imaging elements arranged in a matrix on the semiconductor substrate along a row direction and a column direction, and configured to perform photoelectric conversion on incident light, in which each of the plurality of imaging elements includes:

a plurality of pixels provided adjacent to each other in the semiconductor substrate and containing impurities of a first conductivity type;

a pixel separation wall that separates the plurality of pixels; and an on-chip lens provided above a light receiving surface of the semiconductor substrate so as to be shared by the plurality of pixels, and the pixel separation wall contains impurities of a second conductivity type opposite to the first conductivity type.

REFERENCE SIGNS LIST

1 Imaging device
10 Semiconductor substrate
10*a* Light receiving surface
10*b* Front surface
20 Pixel array unit
21 Vertical drive circuit unit
22 Column signal processing circuit unit
23 Horizontal drive circuit unit
24 Output circuit unit
25 Control circuit unit
26 Pixel drive wiring
27 Vertical signal line
28 Horizontal signal line
29 Input/output terminal
100 Imaging element
200 On-chip lens
202 Color filter
204 Light shielding portion
300*a*, 300*b*, 300*c*, 300*d* Pixel
302 Photoelectric conversion unit
304, 324 Protruding portion
304*a* Extension portion
304*b* Projection portion
306, 306*a*, 306*b*, 320 Diffusion region
306A First region
306B Second region
308, 308*a*, 308*b*, 308*c* Additional wall
310 Element separation wall
312 Slit
334, 334*a* Pixel separation wall
400*a*, 400*b* Transfer gate
R1 First region
R2 Second region

What is claimed is:

1. An imaging device, comprising:

a semiconductor substrate; and a plurality of imaging elements arranged in a matrix on the semiconductor substrate along a row direction and a column direction, and configured to perform photoelectric conversion on incident light, wherein each of the plurality of imaging elements comprises:

a plurality of pixels provided adjacent to each other in the semiconductor substrate and containing impurities of a first conductivity type;

an element separation wall surrounding the plurality of pixels and provided so as to penetrate the semiconductor substrate;

an on-chip lens provided above a light receiving surface of the semiconductor substrate so as to be shared by the plurality of pixels; and a first separation portion provided in a region surrounded by the element separation wall to separate the plurality of pixels, wherein the first separation portion is provided so as to extend in a thickness direction of the semiconductor substrate, wherein a first diffusion region containing impurities of a second conductivity type opposite to the first conductivity type is provided in a region positioned around the first separation portion and extending in the thickness direction of the semiconductor substrate, and wherein a third diffusion region containing impurities of a first conductivity type is provided between the plurality of pixels and aligned with the first diffusion region containing impurities of the second conductivity type.

2. The imaging device according to claim 1, wherein two first separation portions are provided, the two first separation portions extend to separate the plurality of pixels and face each other when viewed from above the light receiving surface, and the first diffusion region is provided in a region between the two first separation portions.

3. The imaging device according to claim 2, wherein the two first separation portions protrude from the element separation wall along the column direction when viewed from above the light receiving surface.

4. The imaging device according to claim 3, wherein the two first separation portions are provided so as to be positioned at a center of the imaging element in the row direction when viewed from above the light receiving surface.

5. The imaging device according to claim 3, wherein the two first separation portions are provided at positions shifted from a center of the imaging element by a predetermined distance in the row direction when viewed from above the light receiving surface.

6. The imaging device according to claim 2, wherein the two first separation portions protrude from the element separation wall along the row direction when viewed from above the light receiving surface.

7. The imaging device according to claim 6, wherein the two first separation portions are provided so as to be positioned at a center of the imaging element in the column direction when viewed from above the light receiving surface.

8. The imaging device according to claim 6, wherein the two first separation portions are provided at positions shifted from a center of the imaging element by a predetermined distance in the column direction when viewed from above the light receiving surface.

9. The imaging device according to claim 2, wherein lengths of the two first separation portions are the same when viewed from above the light receiving surface.

10. The imaging device according to claim 2, wherein lengths of the two first separation portions are different from each other when viewed from above the light receiving surface.

11. The imaging device according to claim 2, further comprising:

two second separation portions extending along a direction different from a direction in which each of the two first separation portions extends, and facing each other when viewed from above the light receiving surface, wherein each of the two second separation portions is provided so as to extend in the thickness direction of the semiconductor substrate, and wherein a second diffusion region containing impurities of the second conductivity type is provided in a region between the two second separation portions.

12. The imaging device according to claim 2, further comprising one or more additional walls provided between the two first separation portions.

13. The imaging device according to claim 12, wherein the additional wall is provided so as to penetrate the semiconductor substrate.

14. The imaging device according to claim 12, wherein the additional wall is provided to extend from the light receiving surface to a middle of the semiconductor substrate along the thickness direction of the semiconductor substrate.

15. The imaging device according to claim 2, wherein the element separation wall and the two first separation portions are made of the same material.

16. The imaging device according to claim 2, wherein the element separation wall and the two first separation portions are made of materials different from each other.

17. The imaging device according to claim 2, wherein the plurality of imaging elements further includes a light shielding film provided along the element separation wall on the element separation wall when viewed from above the light receiving surface.

18. The imaging device according to claim 17, wherein the light shielding film is provided along the two first separation portions.

19. An imaging device, comprising:

a semiconductor substrate; and a plurality of imaging elements arranged in a matrix on the semiconductor substrate along a row direction and a column direction, and configured to perform photoelectric conversion on incident light, wherein each of the plurality of imaging elements comprises:

a plurality of pixels provided adjacent to each other in the semiconductor substrate and containing impurities of a first conductivity type;

a pixel separation wall that separates the plurality of pixels; and an on-chip lens provided above a light receiving surface of the semiconductor substrate so as to be shared by the plurality of pixels, wherein the pixel separation wall is provided so as to extend from the light receiving surface to a middle of the semiconductor substrate along a thickness direction of the semiconductor substrate, wherein a region positioned on a side opposite to the light receiving surface with respect to the pixel separation wall in the thickness direction of the semiconductor substrate contains impurities of a second conductivity type opposite to the first conductivity type, wherein the plurality of imaging elements further includes a light shielding film provided along the element separation wall on the element separation wall when viewed from above the light receiving surface, and wherein the light shielding film is formed of copper, titanium, molybdenum or nickel.

20. An electronic device, comprising:

an imaging device comprising:

a semiconductor substrate; and a plurality of imaging elements arranged in a matrix on the semiconductor substrate along a row direction and a column direction, and configured to perform photoelectric conversion on incident light, wherein each of the plurality of imaging elements comprises:

a plurality of pixels provided adjacent to each other in the semiconductor substrate and containing impurities of a first conductivity type;

an element separation wall surrounding the plurality of pixels and provided so as to penetrate the semiconductor substrate;

an on-chip lens provided above a light receiving surface of the semiconductor substrate so as to be shared by the plurality of pixels; and a first separation portion provided in a region surrounded by the element separation wall to separate the plurality of pixels, wherein the first separation portion is provided so as to extend in a thickness direction of the semiconductor substrate, wherein a first diffusion region containing impurities of a second conductivity type opposite to the first conductivity type is provided in a region positioned around the first separation portion and extending in the thickness direction of the semiconductor substrate, and wherein a third diffusion region containing impurities of a first conductivity type is provided between the plurality of pixels and aligned with the first diffusion region containing impurities of the second conductivity type.

* * * * *